US012648431B2

(12) United States Patent
Kim

(10) Patent No.: US 12,648,431 B2
(45) Date of Patent: Jun. 2, 2026

(54) SEMICONDUCTOR DEVICES

(71) Applicant: SAMSUNG ELECTRONICS CO., LTD., Suwon-si (KR)

(72) Inventor: Eunjung Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 413 days.

(21) Appl. No.: 18/382,661

(22) Filed: Oct. 23, 2023

(65) Prior Publication Data

US 2024/0194595 A1 Jun. 13, 2024

(30) Foreign Application Priority Data

Dec. 13, 2022 (KR) ........................ 10-2022-0173672

(51) Int. Cl.
| | |
|---|---|
| *H01L 23/528* | (2006.01) |
| *H01L 23/522* | (2006.01) |
| *H10B 12/00* | (2023.01) |

(52) U.S. Cl.
CPC ...... *H01L 23/5283* (2013.01); *H01L 23/5226* (2013.01); *H10B 12/0335* (2023.02); *H10B 12/482* (2023.02); *H10B 12/485* (2023.02)

(58) Field of Classification Search
CPC ............ H01L 23/5283; H01L 23/5226; H10B 12/0335; H10B 12/482; H10B 12/485
See application file for complete search history.

(56) References Cited

U.S. PATENT DOCUMENTS

| | | | |
|---|---|---|---|
| 5,792,692 | A | 8/1998 | Li et al. |
| 5,969,977 | A | 10/1999 | Camerlenghi et al. |
| 6,930,324 | B2 | 8/2005 | Kowalski et al. |
| 6,992,348 | B2 | 1/2006 | Kleint et al. |
| 9,245,844 | B2 | 1/2016 | Pratt et al. |

(Continued)

FOREIGN PATENT DOCUMENTS

| | | |
|---|---|---|
| DE | 102018111376 | 4/2022 |
| KR | 10-2003-0093787 A | 12/2003 |

(Continued)

OTHER PUBLICATIONS

Notice of Allowance in Taiwanese Appln. No. 112141439, mailed on Sep. 25, 2024, 9 pages (with Machine translation).

(Continued)

*Primary Examiner* — J. E. Schoenholtz
(74) *Attorney, Agent, or Firm* — Fish & Richardson P.C.

(57) ABSTRACT

A semiconductor device includes a wiring line on a substrate, a first line portion having a line shape in a first direction, a head hammer pattern connected to an end of the first line portion in the first direction; a second wiring line spaced from the first wiring line in a second direction perpendicular to the first direction, the second wiring line including a second line portion parallel to the first line portion; a first contact plug electrically connecting the first line portion and the second line portion, the first contact plug being positioned adjacent to the first end of the first line portion and a second end of the second line portion in the first direction. The first contact plug has a bottom surface higher than a bottom surface of the first and second wiring lines. The upper surface of the first head hammer pattern contacts an insulation material.

20 Claims, 46 Drawing Sheets

(56) References Cited

U.S. PATENT DOCUMENTS

| | | | |
|---|---|---|---|
| 10,083,968 B1 | 9/2018 | Nagai | |
| 10,580,876 B2 | 3/2020 | Ahn et al. | |
| 11,637,101 B2 | 4/2023 | Huang et al. | |
| 2011/0085365 A1 * | 4/2011 | Jang ...................... | H10B 12/50 |
| | | | 365/51 |
| 2016/0379932 A1 | 12/2016 | Fan et al. | |
| 2020/0402982 A1 * | 12/2020 | Park .................... | H10B 12/315 |
| 2024/0057320 A1 * | 2/2024 | Kim .................... | H10B 12/315 |

FOREIGN PATENT DOCUMENTS

| | | |
|---|---|---|
| KR | 10-0533382 B1 | 12/2005 |
| KR | 10-2008-0113840 A | 12/2008 |
| TW | 201438149 | 10/2014 |
| TW | 202145360 | 12/2021 |

OTHER PUBLICATIONS

Office Action in Korean Appln. No. 10-2022-0173672, mailed on Mar. 16, 2026, 10 pages (with English translation).

* cited by examiner

FIRST DIRECTION

SECOND DIRECTION

FIRST
DIRECTION

SECOND
DIRECTION

FIG. 18

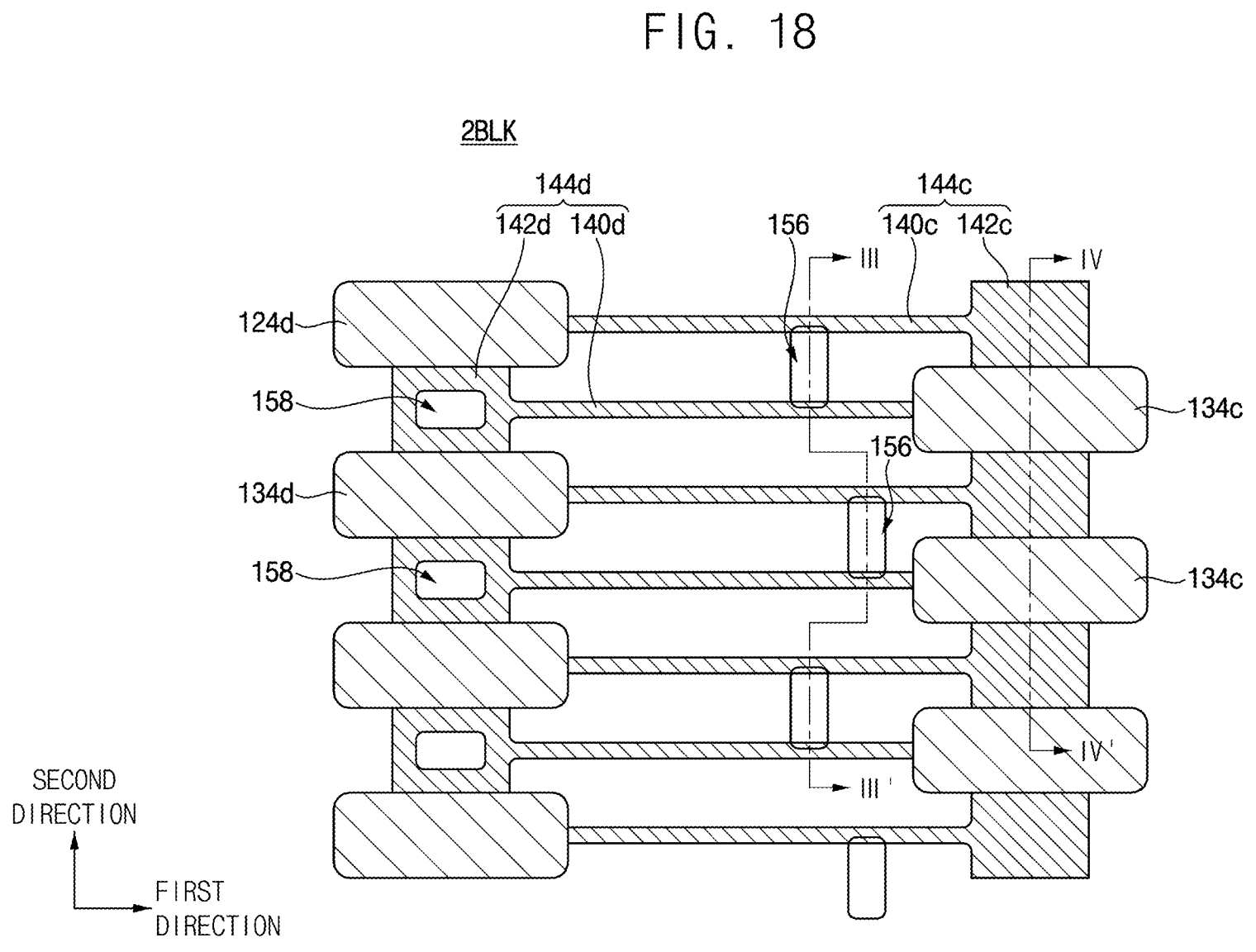

2BLK

134c

134c

IV

IV'

144c 142c

140c

III

III'

156

156

156

144d 140d

142d

124d

158

134d

158

FIRST DIRECTION

SECOND DIRECTION

Figure 20:
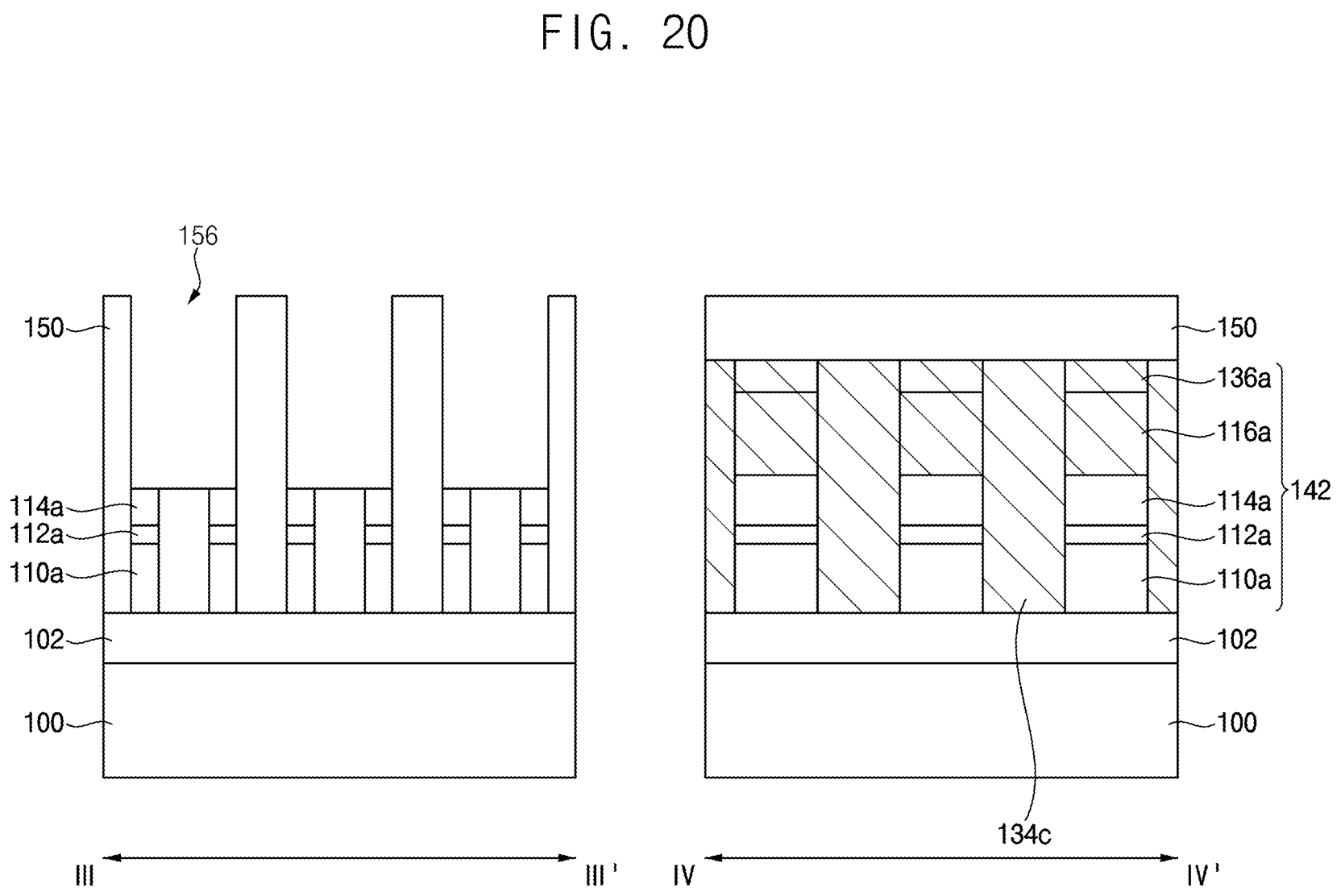

III
III'

156

150
114a
112a
110a
102
100

2BLK

FIRST DIRECTION

SECOND DIRECTION

FIG. 44

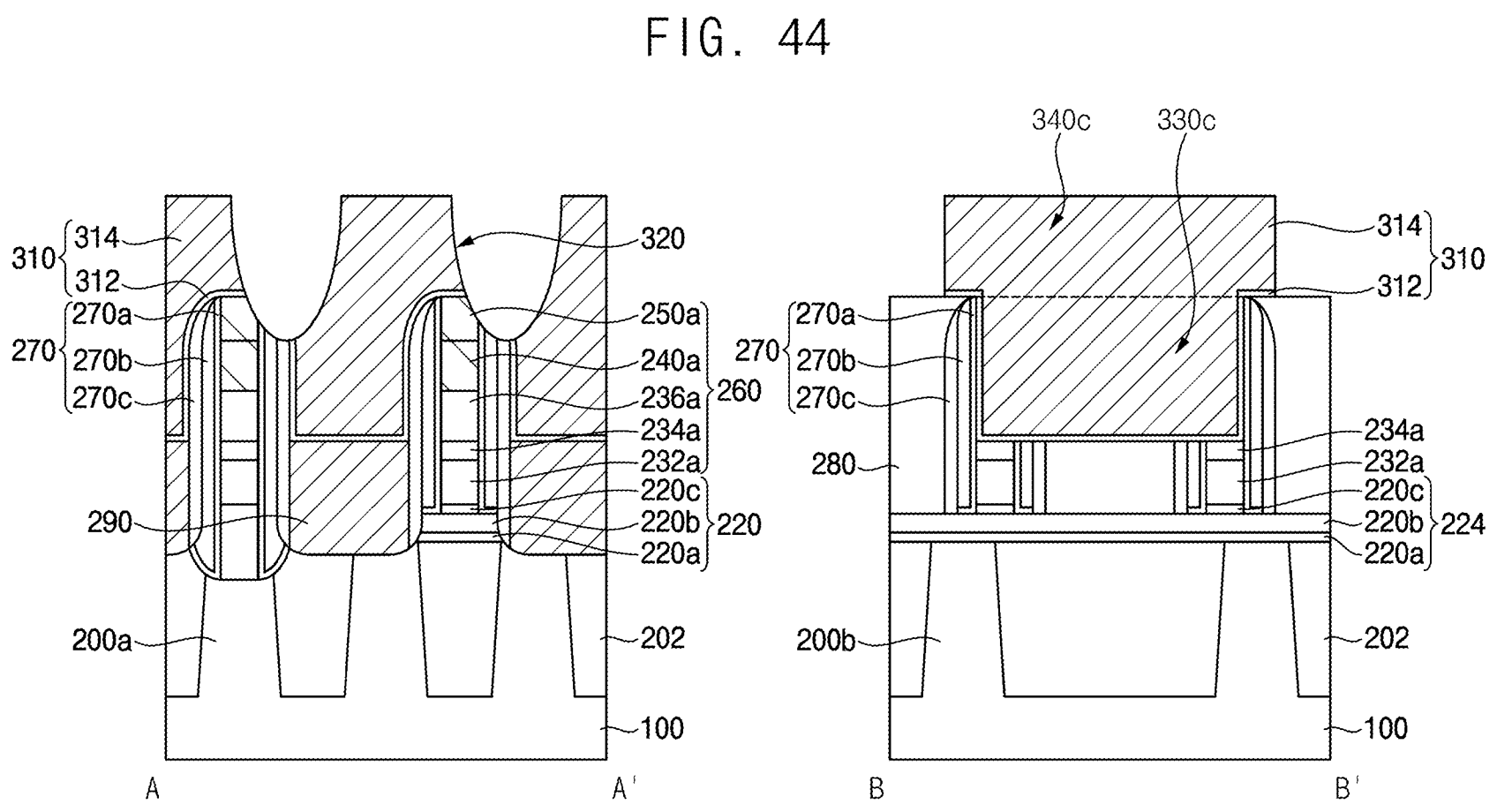

SEMICONDUCTOR DEVICES

CROSS-REFERENCE TO RELATED APPLICATION

This application claims priority under 35 USC § 119 to Korean Patent Application No. 10-2022-0173672, filed on Dec. 13, 2022, in the Korean Intellectual Property Office (KIPO), the contents of which are incorporated by reference herein in their entirety.

BACKGROUND

1. Field

Example embodiments of the present disclosure relate to a semiconductor device. More particularly, example embodiments of the present disclosure relate to a semiconductor device including wiring lines.

2. Description of the Related Art

In a DRAM device, shapes of ends of bit line structures may be different according to cell blocks. Therefore, when the bit line structures are formed on each of the cell blocks, patterning defects of the bit line structures could occur.

SUMMARY

According to example embodiments, there is provided a semiconductor device. The semiconductor device may include a first wiring line on a substrate, the first wiring line including a first line portion having a line shape extending in a first direction and a first head hammer pattern connected to a first end of the first line portion in the first direction; a second wiring line spaced apart from the first wiring line in a second direction perpendicular to the first direction, the second wiring line including a second line portion having a line shape parallel to the first line portion; and a first contact plug for electrically connecting the first line portion and the second line portion, the first contact plug being positioned at a region adjacent to the first end of the first line portion and a second end of the second line portion in the first direction. The first contact plug may have a bottom surface higher than a bottom surface of each of the first and second wiring lines. An entire upper surface of the first head hammer pattern may contact an insulation material.

According to example embodiments, there is provided a semiconductor device. The semiconductor device may include first wiring lines on a first cell block of a substrate, each of the first wiring lines including a first line portion having a line shape extending in a first direction and a first head hammer pattern connected to a first end of the first line portion in the first direction; second wiring lines on the first cell block of the substrate, each of the second wiring lines being disposed between the first wiring lines, the second wiring lines being spaced apart from the first wiring lines in a second direction perpendicular to the first direction, and each of the second wiring line including a second line portion having a line shape parallel to the first line portion; a first contact plug contacting the first head hammer pattern; third wiring lines on a second cell block of the substrate, each of the third wiring lines including a third line portion having a line shape extending in the first direction and a second head hammer pattern connected to a third end of the third line portion in the first direction; fourth wiring lines on the second cell block of the substrate, each of the fourth wiring lines being disposed between the third wiring lines, the fourth wiring lines spaced apart from the third wiring lines in the second direction, and each of the fourth wiring lines including a fourth line portion having a line shape parallel to the third line portion; and a second contact plug electrically connecting a pair of neighboring third and fourth line portions adjacent to the third end of the third line portion and a fourth end of the fourth line portion, wherein an entire upper surface of the second head hammer pattern contacts an insulation material.

According to example embodiments, there is provided a semiconductor device including first wiring lines on a first cell block of a substrate, each of the first wiring lines including a first line portion having a line shape extending in a first direction and a first head hammer pattern connected to a first end of the first line portion; second wiring lines on the first cell block of the substrate, each of the second wiring lines being disposed between the first wiring lines, the second wiring lines spaced apart from the first wiring lines in a second direction perpendicular to the first direction, and each of the second wiring lines including a second line portion having a line shape parallel to the first line portion and a second head hammer pattern connected to a second end opposite to the first end of the second line portion; a first contact plug contacting the first head hammer pattern; a second contact plug contacting the second head hammer pattern; third wiring lines on a second cell block of the substrate, each of the third wiring lines including a third line portion having a line shape extending in the first direction and a third head hammer pattern connected to a third end of the third line portion; fourth wiring lines on the second cell block of the substrate, each of the fourth wiring lines being disposed between the third wiring lines, the fourth wiring lines being spaced apart from the third wiring lines in the second direction, and each of the fourth wiring line including a fourth line portion having a line shape parallel to the third line portion and a fourth head hammer pattern connected to a fourth end opposite to the third end of the fourth line portion; a third contact plug electrically connecting a pair of neighboring third and fourth line portions adjacent to the third end of the third line portion; and a fourth contact plug contacting the fourth head hammer pattern. An entire upper surface of the third head hammer pattern contacts an insulation material.

BRIEF DESCRIPTION OF THE DRAWINGS

Features will become apparent to those of skill in the art by describing in detail exemplary embodiments with reference to the attached drawings in which:

FIGS. 1 to 4 are plan views and cross-sectional views of a semiconductor device including wiring lines according to example embodiments;

FIGS. 6 to 26 are cross-sectional views and plan views illustrating a method of manufacturing a semiconductor device according to example embodiments;

FIGS. 31 to 46 are plan views and cross-sectional views illustrating a method of manufacturing a DRAM device according to example embodiments.

DETAILED DESCRIPTION

FIGS. 1 to 4 are plan views and cross-sectional views of a semiconductor device including wiring lines according to example embodiments.

Hereinafter, one direction parallel to a surface of a substrate is referred to as a first direction, and a direction parallel to the surface of the substrate and perpendicular to the first direction is described as a second direction. As used herein, the terms "first," "second," and the like are merely for identification and differentiation and are not intended to imply or require sequential inclusion (e.g., a third element and a fourth element may be described without implying or requiring the presence of a first element of a second element).

Figure 1:
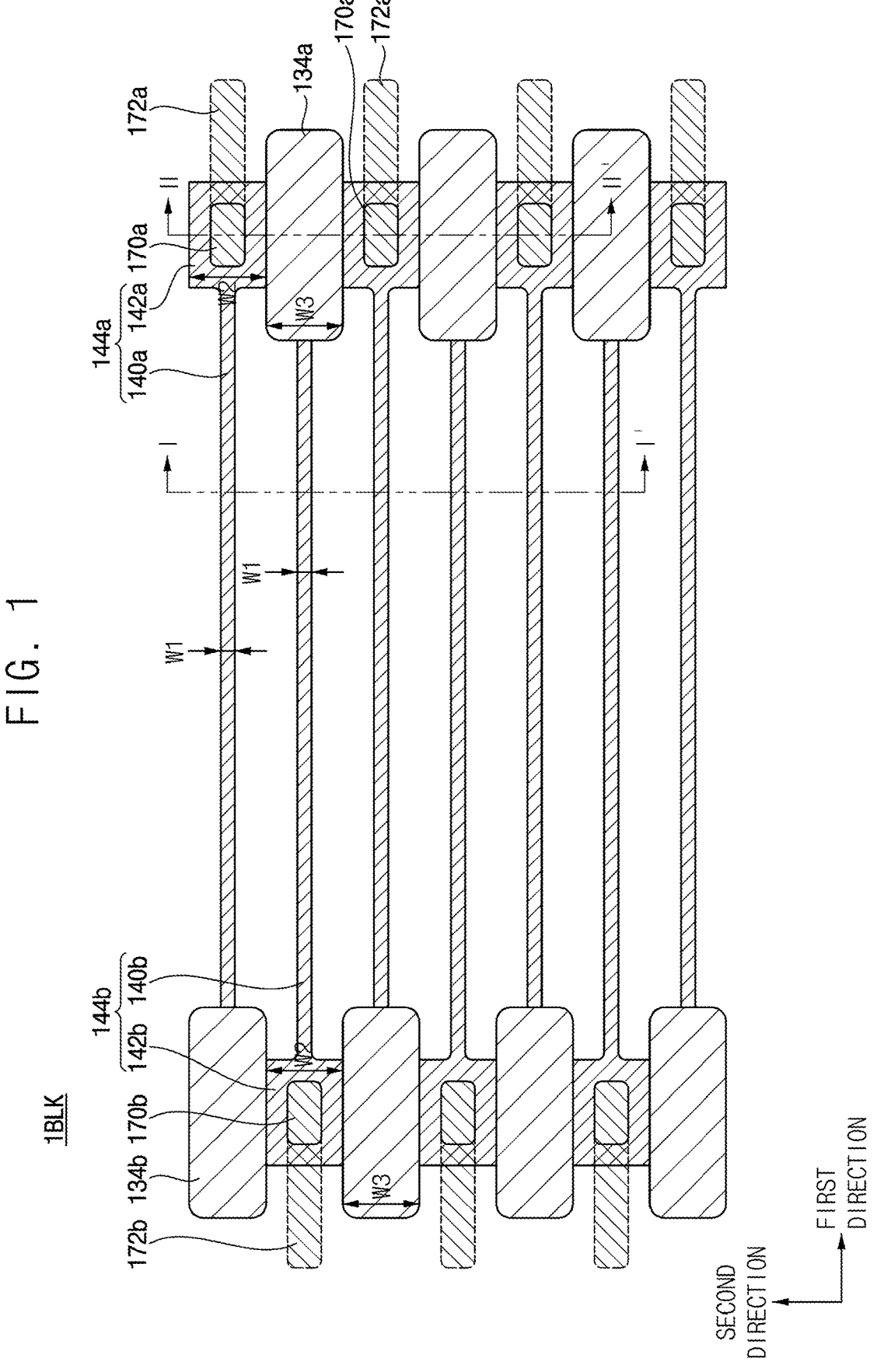
Figure 2:
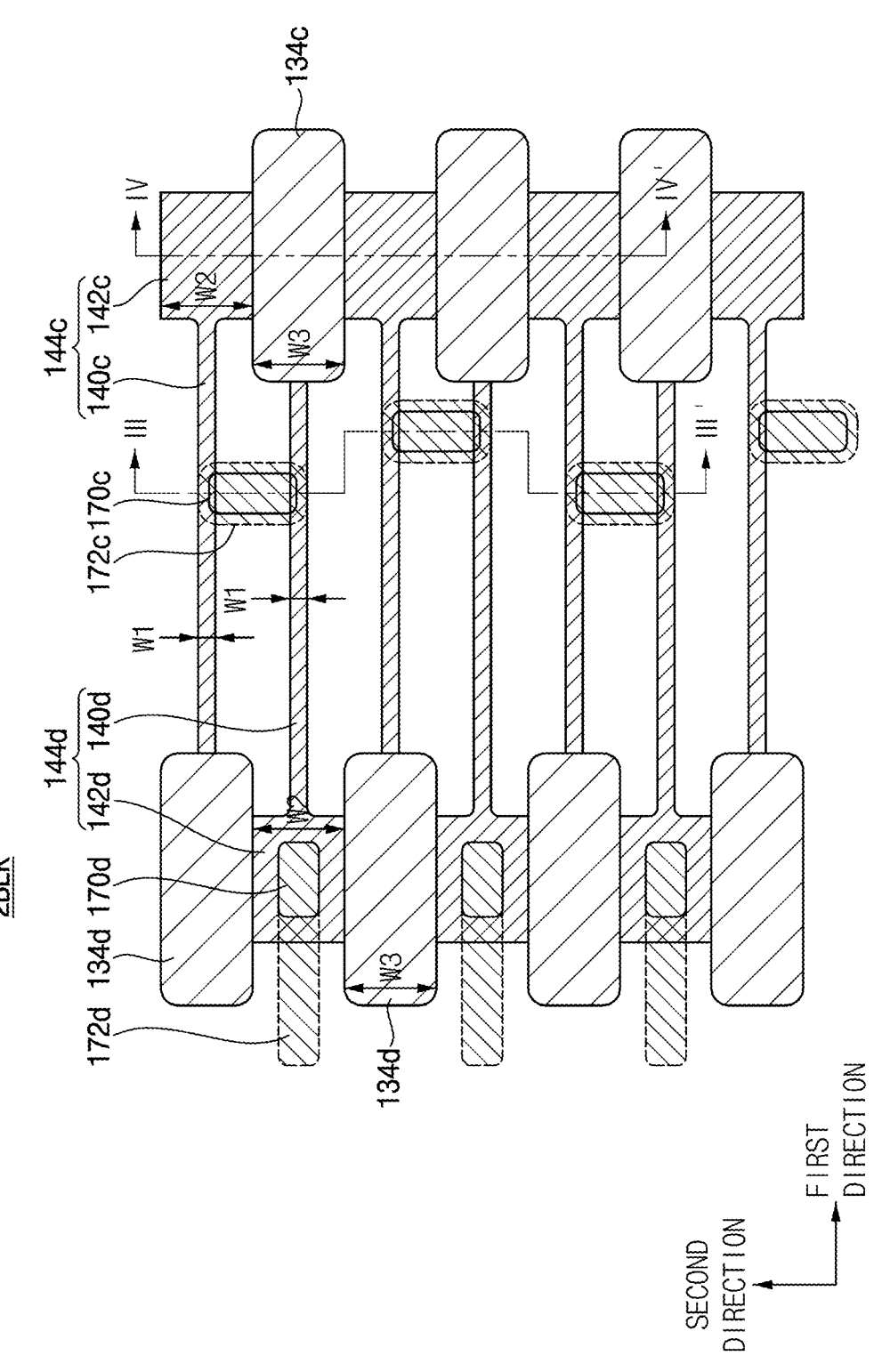
Figure 3:
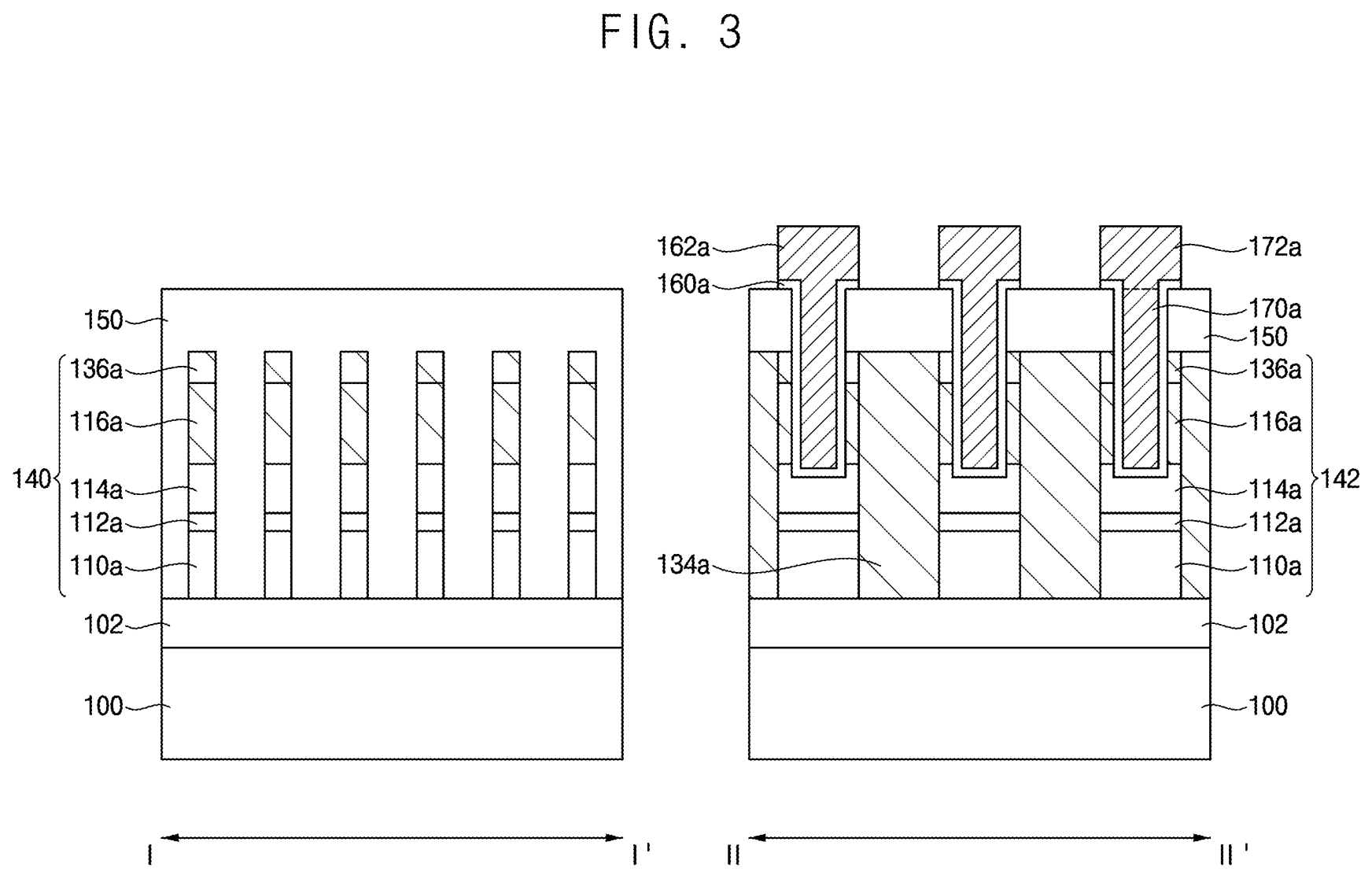

FIG. 1 is a plan view illustrating wiring lines in a first cell block, and FIG. 2 is a plan view illustrating wiring lines in a second cell block. FIG. 3 includes cross-sectional views taken along lines I-I' and II-II' of FIG. 1, and FIG. 4 includes cross-sectional views taken along lines III-III' and IV-IV' of FIG. 2.

In each of plan views, first to fourth wiring lines and first to fourth separation patterns are shown when a level of a first conductive pattern is cut in a horizontal direction.

Referring to FIGS. 1 to 4, a substrate 100 may include a memory cell region, and a first cell block and a second cell block may be included in the memory cell region.

A lower structure including memory cell patterns and a lower insulating interlayer 102 for constituting memory cells may be formed on the first cell block and the second cell block of the substrate 100.

A first wiring line 144a, a second wiring line 144b, first and second separation patterns 134a and 134b, first and second contact plugs 170a and 170b and the first and second upper wirings 172a and 172b may be formed on the first cell block of the substrate 100. A third wiring line 144c, a fourth wiring line 144d, third and fourth separation patterns 134c and 134d, third and fourth contact plugs 170c and 170d, a capping conductive pattern 172c, and a third upper wiring 172d may be formed on the second cell block of the substrate 100.

As shown in FIG. 1, the first wiring line 144a and the second wiring line 144b may be alternately and repeatedly arranged on the first cell block of the substrate 100. Each of the first and second wiring lines 144a and 144b may extend in the first direction. Each of the first wiring lines 144a may be disposed between the second wiring lines 144b.

The first wiring line 144a may include a first line portion 140a having a line shape extending in the first direction and having a first width W1 in the second direction, and a first head hammer pattern 142a connected to a right end of the first line portion 140a in the first direction and having a second width W2 in the second direction greater than the first width W1. The first head hammer pattern 142a may not be disposed at a left end of the first line portion 140a in the first direction.

When the first head hammer pattern 142a has the second width W2 greater than the first width W1, the first head hammer pattern 142a may serve as a pad pattern for forming a contact plug thereon.

The second wiring line 144b may include a second line portion 140b having a line shape extending in the first direction and having the first width W1 in the second direction, The second line portion 140b may have a second head hammer pattern 142b connected to a left end of the second line portion 140b in the first direction and having the second width W2 in the second direction. The second head hammer pattern 142b may not be disposed at a right end of the second line portion 140b in the first direction.

The first line portion 140a and the second line portion 140b may be alternately arranged in the second direction. The first line portion 140a and the second line portion 140b may be spaced apart from each other at equal intervals in the second direction. The first line portion 140a and the second line portion 140b may be parallel to each other.

The right end of the second wiring line 144b in the first direction may not extend to the first head hammer pattern 142a of the first wiring line 144a. The right end of the second line portion 140b in the first direction may be shorter than the right end of the first line portion 140a in the first direction. The first head hammer patterns 142a adjacent to each other may be disposed to face each other to be spaced apart in the second direction.

The first separation pattern 134a may be disposed between the first head hammer patterns 142a in the second direction. That is, the first head hammer patterns 142a may be separated from each other by the first separation pattern 134a. The first separation pattern 134a may have an isolated shape extending in the first direction. A longitudinal direction of the first separation pattern 134a may be the first direction. One end of the first separation pattern 134a may contact one end of the second line portion 140b. The first separation pattern 134a may have a third width W3 in the second direction. The third width W3 may be greater than the first width W1.

The left end of the first wiring line 144a in the first direction may not extend to the second head hammer pattern 142b of the second wiring line 144b. Accordingly, the left end of the first line portion 140a in the first direction may be shorter than the left end of the second line portion 140b in the first direction. The second head hammer patterns 142b adjacent to each other may be disposed to face each other to be spaced apart in the second direction.

The second separation pattern 134b may be formed between the second head hammer patterns 142b in the second direction. That is, the second head hammer patterns 142b may be separated from each other by the second separation pattern 134b. The second separation pattern 134b may have an isolated shape extending in the first direction. A longitudinal direction of the second separation pattern 134b may be the first direction. One end of the second separation pattern 134b may contact one end of the first line portion 130a. The second separation pattern 134b may have the third width W3 in the second direction.

As shown in FIG. 2, a third wiring line 144c and a fourth wiring line 144d may be alternately and repeatedly disposed on the second cell block of the substrate. Each of the third and fourth wiring lines 144c and 144d may extend in the first direction. Each of the third wiring lines 144c may be disposed between the fourth wiring lines 144d.

The third wiring line 144c may have a third line portion 140c having a line shape extending in the first direction and having the first width W1 in the second direction, and a third head hammer pattern 142c connected to a right end of the third line portion 140c in the first direction and having the second width W2 in the second direction. The third head hammer pattern 142c may not be disposed at a left end of the third line portion 140c in the first direction.

The fourth wiring line 144d may have a fourth line portion 140d having a line shape extending in the first direction and having the first width W1 in the second direction, and a fourth head hammer pattern 142d connected to a left end of the fourth line portion 140d in the first direction and having the second width W2 in the second direction. The fourth head hammer pattern 142d may not be disposed at a right end of the fourth line portion 140d in the first direction.

The third line portion 140c and the fourth line portion 140d may be alternately arranged in the second direction. The third line portion 140c and the fourth line portion 140d may be spaced apart from each other at equal intervals in the second direction. The third line portion 140c and the fourth line portion 140d may be parallel to each other.

The right end of the fourth wiring line 144d in the first direction may not extend to the third head hammer pattern 142c of the third wiring line 144c. The right end of the fourth line portion 140d in the first direction may be shorter than the right end of the third line portion 140c in the first direction. The third head hammer patterns 142c adjacent to each other may be disposed to face each other to be spaced apart in the second direction.

The third separation pattern 134c may be formed between the third head hammer patterns 142c in the second direction. The third head hammer patterns 142c may be separated from each other by the third separation pattern 134c. The third separation pattern 134c may have an isolated shape extending in the first direction. A longitudinal direction of the third separation pattern may be the first direction. One end of the third separation pattern 134c may contact one end of the fourth line portion 140d. The third separation pattern 134c may have the third width W3 in the second direction.

The left end of the third wiring line 144c in the first direction may not extend to the fourth head hammer pattern 142d of the fourth wiring line 144d. The left end of the third line portion 140c in the first direction may be shorter than the left end of the fourth line portion 140d in the first direction. The fourth head hammer patterns 142d adjacent to each other may be disposed to face each other to be spaced apart in the second direction.

The fourth separation pattern 134d may be formed between the fourth head hammer patterns 142d in the second direction. The fourth head hammer patterns 142d may be separated from each other by the fourth separation pattern 134d. The fourth separation pattern 134d may have an isolated shape extending in the first direction. A longitudinal direction of the fourth separation pattern 134d may be the first direction. One end of the fourth separation pattern 134d may contact one end of the third line portion 140c. The fourth separation pattern 134d may have the third width W3 in the second direction.

In example embodiments, a length of each of the third and fourth wiring lines 144c and 144d in the first direction may be less than a length of each of the first and second wiring lines 144a and 144b in the first direction.

Referring to FIGS. 1 to 4 again, the first to fourth head hammer patterns 142a, 142b, 142c, and 142d disposed in the first and second cell blocks may have the same shape and the same width, i.e., the second width W2. Ends of the first to fourth wiring lines 144a, 144b, 144c, and 144d may have the same shape. The first to fourth line portions 140a, 140b, 140c, and 140d may have the same width, i.e., the first width W1.

The first to fourth wiring lines 144a, 144b, 144c, and 144d may include the same material, and may have the same stacked structure. Each of the first to fourth wiring lines 144a, 144b, 144c, and 144d may have a structure in which a first conductive pattern and first and second capping patterns 116a and 136a are stacked.

In example embodiments, referring to FIG. 3, the first conductive pattern may include a polysilicon pattern 110a, a first barrier metal pattern 112a, and a first metal pattern 114a stacked. The first barrier metal pattern 112a may include metal or metal nitride, e.g., titanium, titanium nitride, tantalum, tantalum nitride, or tungsten nitride. The first metal pattern 114a may include, e.g., tungsten or aluminum. For example, the first metal pattern 114a may include tungsten. The first and second capping patterns 116a and 136a may include, e.g., silicon nitride. In this case, the first and second capping patterns 116a and 136a may include the same insulation material. The first and second capping patterns 116a and 136a may be merged with each other, and thus the first and second capping patterns 116a and 136a may serve as one capping pattern. The stacked structure of each of the first to fourth wiring lines 144a, 144b, 144c, and 144d may be variously changed according to non-limiting examples.

All of the first to fourth separation patterns 134a, 134b, 134c and 134d may have the same width, i.e., the third width W3. The first to fourth separation patterns 134a, 134b, 134c and 134d may include the same insulation material. In example embodiments, the first to fourth separation patterns 134a, 134b, 134c and 134d may include silicon nitride or silicon oxide. For example, the first to fourth separation patterns 134a, 134b, 134c and 134d may include silicon nitride.

A first insulating interlayer 150 may be formed on the first to fourth wiring lines 144a, 144b, 144c and 144d to fill spaces between the first to fourth wiring lines 144a, 144b, 144c and 144d.

The first contact plug 170a may pass through the first insulating interlayer 150 and the first and second capping patterns 116a and 136a of the first head hammer pattern 142a in the first cell block, and the first contact plug 170a may contact the first conductive pattern of the first head hammer pattern 142a. For example, the first contact plug 170a may contact the first metal pattern 114a of the first head hammer pattern 142a. The first upper wiring 172a may be formed on the first contact plug 170a and the first insulating interlayer 150. The first upper wiring 172a may contact the first contact plug 170a.

The second contact plug 170b may pass through the first insulating interlayer 150 and the first and second capping patterns 116a and 136a of the second head hammer pattern 142b in the first cell block, and the second contact plug 170b may contact the first conductive pattern of the second head hammer pattern 142b. For example, the second contact plug 170b may contact the first metal pattern 114a of the second head hammer pattern 142b. The second upper wiring 172b may be formed on the second contact plug 170b and the first insulating interlayer 150. The second upper wiring 172b may contact the second contact plug 170b.

The third contact plug 170c may pass through the first insulating interlayer and the first and second capping pattern of a pair of neighboring third and fourth line portions adjacent to the third head hammer pattern 142c in the second cell block, so that the third contact plug 170c may be electrically connected to the pair of neighboring third and fourth line portions.

A bottom surface of the third contact plug 170c may be higher than a bottom surface of each of the third and fourth wiring lines 144c and 144d. For example, the bottom surface of the third contact plug 170c may contact the first metal patterns 114a of the third and fourth line portions 140c and 140d and the first insulating interlayer 150 therebetween.

In example embodiments, a plurality of third contact plugs 170c may be arranged in a zigzag fashion in the second direction. In some example embodiments, the third contact plugs 170c may be disposed to be aligned with each other in the second direction.

As such, the pair of neighboring third and fourth wiring lines 144c and 144d may be electrically connected to each other by the third contact plug 170c, and thus the pair of neighboring third and fourth wiring lines 144c and 144d may function as one folded wiring line. The pair of neighboring third and fourth wiring lines 144c and 144d may have one folded wiring structure. Therefore, the pair of neighboring third and fourth wiring lines 144c and 144d may serve as one wiring line having an effective length of sum of the lengths of the third and fourth wiring lines 144c and 144d. In example embodiments, when the one folded line in which the third and fourth wiring lines 144c and 144d are combined has the same function as the first wiring line 144a or the second wiring line 144b, the length of each of the third and fourth wiring lines 144c and 144d in the first direction may be less than a length of each of the first and second wiring lines 144a and 144b in the first direction.

In example embodiments, the capping conductive pattern 172c may be formed on the third contact plug 170c and the first insulating interlayer 150. The capping conductive pattern 172c may completely cover the third contact plug 170c, and may have an isolated shape. The capping conductive pattern 172c may protect the third contact plug 170c. In some example embodiments, the capping conductive pattern 172c may not be formed on the third contact plug 170c.

A contact plug may not be formed on the third head hammer pattern 142c. Accordingly, an entire upper surface of the third head hammer pattern 142c may contact an insulation material. The third head hammer pattern 142c may not serve as a pad pattern for forming a contact plug thereon.

The fourth contact plug 170d may pass through the first insulating interlayer 150 and the first and second capping patterns 116a and 136a of the fourth head hammer pattern 142d in the second cell block, and the fourth contact plug 170d may contact the first conductive pattern of the fourth head hammer pattern 142d. For example, the fourth contact plug 170d may contact the first metal pattern 114a of the fourth head hammer pattern 142d. The third upper wiring 172d may be formed on the fourth contact plug 170d and the first insulating interlayer. The third upper wiring 172d may contact the fourth contact plug 170d The first to fourth contact plugs 170a, 170b, 170c and 170d may be formed by the same processes. Accordingly, the first to fourth contact plugs 170a, 170b, 170c and 170d may include the same material.

In addition, the first to third upper wirings 172a, 172b and 172d and the capping conductive pattern 172c may be formed by the same processes. Accordingly, the first to third upper wirings 172a, 172b and 172d and the capping conductive pattern 172c may include the same material.

In example embodiments, the first to fourth contact plugs 170a, 170b, 170c and 170d, the first to third upper wirings 172a, 172b, and 172d, and the capping conductive pattern 172c may be formed by the same deposition process. In example embodiments, each of the first to fourth contact plugs 170a and 170b, 170c and 170d, the first to third upper wirings 172a, 172b and 172d, and the capping conductive pattern 172c may include a second barrier metal pattern 160a and a second metal pattern 162a.

In some example embodiments, the first to fourth contact plugs 170a, 170b, 170c and 170d, and the first to third upper wirings 172a, 172b and 172d and the capping conductive pattern 172c may be formed by different deposition processes. For example, each of the first to fourth contact plugs 170a, 170b, 170c and 170d may include a second barrier metal pattern and a second metal pattern, and each of the first to third upper wirings 172a, 172b and 172d and the capping conductive pattern 172c may include a third barrier metal pattern and a third metal pattern.

Figure 5:
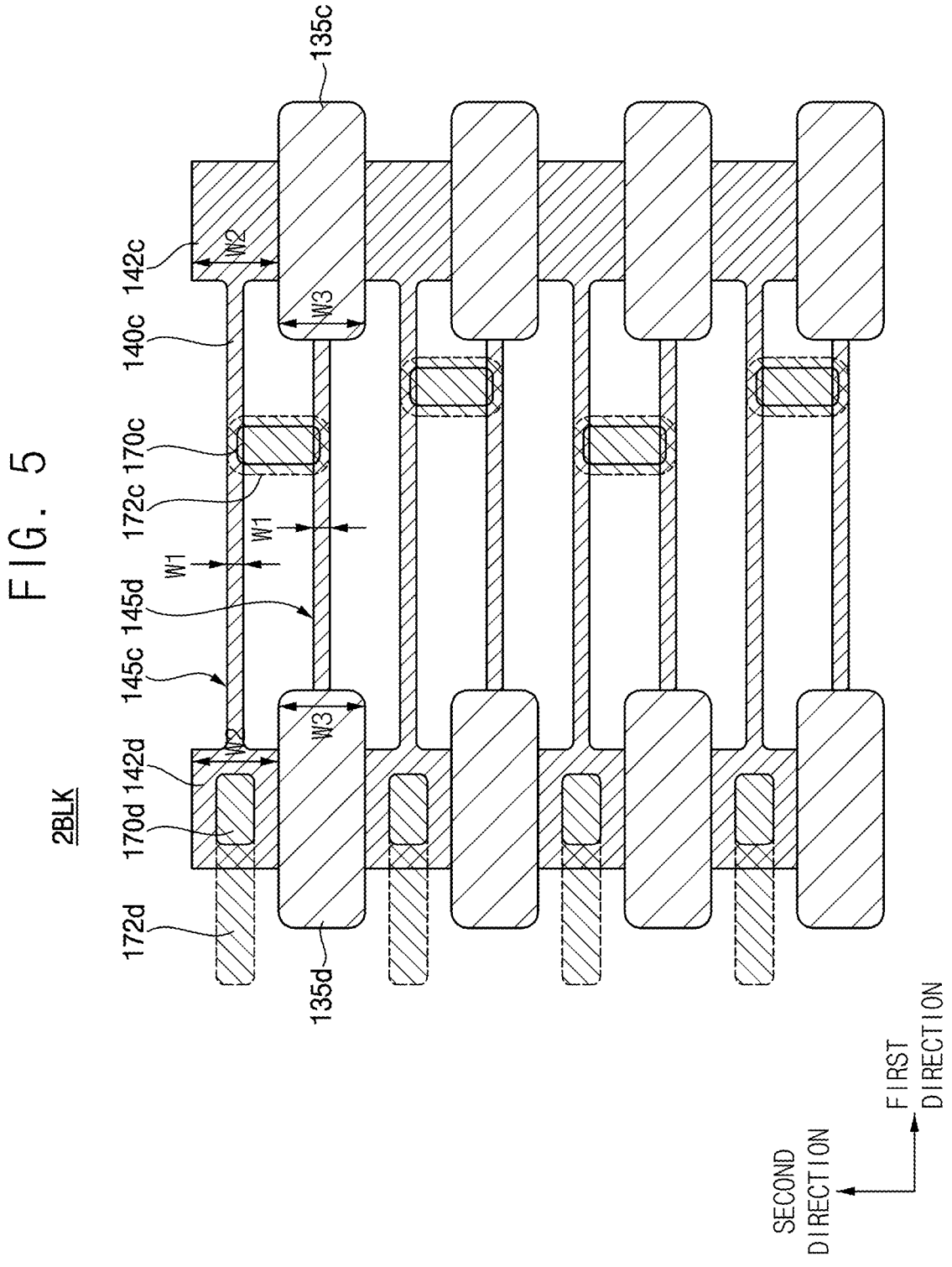
FIG. 5 is a plan view of a semiconductor device according to example embodiments.

FIG. 5 is a plan view of a semiconductor device according to example embodiments.

FIG. 5 is the same as the semiconductor device described with reference to FIGS. 1 to 4, except for third and fourth wiring lines and third and fourth separation patterns in the second cell block. Therefore, redundant descriptions are not repeated. In FIG. 5, the third and fourth wiring lines and the third and fourth separation lines are shown when a level of the first conductive pattern is cut in the horizontal direction.

As shown in FIGS. 1 and 3, the first wiring line 144a, the second wiring line 144b, the first and second separation patterns 134a and 134b, the first and second contact plugs 170a and 170b, and first and second upper wirings 172a and 172b may be formed on the first cell block of the substrate 100. The first wiring line 144a, the second wiring line 144b, the first and second separation patterns 134a and 134b, the first and second contact plugs 170a and 170b, and first and second upper wirings 172a and 172b may be substantially the same as those described with reference to FIGS. 1 to 4, respectively.

Referring to FIG. 5, the second cell block of the substrate may include a third wiring line 145c, a fourth wiring line 145d, third and fourth separation patterns 135c and 135d, third and fourth contact plugs 170c and 170d, a capping conductive pattern 172c and a third upper wiring 172d.

The third wiring line 145c may include a third line portion 140c having a line shape extending in the first direction and having the first width W1 in the second direction, a third head hammer pattern 142c connected to a right end of the third line portion 140c in the first direction, and a fourth head hammer pattern 142d connected to a left end of the third line portion 140c in the first direction. The third and fourth head hammer patterns 142c and 142d may be formed at both ends of the third line portion 140c, respectively. Each of the third and fourth head hammer patterns 142c and 142d may have the second width W2 in the second direction.

The fourth wiring line 145d may include only a fourth line portion 140d having a line shape extending in the first direction and having the first width W1 in the second direction. Head hammer patterns may not be disposed at both ends of the fourth line portion 140d.

Figure 4:
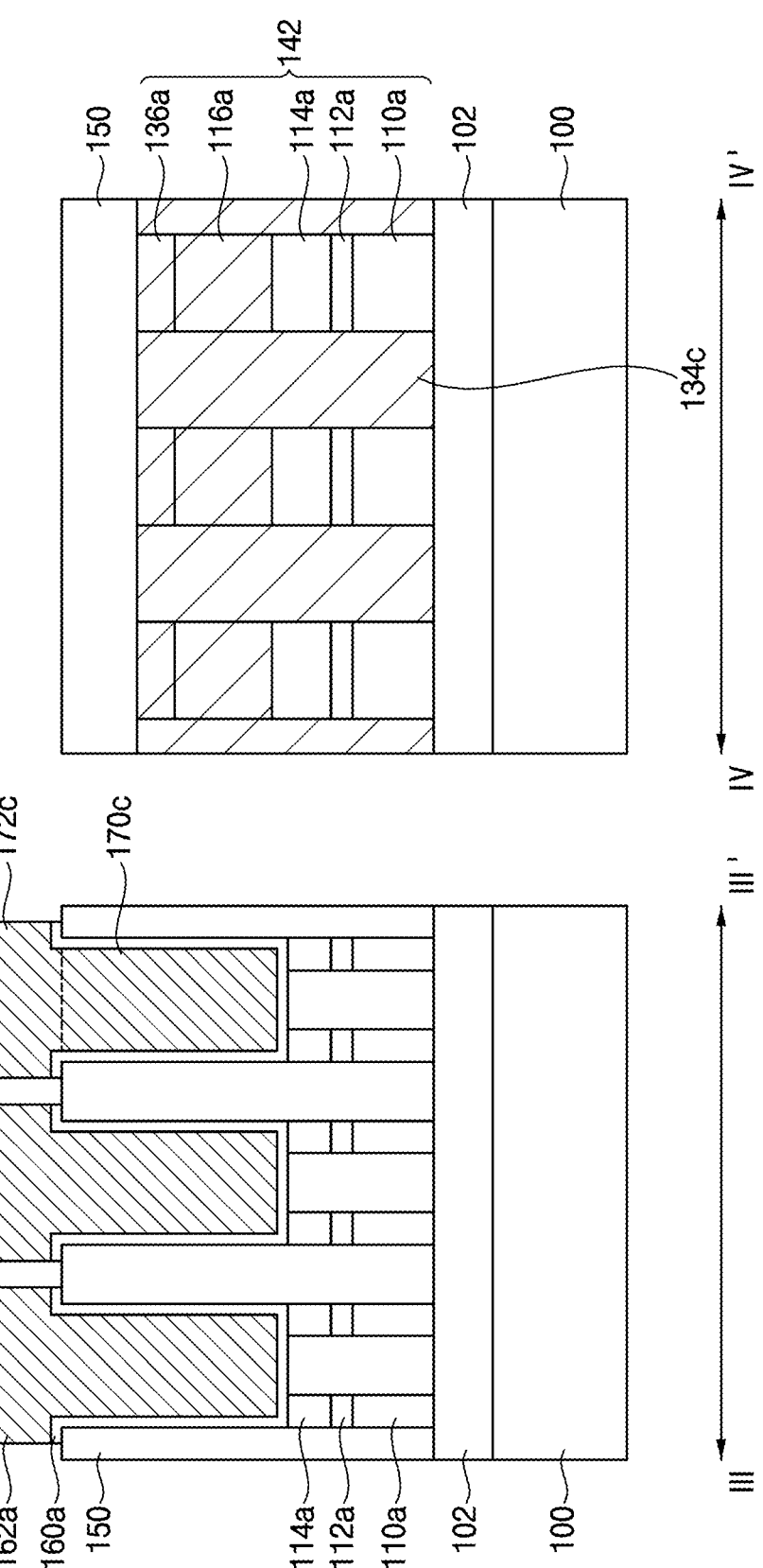

As shown in FIG. 4, a first insulating interlayer 150 may be formed on the first to fourth wiring lines 144a, 144b, 145c and 145d to fill spaces therebetween.

The third contact plug 170c may pass through the first insulating interlayer 150 and the first and second capping patterns 116a and 136a of a pair of neighboring third and fourth line portions 140c and 140d adjacent to the third head hammer pattern 142c in the second cell block, so that the third contact plug 170c may be electrically connected to the pair of neighboring third and fourth line portions 140c and 140d.

A bottom surface of the third contact plug 170c may be higher than a bottom surface of each of the third and fourth wiring lines 144c and 144d. For example, the bottom surface of the third contact plug 170c may contact the first metal patterns 114a of the third and fourth line portions 140c and 140d and the first insulating interlayer 150 between the third and fourth line portions 140c and 140d.

In example embodiments, a capping conductive pattern 172*c* may be formed on the third contact plug 170*c*. The capping conductive pattern 172*c* may cover the third contact plug 170*c*, and may have an isolated shape.

A contact plug may not be formed on the third head hammer pattern 142*c*. An entirety of an upper surface of the third head hammer pattern 142*c* may contact an insulation material. The third head hammer pattern 142*c* may not serve as a pad pattern for forming a contact plug thereon.

The fourth contact plug 170*d* may pass through the first insulating interlayer 150 and the first and second capping patterns 116*a* and 136*a* of the fourth head hammer pattern 142*d* in the second cell block, such that the fourth contact plug 170*d* may contact the first conductive pattern of the fourth head hammer pattern 142*d*. Accordingly, the fourth head hammer pattern 142*d* may serve as a pad pattern for forming a contact plug thereon.

The third separation pattern 135*c* may be formed between the third head hammer patterns 142*c*. The fourth separation pattern 135*d* may be formed between the fourth head hammer patterns 142*d*. One end of the fourth wiring line 145*d* in the first direction may contact one end of the third separation pattern 135*c*, and the other end of the fourth wiring line 145*d* in the first direction may contact one end of the fourth separation pattern 135*d*. Accordingly, the third and fourth separation patterns 135*c* and 135*d* may be disposed to face each other in the first direction.

FIGS. 6 to 26 are cross-sectional views and plan views illustrating a method of manufacturing a semiconductor device according to example embodiments.

Figure 19:
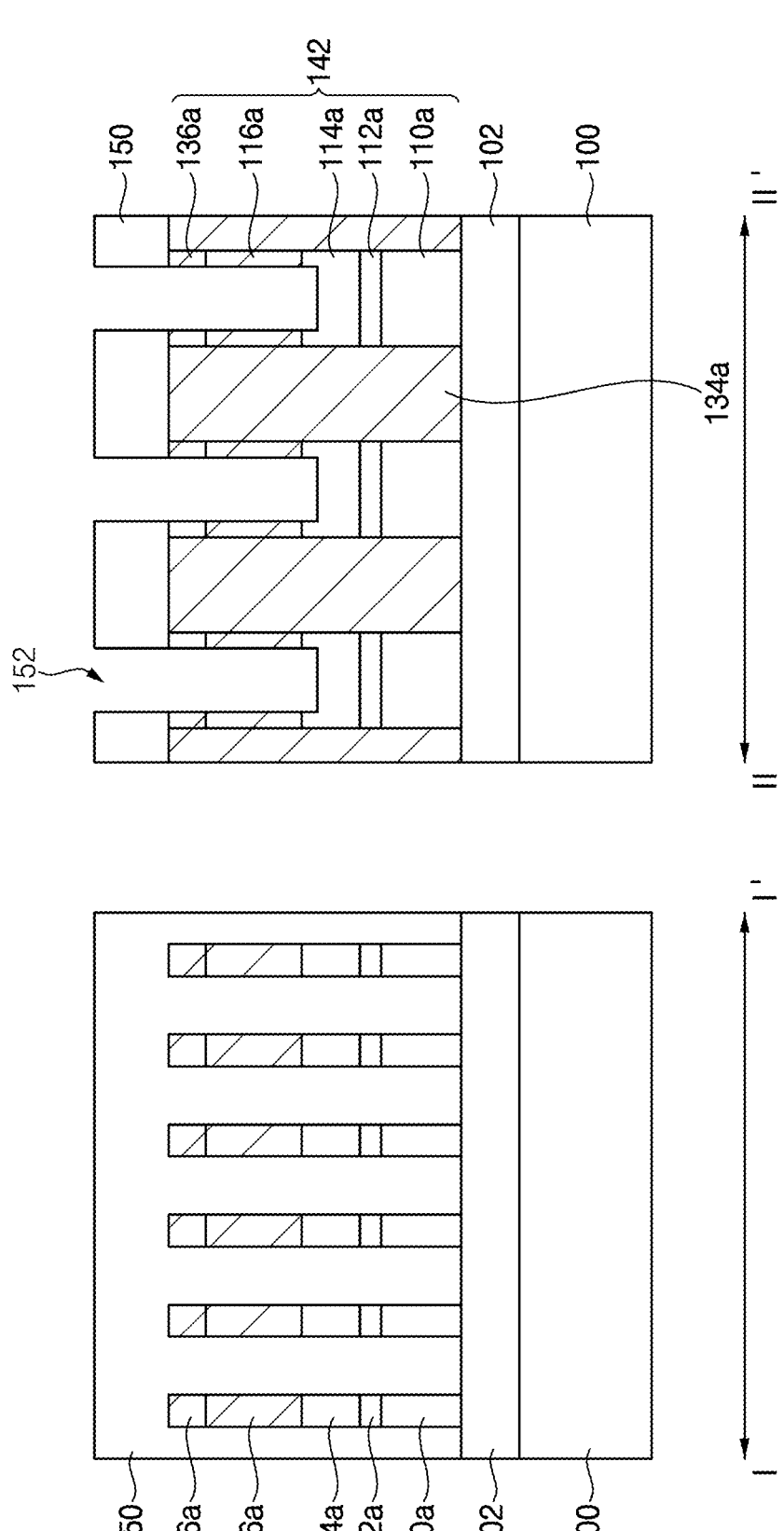
Figure 21:
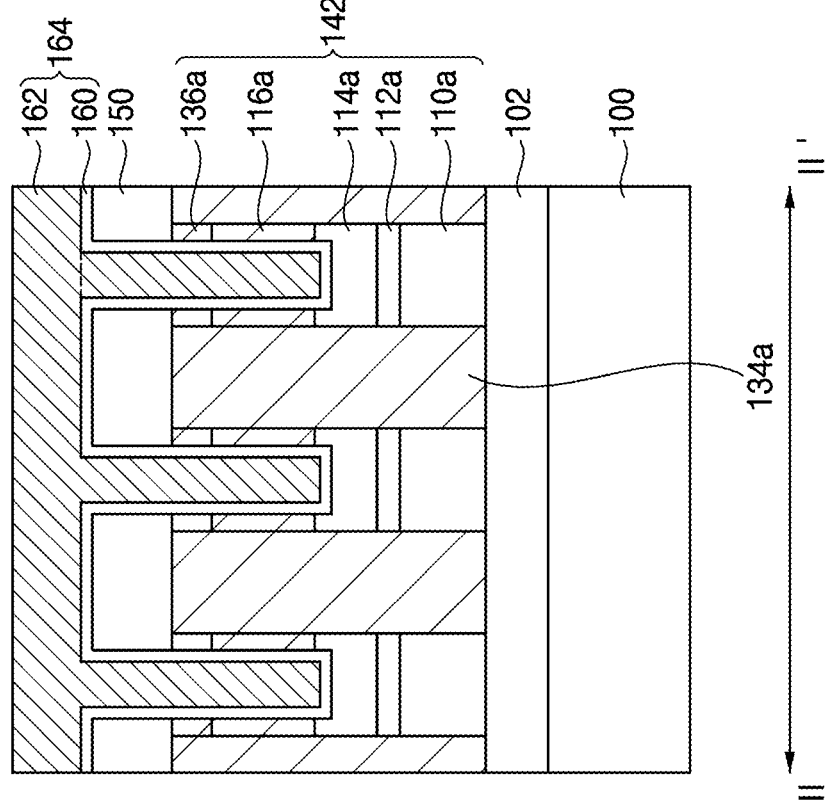
Figure 21:
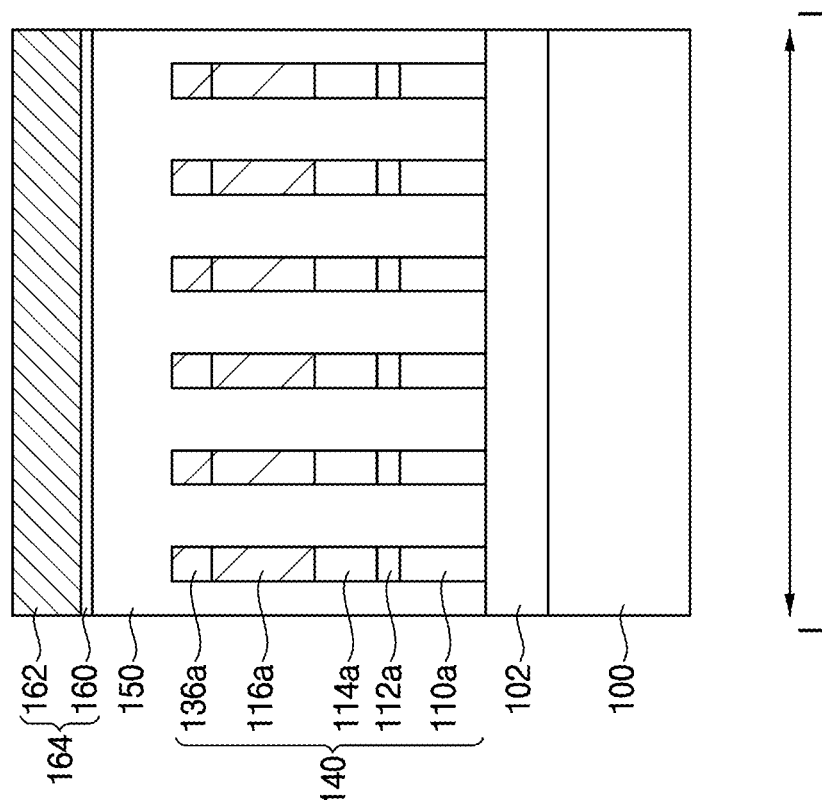
Figure 25:
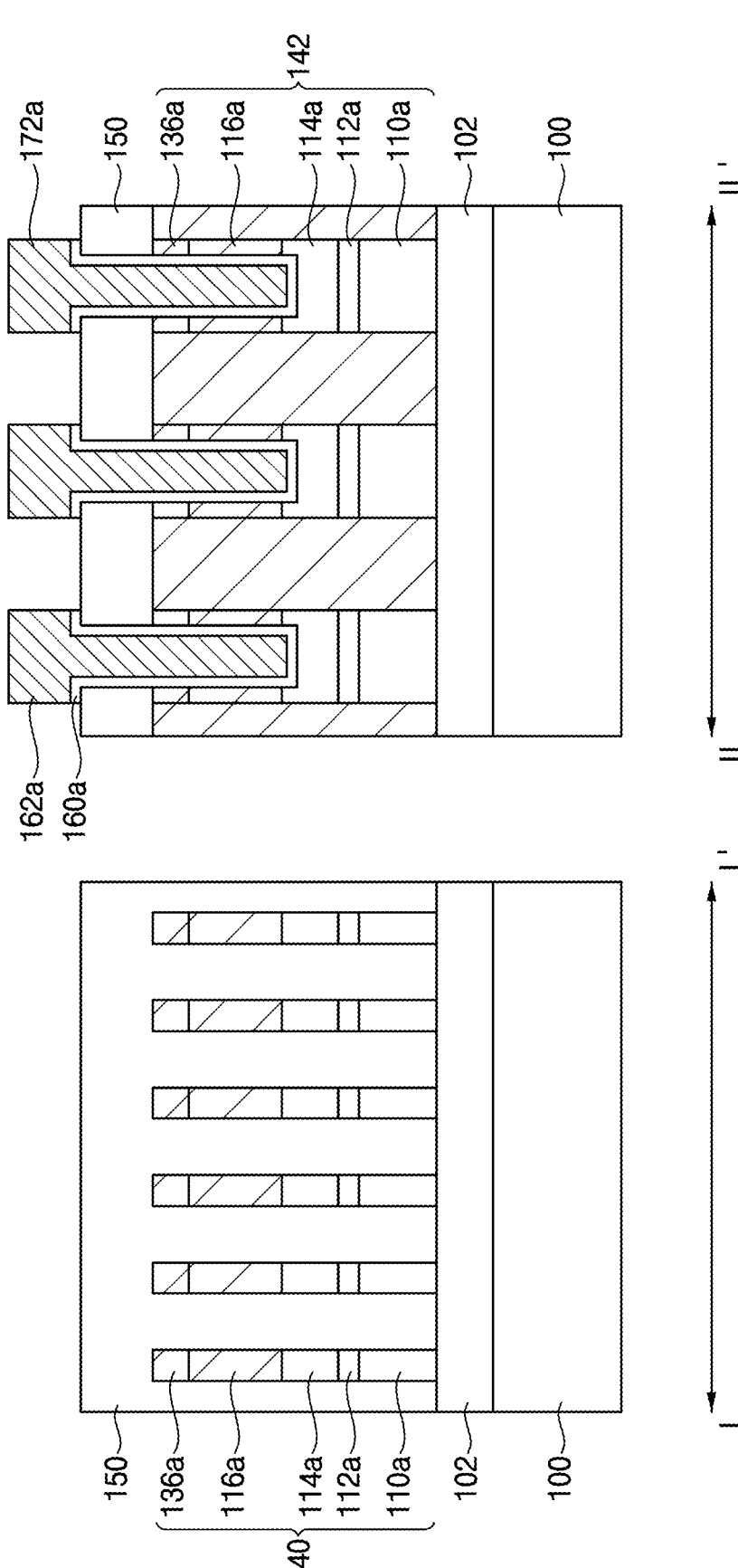
Figure 26:
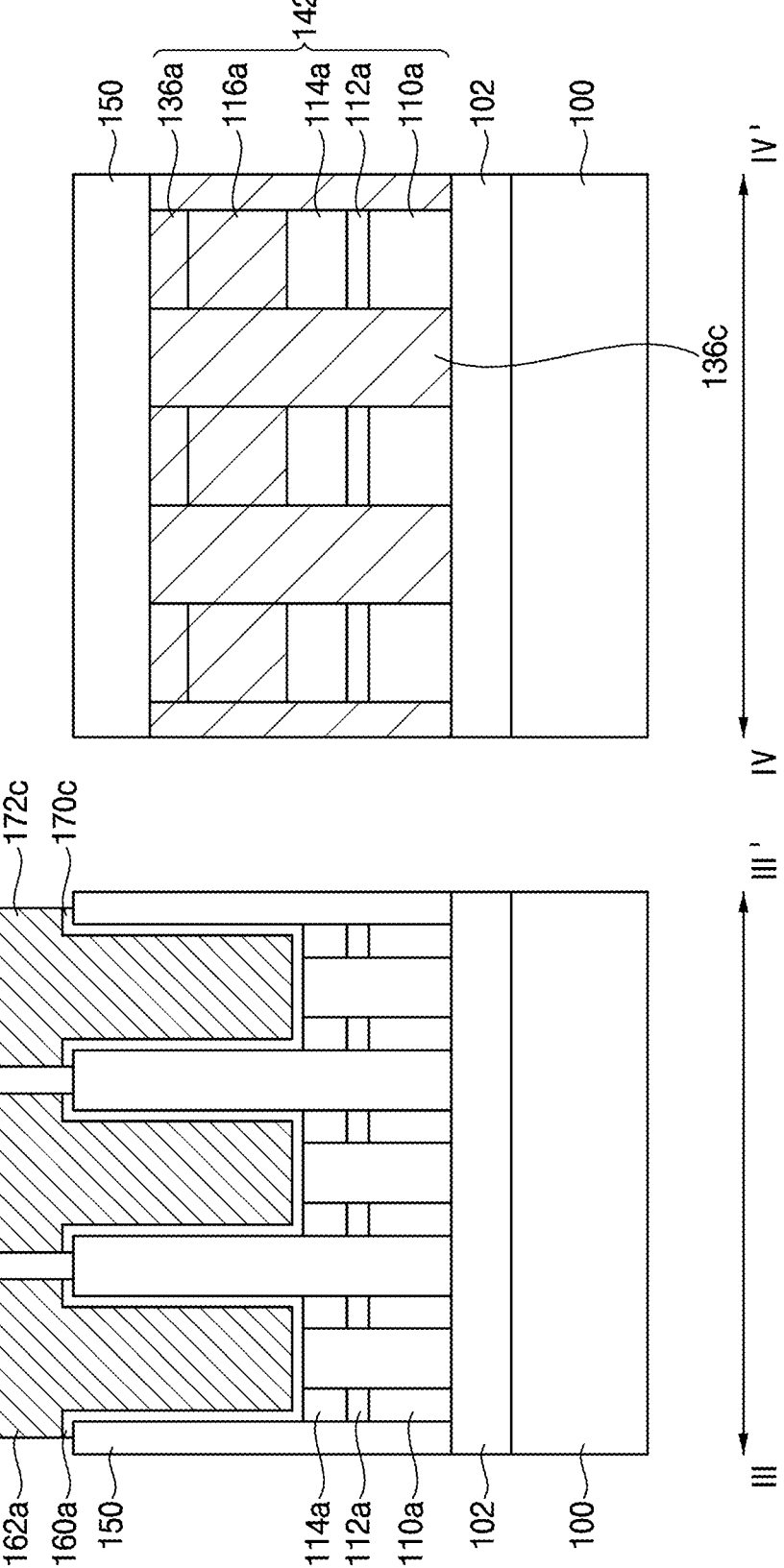

FIGS. 6, 9, 12, 14, 17, and 23 are plan views illustrating a first cell block, and FIGS. 7, 10, 13, 15, 18, and 24 are plan views illustrating a second cell block. FIGS. 19, 21, and 25 are cross-sectional views of lines I-I' and II-II' of each of plan views of the first cell block, and FIGS. 8, 11, 16, 20, 22, and 26 are cross-sectional views of lines III-III' and IV-IV' of each of plan views of the second cell block.

Figure 6:
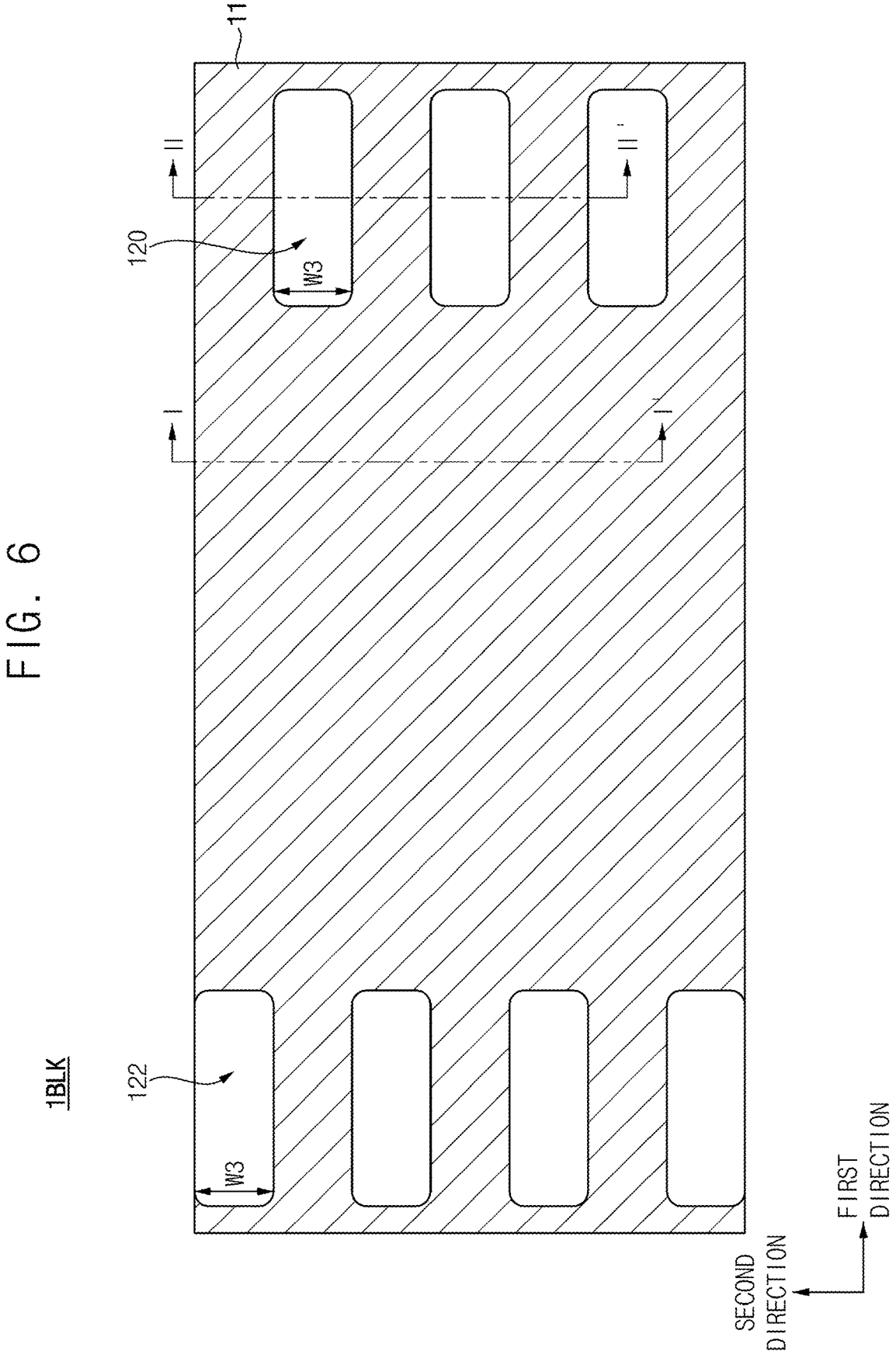
Figure 7:
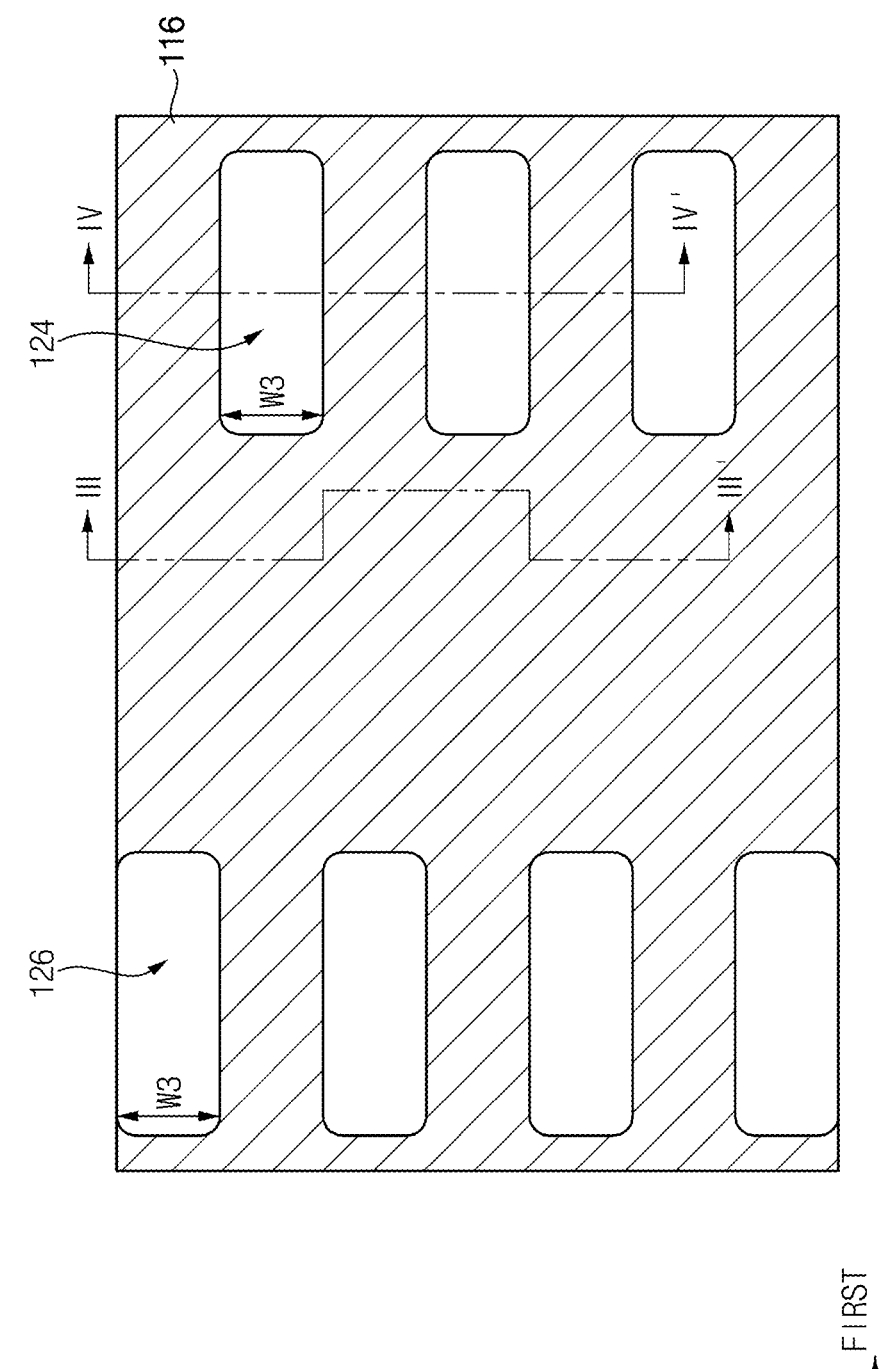
Figure 8:
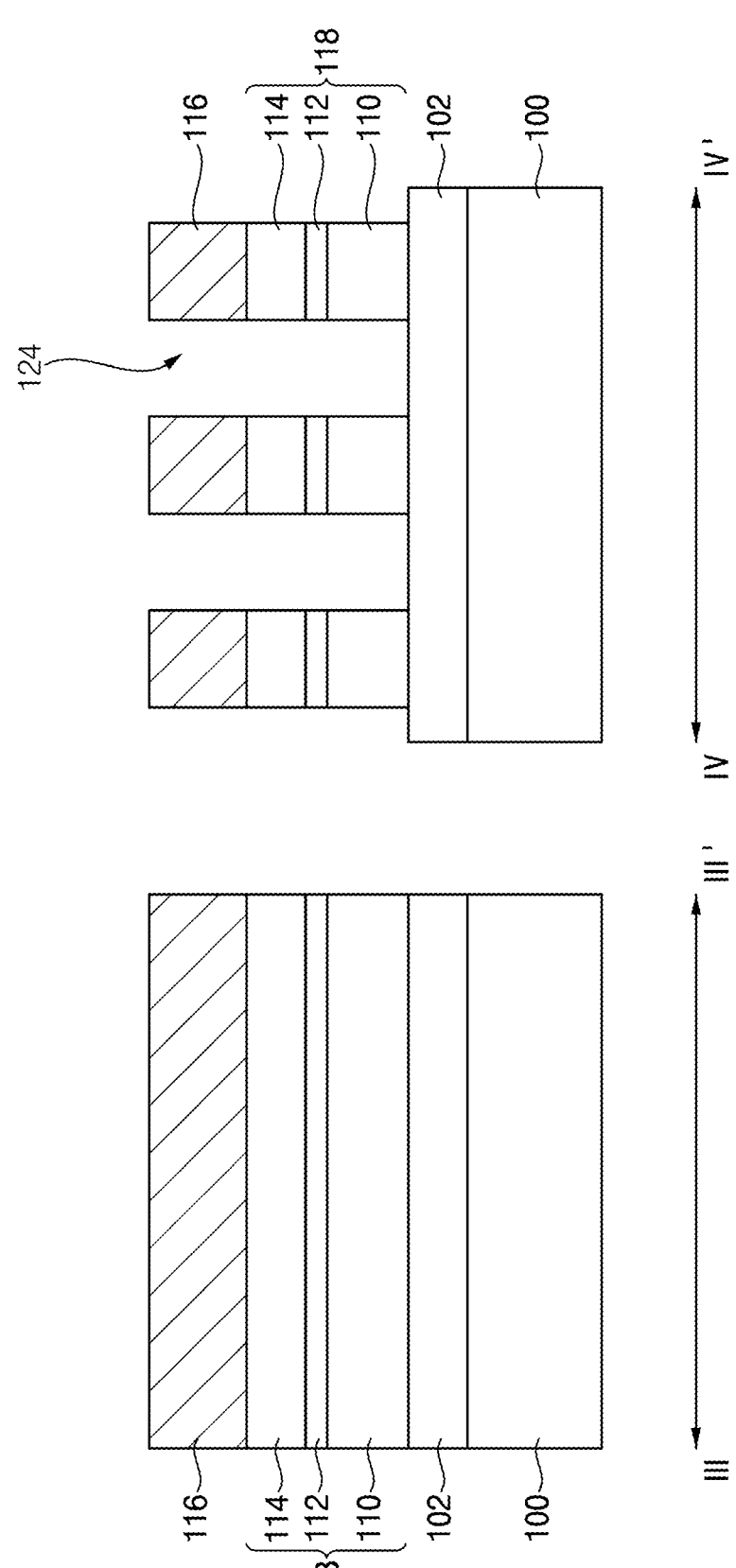

Referring to FIGS. 6 to 8, a substrate 100 may include a memory cell region. A first cell block 1BLK and a second cell block 2BLK may be included in the memory cell region.

A lower structure including memory cell patterns and a lower insulating interlayer 102 constituting memory cells may be formed on the first and second cell blocks of the substrate 100.

First conductive layers 118 and a first capping layer 116 may be formed on the substrate 100 on which the lower structure is formed. The first conductive layers 118 may include a conductive material included in first to fourth wiring lines subsequently formed. In example embodiments, the first conductive layers 118 may be formed by sequentially depositing a polysilicon layer 110, a first barrier layer 112 and a first metal layer 114. The first capping layer 116 may include, e.g., silicon nitride.

A first etching mask may be formed on the first capping layer 116. The first etching mask may expose regions between regions where head hammer patterns are subsequently formed at edges of the first and second cell blocks. The first etching mask may selectively expose regions corresponding to first to fourth separation patterns subsequently formed.

The first capping layer 116 may be etched using the first etching mask, and then the first conductive layers 118 may be etched to form first to fourth openings 120, 122, 124 and 126 at the regions corresponding to the first to fourth separation patterns, respectively.

The first to fourth openings 120, 122, 124 and 126 may pass through the first capping layer 116 and the first conductive layer 118. For example, the lower insulating interlayer 102 may be exposed by a bottom surface of each of the first to fourth openings 120, 122, 124 and 126.

Each of the first to fourth openings 120, 122, 124 and 126 may have an isolated shape extending in the first direction. A longitudinal direction of each of the first to fourth openings 120, 122, 124 and 126 may be the first direction. The first to fourth openings 120, 122, 124 and 126 may have the same inner width in the second direction. The first to fourth openings 120, 122, 124 and 126 may have a third width W3. Therefore, patterning defects in processes for forming the first to fourth openings 120, 122, 124, and 126 may be decreased.

The first to fourth openings 120, 122, 124, and 126 may be formed by the same patterning processes. In this case, if the first to fourth openings 120, 122, 124, and 126 may have different inner widths patterning defects in the processes for forming the first to fourth openings 120, 122, 124, and 126 could easily occur.

Figure 9:
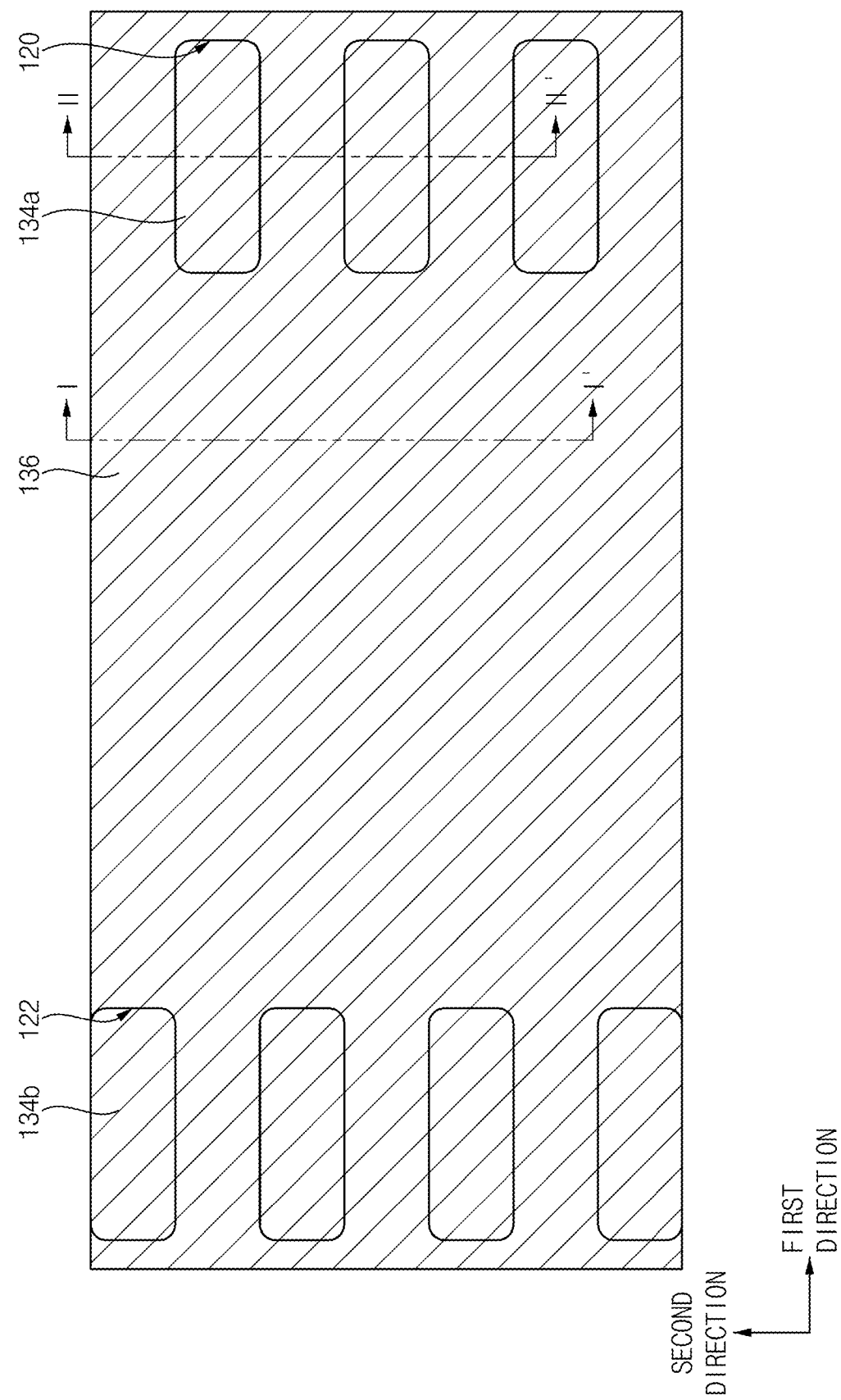
Figure 10:
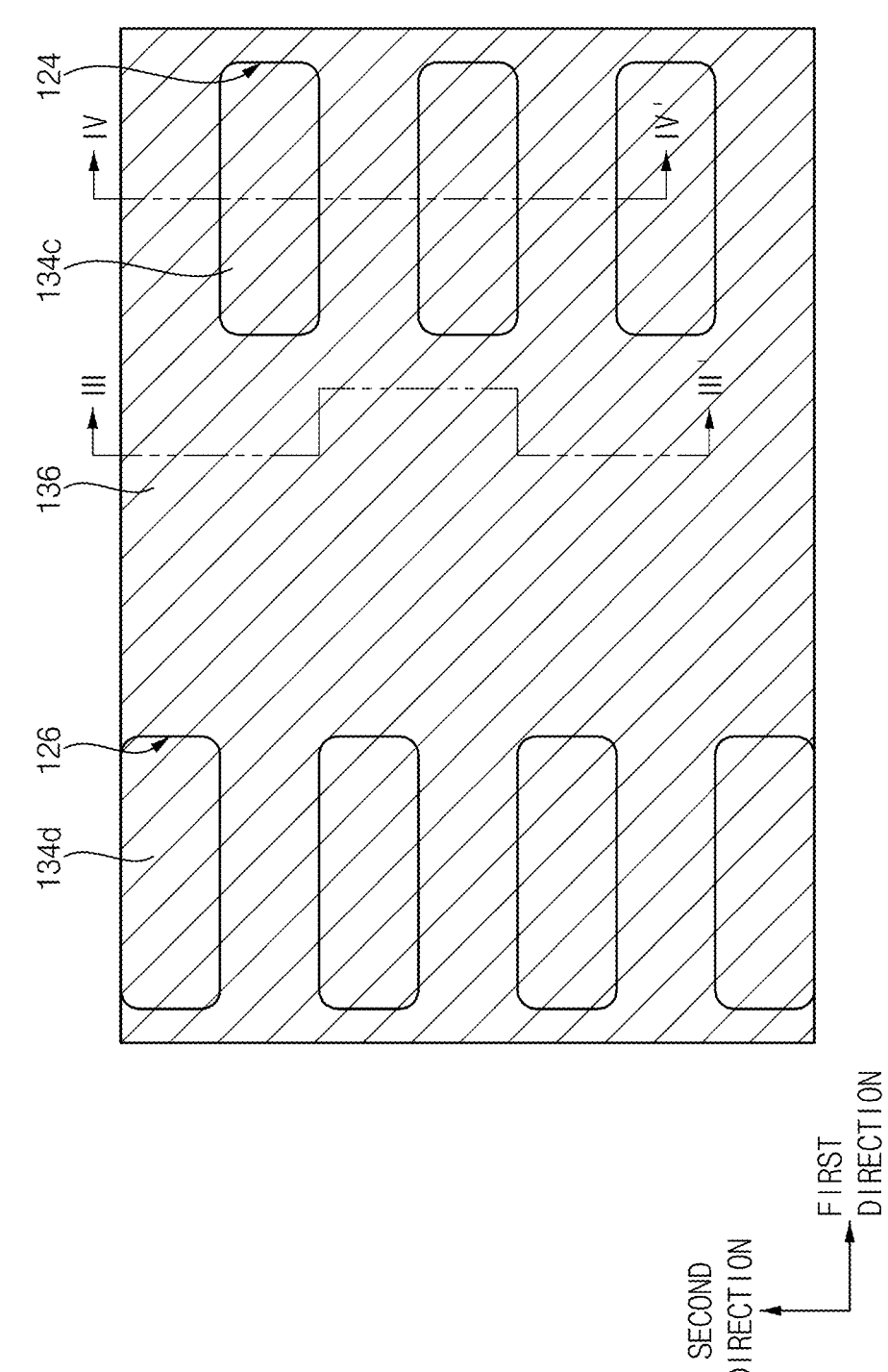
Figure 11:
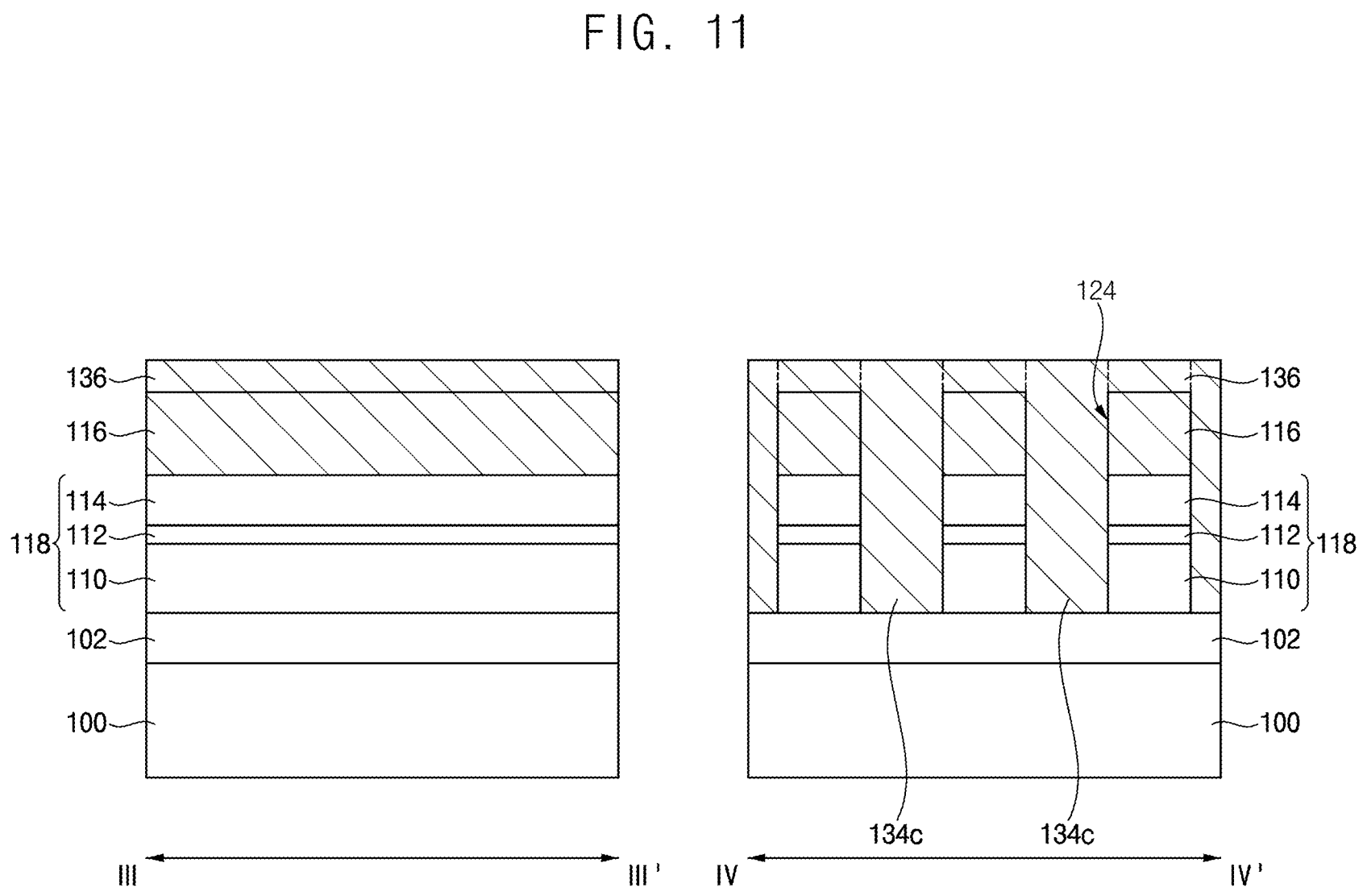

Referring to FIGS. 9 to 11, a separation layer may be formed on the first capping layer 116 to fill the first to fourth openings 120, 122, 124 and 126. The separation layer may include an insulation material, e.g., silicon nitride.

In example embodiments, the separation layer and the first capping layer 116 may be formed of the same material. In this case, the separation layer formed inside and on the first to fourth openings 120, 122, 124, and 126 may be referred to as first to fourth separation patterns 134*a*, 134*b*, 134*c*, and 134*d*, respectively. The separation layer formed on the first capping layer 116 other than the first to fourth openings 120, 122, 124 and 126 may be referred to as the second capping layer 136. The first and second capping layers 116 and 136 may be merged with each other, and may serve as a single capping layer.

In example embodiments, an upper surface of the separation layer may be planarized by a planarization process, after forming the separation layer.

In some example embodiments, the separation layer may include silicon oxide. In this case, the separation layer may be planarized until the separation layer remains only in the first to fourth openings 120, 122, 124 and 126 to form the first to fourth separation patterns 134*a*, 134*b*, 134*c* and 134*d*. Therefore, the second capping layer may not be formed.

Referring to FIGS. 12 to 16, a second etching mask may be formed on the second capping layer 136 and the first to fourth separation patterns 134*a*, 134*b*, 134*c* and 134*d*. The second etching mask on the first cell block may be an etching mask for forming first and second wiring lines, and the second etching mask on the second cell block may be an etching mask for forming third and fourth wiring lines. Accordingly, the second etching mask may selectively cover regions where the first to fourth line portions are subsequently formed.

The second etching mask may selectively expose regions between the first line portions and the second line portions in the first cell block and regions between the third and fourth line portions in the second cell block.

The second etching mask may include openings extending in the first direction and exposing the regions between the first and second line portions, and openings extending in the first direction and exposing the regions between the third and fourth line portions. Each of ends of the openings in the first direction may overlap one of the first to fourth separation patterns 134*a*, 134*b*, 134*c* and 134*d*. Each of the ends of the openings in the first direction may correspond to a connection portion between the line portion and the head hammer pattern. In addition, the second etching mask may expose edges of the first and second cell blocks, such that outer sides of the head hammer patterns in the first direction may be formed in each of cell blocks.

Figure 12:
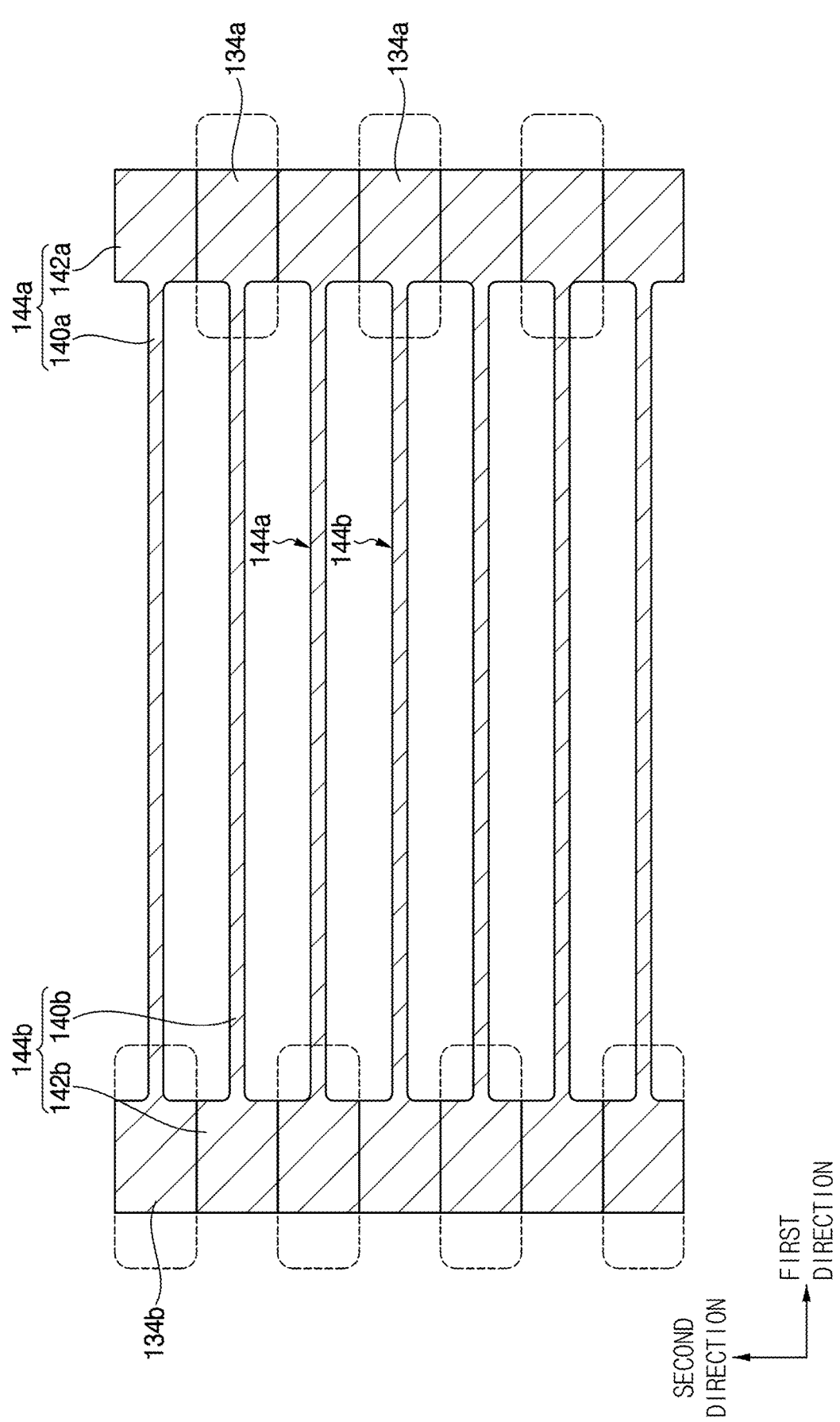
Figure 13:
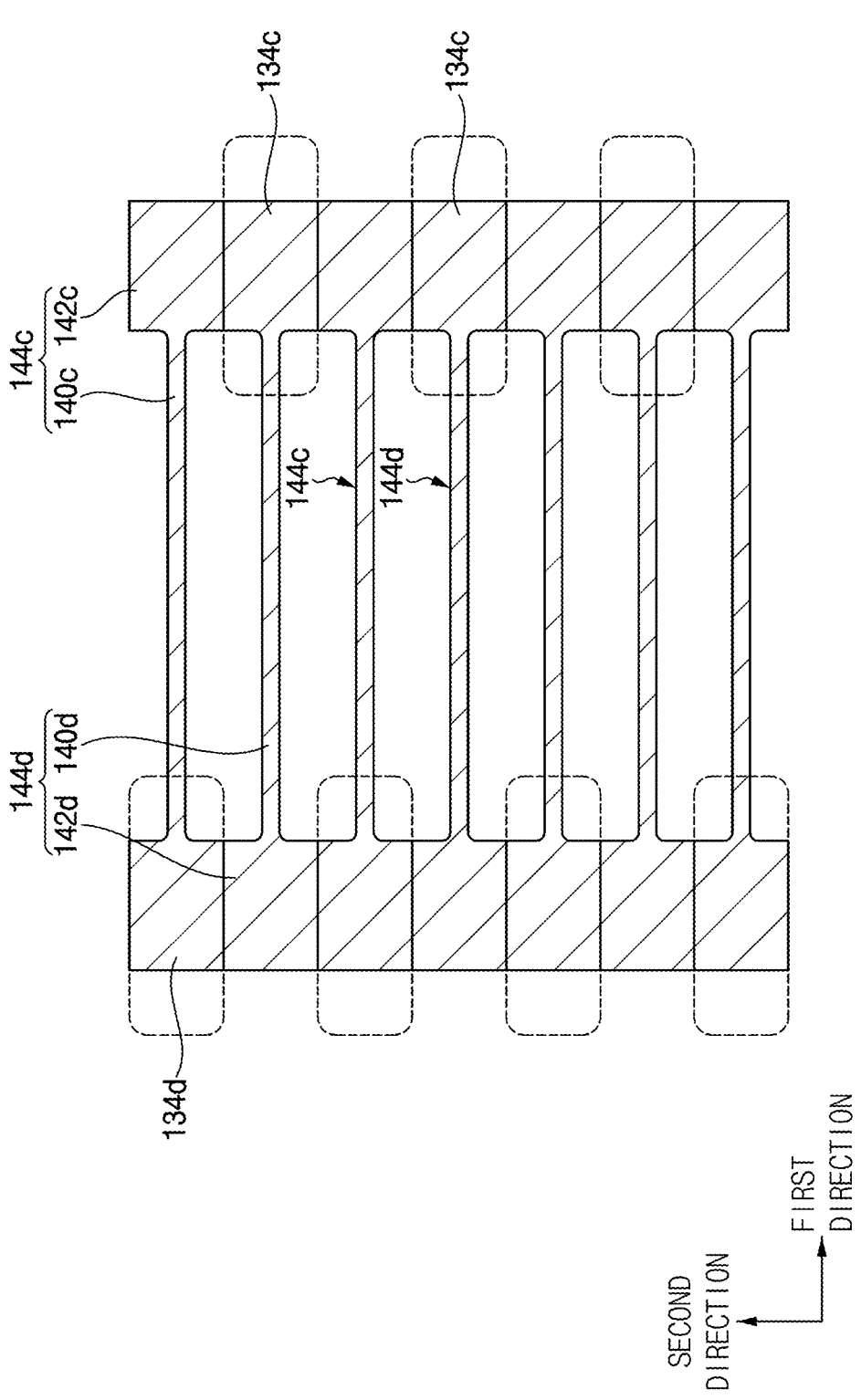
Figure 14:
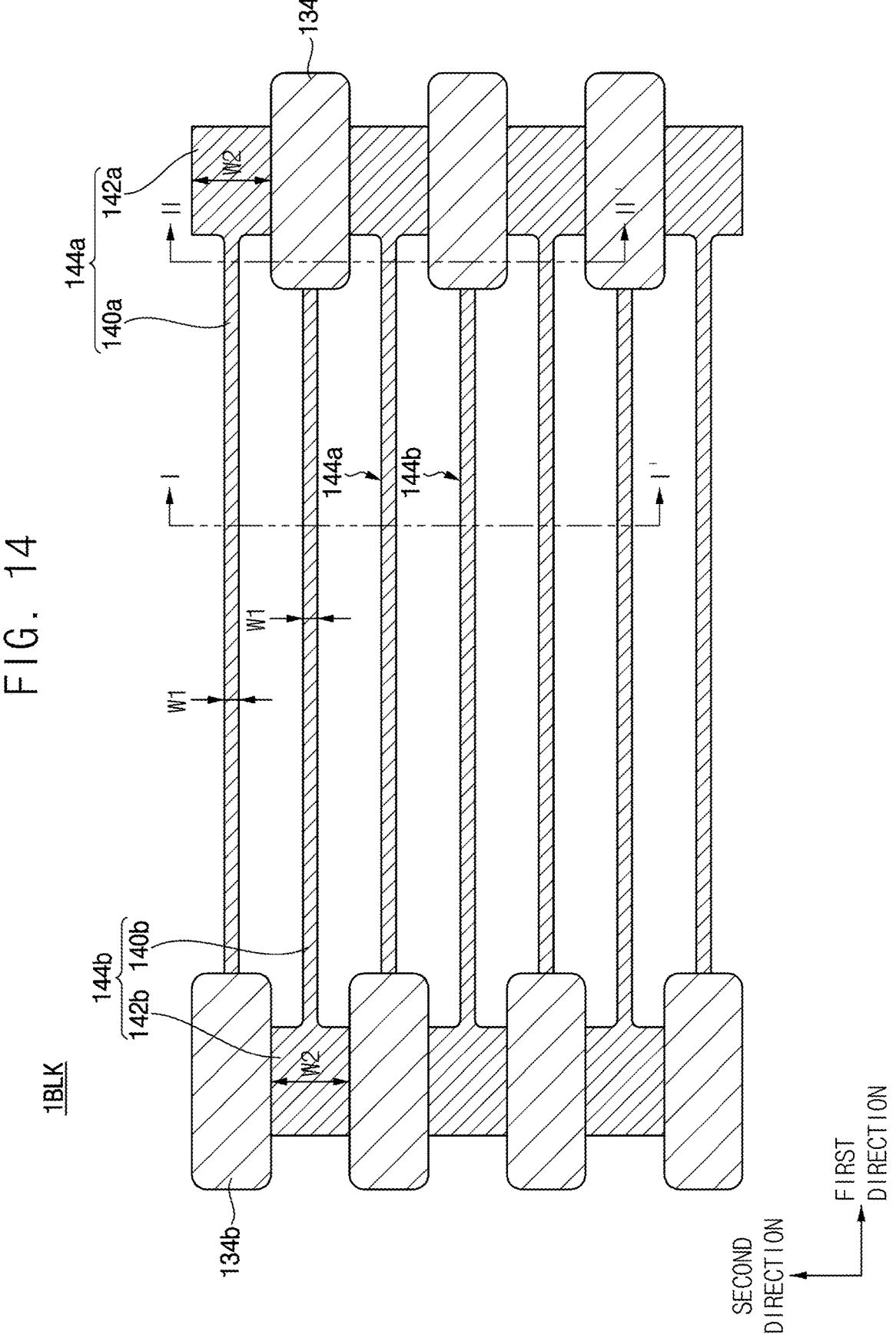
Figure 15:
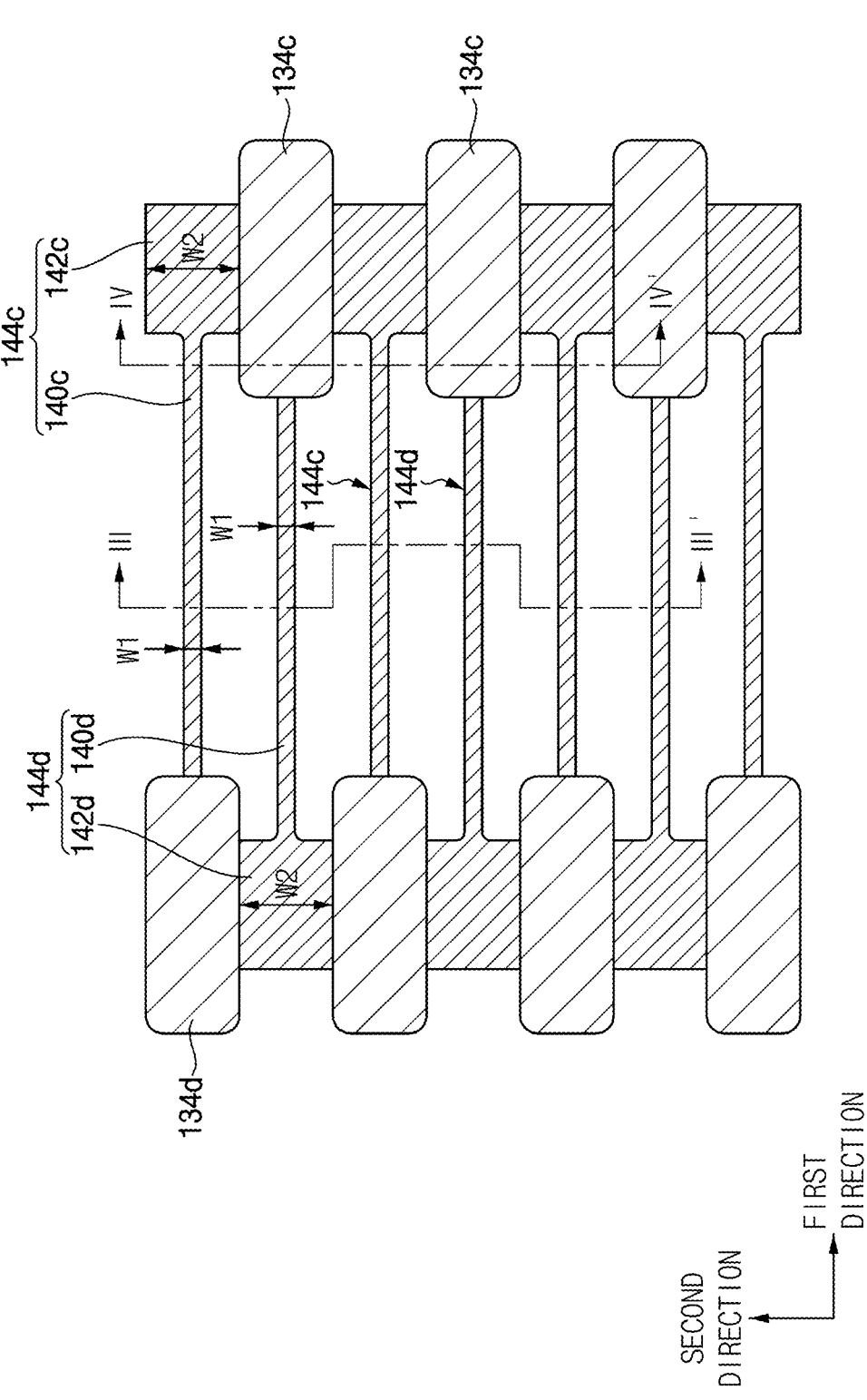
Figure 16:
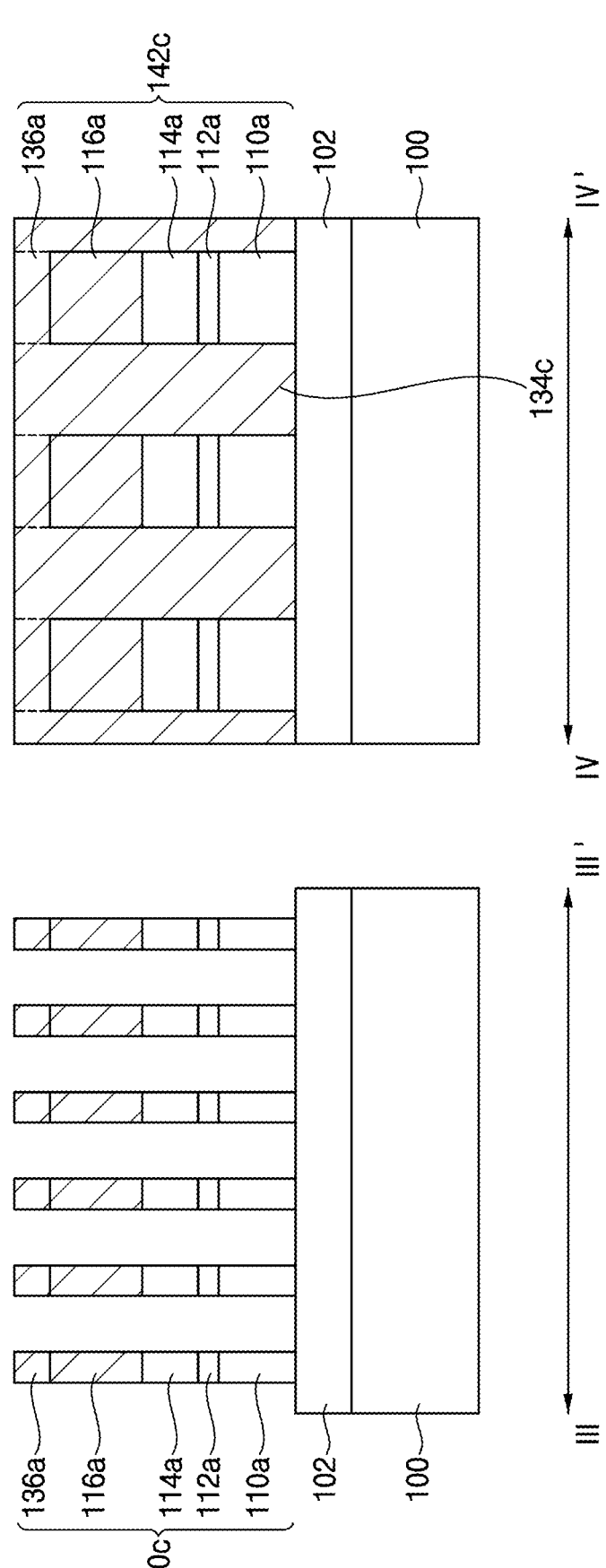
Figure 17:
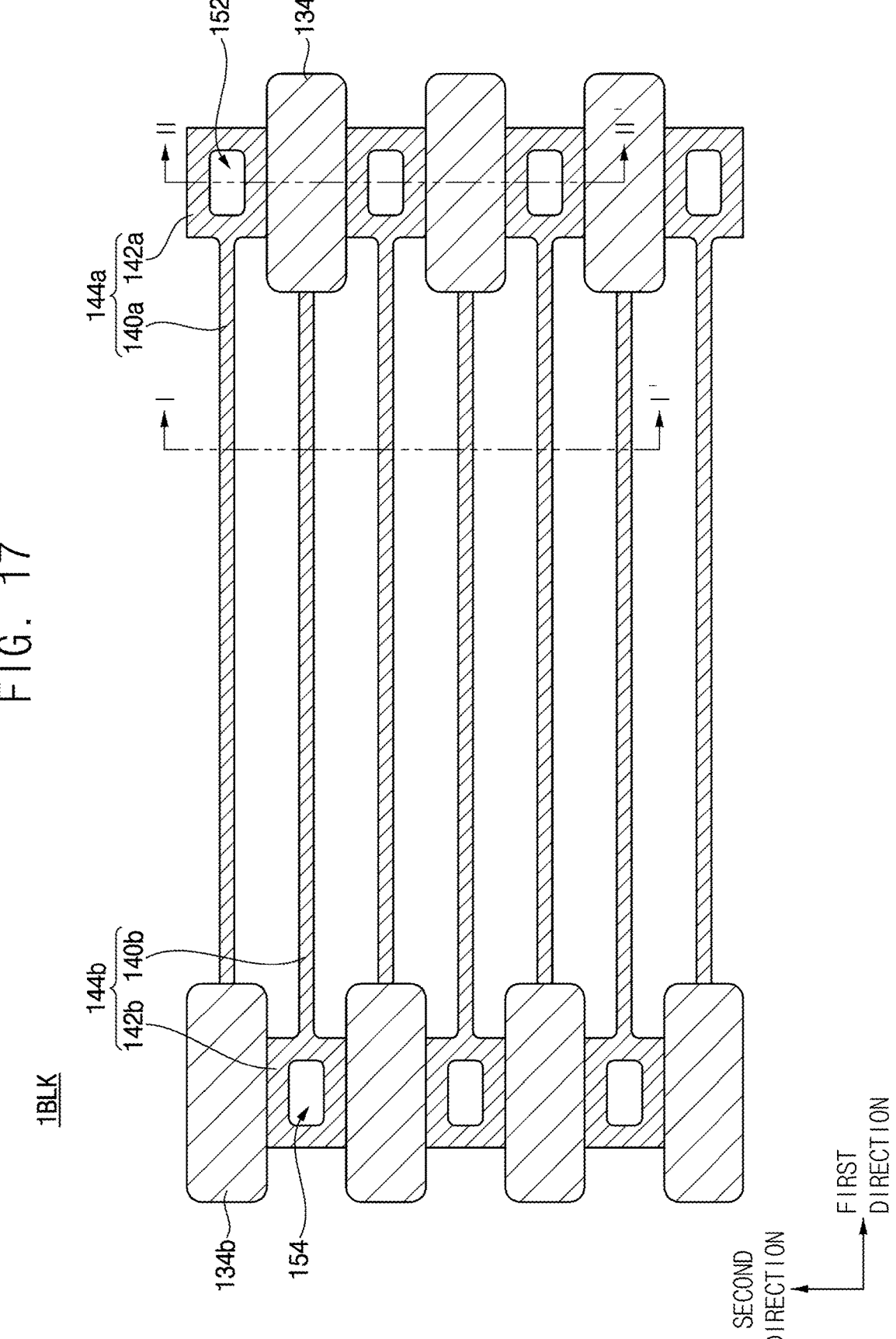

The second capping layer 136 and the first capping layer 116 may be etched using the second etching mask to form a first capping pattern 116a and a second capping pattern 136a. When the first to fourth separation patterns are formed of the same silicon nitride as the first capping pattern, as shown in FIGS. 12 and 13, upper portions of the first to fourth separation patterns 134a, 134b, 134c, and 134d exposed by the second etching mask may be partially etched in the etching process.

Thereafter, the first conductive layers 118 may be etched using the first and second capping patterns 116a and 136a as an etching mask. In example embodiments, a first conductive pattern in which the polysilicon pattern 110a, the first barrier metal pattern 112a, and the first metal pattern 114a are stacked may be formed on the lower insulating interlayer 102 in the etching process. The stacked structure including the polysilicon pattern 110a, the first barrier metal pattern 112a, the first metal pattern 114a, and the first and second capping patterns 116a and 136a may serve as first to fourth wiring lines 144a, 144b, 144c and 144d extending in the first direction.

In the etching of the first conductive layers 118, the first to fourth separation patterns 134a, 134b, 134c, and 134d may not be etched. For example, the first to fourth separation patterns 134a, 134b, 134c, and 134d positioned under an upper surface of the first conductive pattern may not be etched.

Therefore, in the plan view (i.e., FIGS. 14 and 15) shown when a level of the first metal pattern 114a is cut in the horizontal direction, the first to fourth separation patterns 134a, 134b, 134c, and 134d may be formed in the first to fourth openings 120, 122, 124 and 126, respectively, without an etched portion.

The first conductive pattern may serve as an actual wiring line, and the first and second capping patterns 116a and 136a may serve as protective layers. When the first and second capping patterns 116a and 136a and the first to fourth separation patterns 134a, 134b, 134c, and 134d include the same material, the first and second capping patterns 116a and 136a and the first to fourth separation patterns 134a, 134b, 134c, and 134d may not be distinguishable from each other in the plan view. Therefore, plan views for the following description are shown when the level of the first metal pattern 114a is cut in the horizontal direction.

The first wiring line 144a and the second wiring line 144b may be alternately and repeatedly disposed on the first cell block. The third wiring line 144c and the fourth wiring line 144d may be alternately and repeatedly disposed on the second cell block.

The first wiring line 144a may include a first line portion 140a having a first width W1 in the second direction and a first head hammer pattern 142a connected to a right end of the first line portion 140a in the first direction and having a second width W2 in the second direction greater than the width W1.

The second wiring line 144b may include a second line portion 140b having the first width W1 in the second direction and a second head hammer pattern 142b connected to a left end of the second line portion 140b in the first direction and having the second width W2 in the second direction.

The third wiring line 144c may include a third line portion 140c having the first width W1 in the second direction and a third head hammer pattern 142c connected to a right end of the third line portion 140c in the first direction and having the second width W2 in the second direction. In example embodiments, the third head hammer pattern 142c may have a shape the same as a shape of the first head hammer pattern 142a, and may have a stacked structure the same as a stacked structure of the first head hammer pattern 142a.

The fourth wiring line 144d may include a fourth line portion 140d having the first width W1 in the second direction and a fourth head hammer pattern 142d connected to a left end of the fourth line portion 140d in the first direction and having the second width W2 in the second direction. In example embodiments, the fourth head hammer pattern 142d may have a shape the same as a shape of the second head hammer pattern 142b, and may have a stacked structure that is the same as a stacked structure of the second head hammer pattern 142b.

Before the etching process using the second etching mask, the first to fourth separation patterns 134a, 134b, 134c, and 134d may be formed in advance. Therefore, after the etching process, the first separation pattern 134a may be positioned between the first head hammer patterns 142a in the second direction, the second separation pattern 134b may be positioned between the second head hammer patterns 142b in the second direction, a third separation pattern 134c may be positioned between the third head hammer patterns 142c in the second direction, and a fourth separation pattern 134d may be positioned between the fourth head hammer patterns 142d in the second directions.

A left end of the first line portion 140a in the first direction may contact the second separation pattern 134b. A right end of the second line portion 140b in the first direction may contact the first separation pattern 134a. A left end of the third line portion 140c in the first direction may contact the fourth separation pattern 134d. A right end of the fourth line portion 140d in the first direction may contact the third separation pattern 134c.

In some example embodiments, the third separation pattern 134c and the fourth separation pattern 134d may be disposed to face with each other in the first direction. In this case, as shown in FIG. 5, the third and fourth head hammer patterns 142c and 142d may be formed at both ends of the third line portion 140c, respectively.

Referring to FIGS. 17 to 20, a first insulating interlayer may be formed on the first to fourth wiring lines 144a, 144b, 144c, and 144d to fill spaces between the first to fourth wiring lines 144a, 144b, 144c, and 144d. The first insulating interlayer 150 may cover the first to fourth wiring lines 144a, 144b, 144c, and 144d.

A portion of the first insulating interlayer 150 may be etched, and the first and second capping patterns 116a and 136a in the first to fourth wiring lines 144a, 144b, 144c, and 144d may be etched to form a first to fourth contact holes 152, 154, 156, and 158.

The first contact hole 152 may pass through the first insulating interlayer 150 and the first and second capping patterns 116a and 136a of the first head hammer pattern 142a to expose the first metal pattern 114a.

The second contact hole 154 may pass through the first insulating interlayer 150 and the first and second capping patterns 116a and 136a of the second head hammer pattern 142b to expose the first metal pattern 114a.

First and second capping patterns 116a and 136a included in a pair of neighboring third and fourth line portions 140c and 140d, and the first insulating interlayer 150 between neighboring third and fourth line portions 140c and 140d may be etched to form the third contact hole 156. A bottom surface of the third contact hole 156 may be higher than a bottom surface of each of the third and fourth wiring lines 144*c* and 144*d*. The first metal patterns 114*a* and the first insulating interlayer 150 therebetween may be exposed by the bottom surface of the third contact hole 156. The third contact hole 156 may not be formed on the third head hammer pattern. Accordingly, an entire upper surface of the third head hammer pattern 142*c* may contact the first insulating interlayer 150 including an insulation material.

The fourth contact hole 158 may pass through the first and second capping patterns 116*a* and 136*a* of the fourth head hammer pattern 142*d* to expose the first metal pattern 114*a*.

Figure 22:
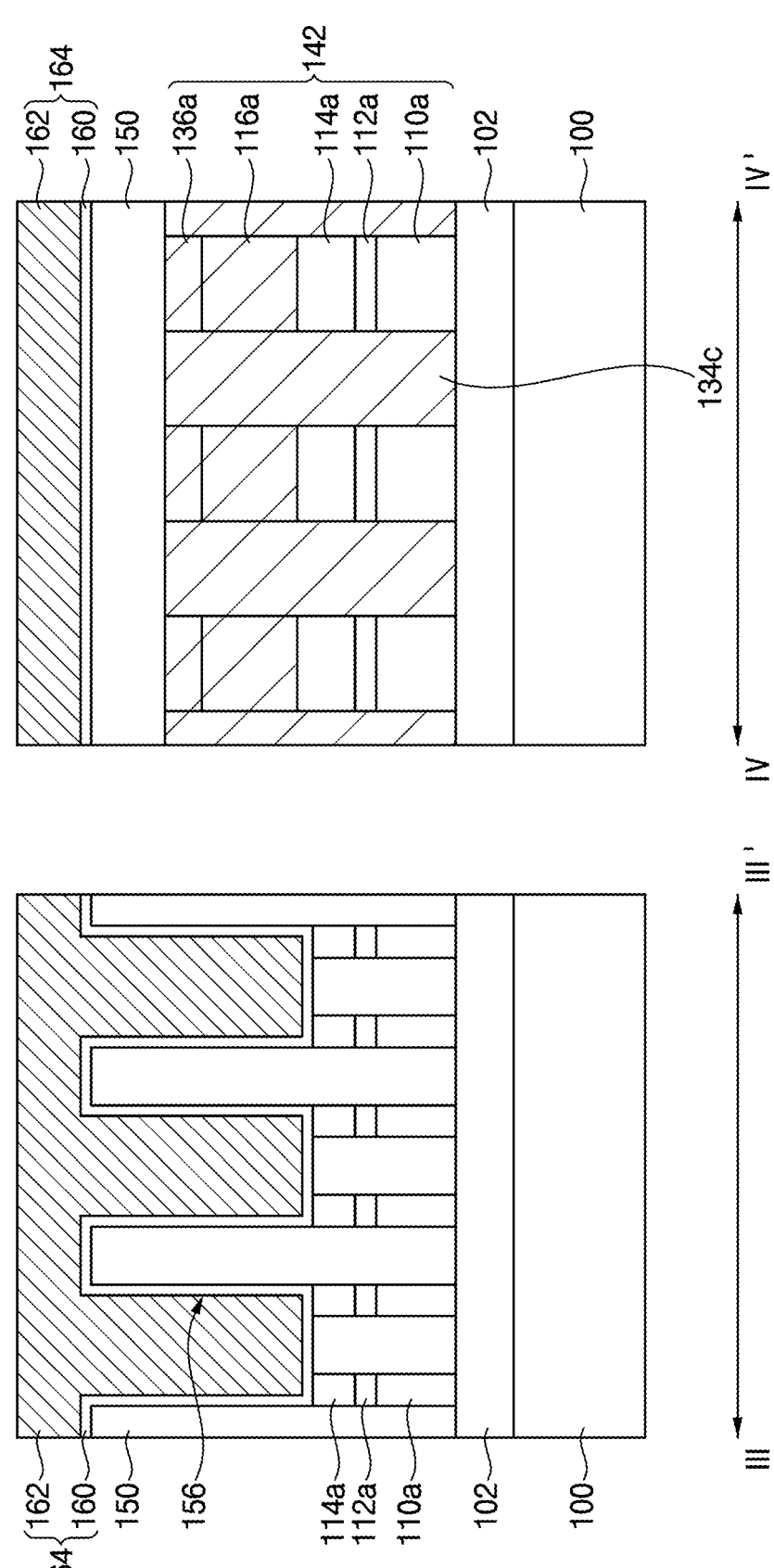
Figure 23:
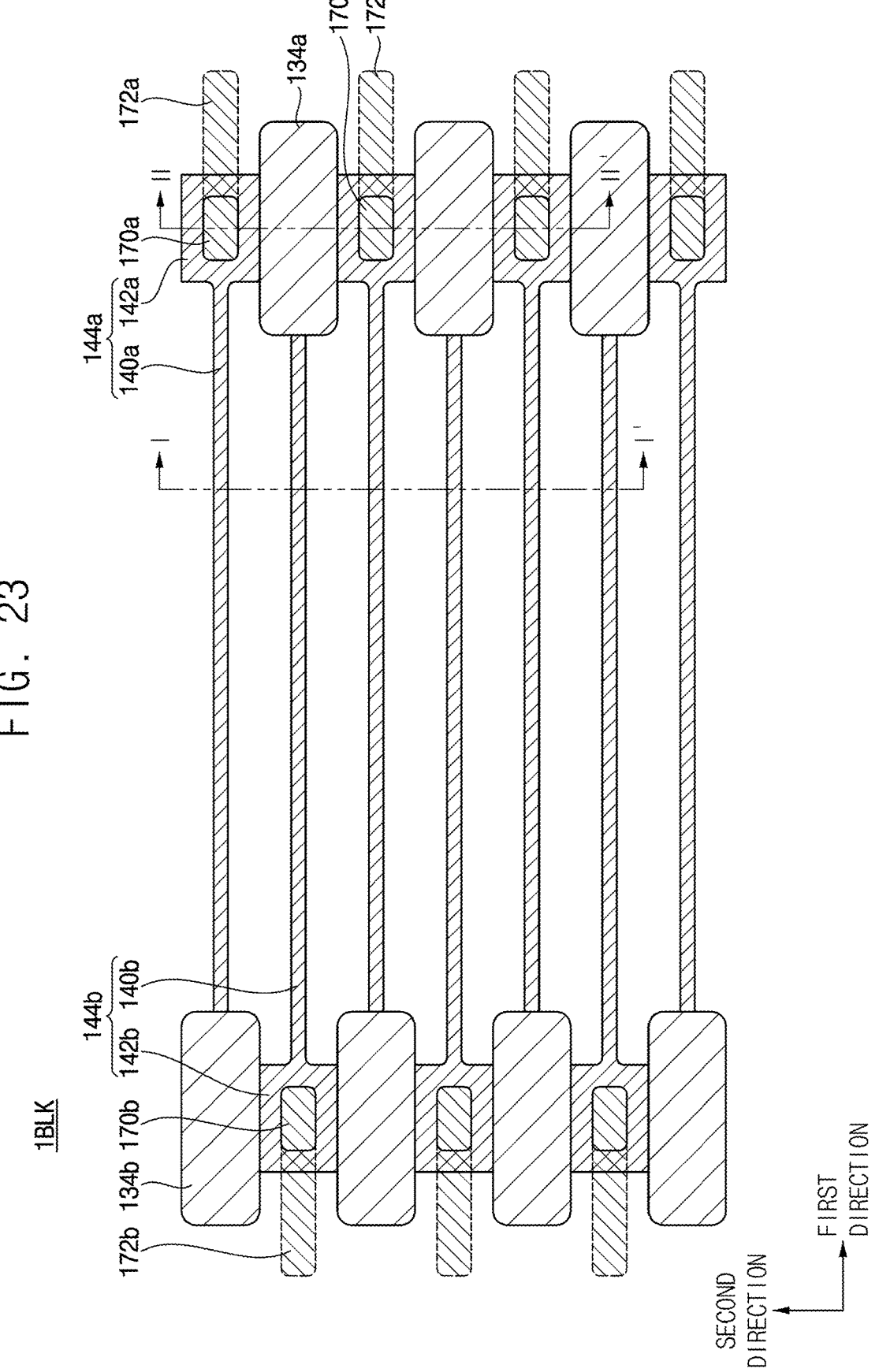
Figure 24:
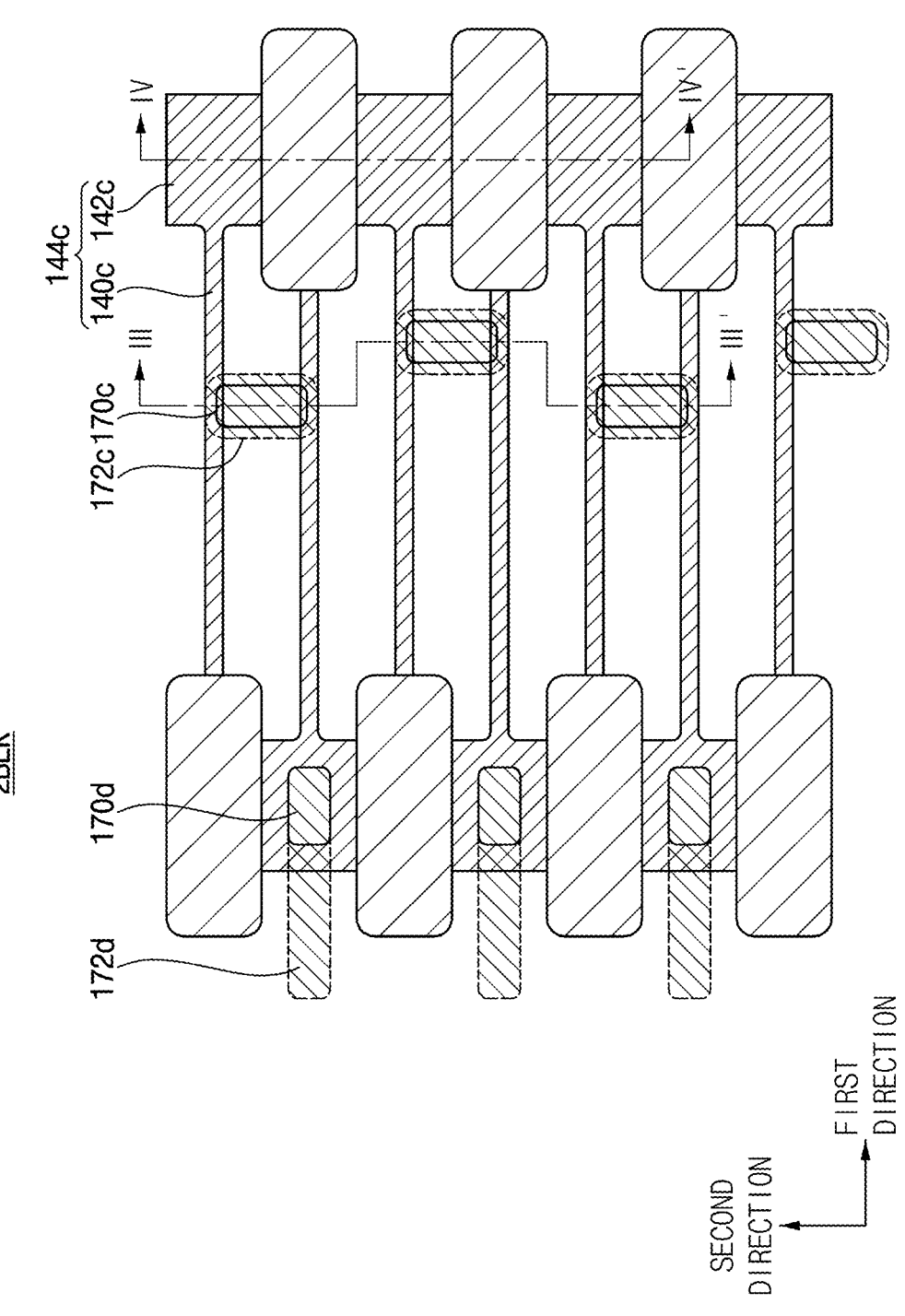

Referring to FIGS. 21 and 22, a second conductive layer 164 may be formed on the first insulating interlayer 150 to fill the first to fourth contact holes 152, 154, 156, and 158.

In example embodiments, the second conductive layer 164 may include a second barrier layer 160 and a second metal layer 162. The second barrier layer 160 may include metal or metal nitride, e.g., titanium, titanium nitride, tantalum, tantalum nitride, or tungsten nitride. The second metal layer 162 may include, e.g., tungsten or aluminum. In some example embodiments, the second conductive layer 164 may include polysilicon. However, a stack structure and a material of the second conductive layer 164 may not be limited thereto.

Referring to FIGS. 23 to 26, the second conductive layer 164 may be patterned to form first to fourth contact plugs 170*a*, 170*b*, 170*c*, and 170*d* and first to third upper wirings 172*a*, 172*b* and 172*d*, and a capping conductive pattern 172*c*, respectively.

In example embodiments, the first to fourth contact plugs 170*a*, 170*b*, 170*c* and 170*d*, the first to third upper wirings 172*a*, 172*b*, and 172*d*, and the capping conductive pattern 172*c* may be formed by the same patterning process.

In particular, the first contact plug 170*a* may be formed in the first contact hole 152, and a first upper wiring 172*a* may be formed on the first contact plug 170*a* and the first insulating interlayer 150. The second contact plug 170*b* may be formed in the second contact hole 154, and the second upper wiring 172*b* may be formed on the second contact plug 170*b* and the first insulating interlayer 150. The third contact plug 170*c* may be formed in the third contact hole 156, and a capping conductive pattern 172*c* may be formed on the third contact plug 170*c* and the first insulating interlayer 150. The fourth contact plug 170*d* may be formed in the fourth contact hole 158, and the third upper wiring 172*d* may be formed on the fourth contact plug 170*d* and the first insulating interlayer 150. A contact plug and an upper wiring may not be formed on the third head hammer pattern 142*c*. Accordingly, an entire upper surface of the third head hammer pattern 142*c* may contact an insulation material.

In some example embodiments, after forming the first to fourth contact plugs 170*a*, 170*b*, 170*c* and 170*d* and the first to third upper wirings 172*a*, 172*b*, and 172*d*, the capping conductive pattern 172*c* may be formed on the first to fourth contact plugs 170*a*, 170*b*, 170*c*, and 170*d* and on the first insulating interlayer 150. In this case, a deposition process and a planarization process may be performed to form the first to fourth contact plugs 170*a*, 170*b*, 170*c* and 170*d*. Then, a deposition process and a patterning process may be performed to form the first to third upper wirings 172*a*, 172*b*, and 172*d*, and the capping conductive pattern 172*c*.

As described above, a semiconductor device including the first to fourth wiring lines may be manufactured.

According to the above process, the first wiring line 144*a* including the first head hammer pattern 142*a* at the right end thereof and the second wiring line 1441*b* including the second head hammer pattern 142*b* at the left end thereof may be formed on the first cell block. The first and second wiring lines 144*a* and 144*b* may not be electrically connected to each other.

The third wiring line 144*c* including the third head hammer pattern 142*c* at a right end thereof and the fourth wiring line 144*d* including the fourth head hammer pattern 142*d* at a left end thereof may be formed on the second cell block. The third and fourth wiring lines 144*a* and 144*b* may be spaced apart from each other, and ends of the third and fourth wiring lines 144*a* and 144*b* may not be directly connected.

The first to fourth separation patterns 134*a*, 134*b*, 134*c* and 134*d* may be formed between first to fourth head hammer patterns, respectively, and the first to fourth separation patterns 134*a*, 134*b*, 134*c* and 134*d* may have the same width, e.g., the third width W3 in the second direction. Accordingly, a patterning process for forming the first to fourth separation patterns 134*a*, 134*b*, 134*c* and 134*d* may be easily performed.

The pair of neighboring third and fourth wiring lines 144*c* and 144*d* may be electrically connected to each other by the third contact plug 170*c*. The third contact plug may be formed at a region adjacent to one end of the third and fourth wiring lines 144*c* and 144*d*. Accordingly, the pair of neighboring third and fourth wiring lines 144*c* and 144*d* may function as one folded wiring line. The pair of neighboring third and fourth wiring lines 144*c* and 144*d* may have one folded wiring structure, and thus an effective length of the folded wiring structure may be increased.

If ends of the third and fourth wiring lines were to be directly connected to each other without a contact plug, a separation pattern could be disposed between connection portions of the third and fourth wiring lines. In this case, a width in the second direction of the separation pattern could be very narrow.

If the separation pattern is not formed at an exact position, the third and fourth wiring lines might not be connected, and might be disconnected.

However, according to the present embodiment, ends of the third and fourth wiring lines 144*c* and 144*d* may not be directly connected to each other. Instead, the third and fourth wiring lines 144*c* and 144*d* may be electrically connected by the third contact plug 170*c*. Therefore, a disconnection (i.e., an open defect) between the third and fourth wiring lines 144*c* and 144*d* due to a misalignment of the third separation pattern 134*c* may be avoided.

The first and second wiring lines 144*a* and 144*b* may be used for various wirings including a pad pattern at one end thereof. The third and fourth wiring lines 144*c* and 144*d* may be used for various wirings having a folded wiring structure and may function as one wiring line.

The first to fourth wiring lines 144*a*, 144*b*, 144*c*, and 144*d* may be used as a bit line structure of a DRAM device. Hereinafter, wiring lines of the DRAM device may be described.

Figure 27:
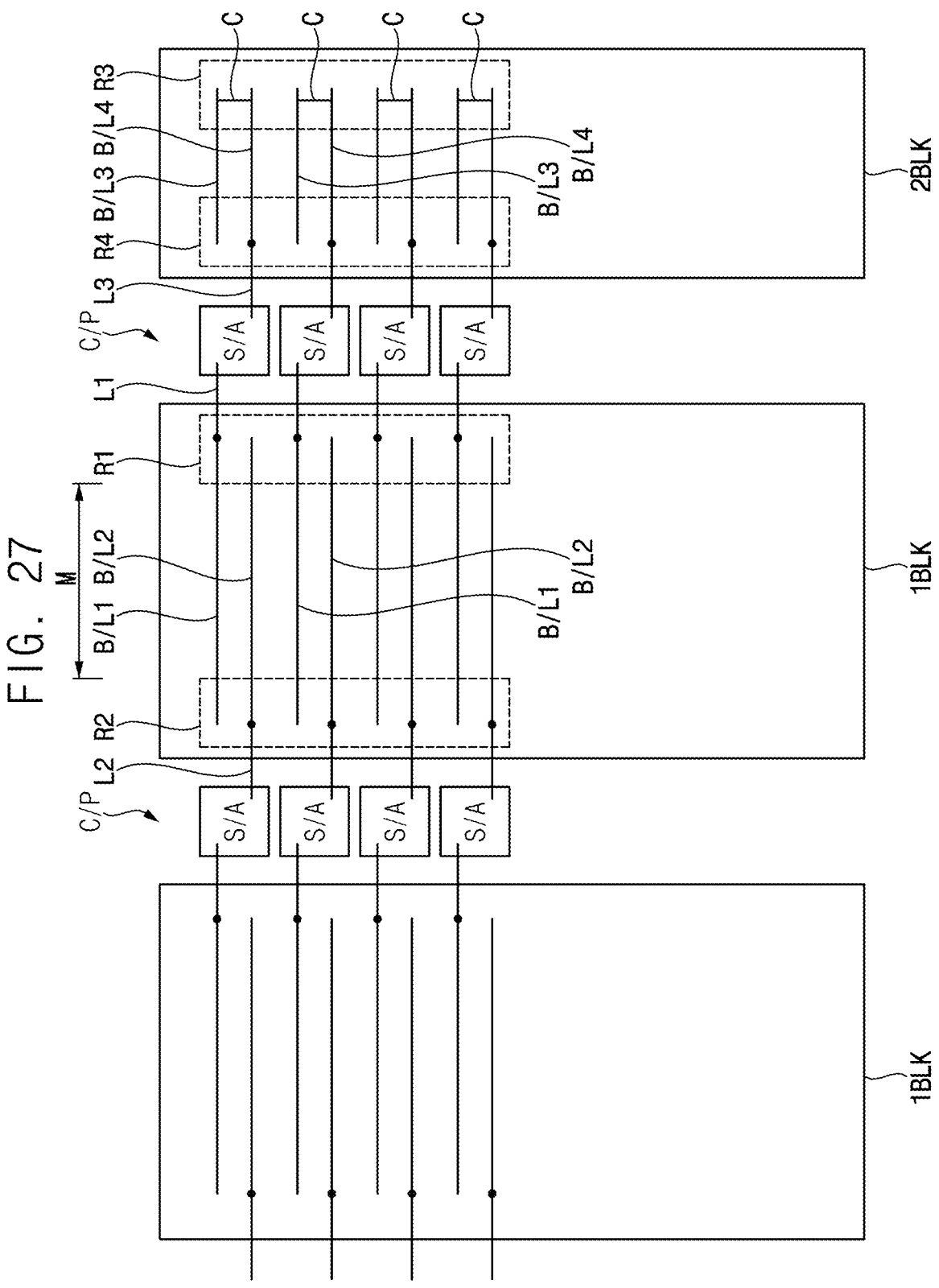
FIG. 27 is a block diagram illustrating connection of bit lines and sense amplifiers in each of cell blocks of a DRAM device.

FIG. 27 is a block diagram illustrating the connection of bit lines and sense amplifiers in each of the cell blocks of a DRAM device.

Referring to FIG. 27, in a case of an open bit line structure, a complementary pair of two bit lines (i.e., a bit line and a bit line bar) may be formed on different cell blocks. The complementary pair of two bit lines may have a schematic structure spread on both sides of a sense amplifier (S/A).

The substrate may include cell blocks 1BLK and 2BLK and core/peripheral regions C/P disposed between the cell blocks 1BLK and 2BLK. Memory cells may be formed on the cell blocks 1BLK and 2BLK, and peripheral circuits, e.g., sense amplifiers may be disposed on the core peripheral region C/P.

Each of the first and second cell blocks 1BLK and 2BLK may include a main region M in which main cells are formed and boundary regions R1, R2, R3 and R4 corresponding to edge regions of each of cell blocks 1BLK and 2BLK. The edge regions adjacent to both sides of the main region in the first cell block may be referred to as first and second boundary regions R1 and R2, respectively. The edge regions adjacent to both sides of the main region in the second cell block may be referred to as third and fourth boundary regions R3 and R4, respectively.

In a general cell block (i.e., a first cell block, 1BLK), upper wirings L1 and L2 connected to the sense amplifiers may be disposed at only one end of each of bit lines. Other ends of each of the bit lines may be floating without a connected portion. For example, odd-numbered bit lines B/L1 may be connected to the first contact plug and the first upper wiring L1 at right ends of the odd-numbered bit lines B/L1, and even-numbered bit lines B/L2 may be connected to the second contact plugs and the second upper wiring L2 at the left ends of the even-numbered bit lines B/L2.

A head hammer pattern having a width greater than a width of the bit line may be formed at one end of the bit lines B/L1 and B/L2 for connecting the upper wirings L1 and L2. The head hammer pattern may serve as a pad pattern on which contact plugs connected to the upper wirings L1 and L2 may be formed.

In example embodiments, the bit lines B/L1 and B/L2 formed on the first cell block 1BLK may have structures substantially the same as the structures o the first and second wiring lines 144a and 144b described with reference to FIGS. 1 to 4, respectively. The first and second contact plugs formed on the first cell block may have structures that are the same as the structures of first and second contact plugs 170a and 170b as described with reference to FIGS. 1 to 4, respectively. The first and second upper wirings formed on the first cell block may have structures the same as structures of the first and second upper wirings 172a and 172b described with reference to FIGS. 1 to 4, respectively.

In a case of a last cell block (i.e., the second cell block, 2BLK) without a neighboring cell block, ends of a pair of neighboring odd and even row bit lines B/L3 and B/L4 may be electrically connected with each other. Therefore, the pair of neighboring odd and even row bit lines B/L3 and B/L4 may have a folded wiring structure, and may function as one bit line. A length of the second cell block B/L2 may be decreased, and a dummy cell block may not be needed.

In the second cell block B/L2, the pair of the neighboring bit lines B/L3 and B/L4 may be electrically connected by a third contact plug C adjacent one end of each of the neighboring bit lines B/L3 and B/L4. In addition, the fourth contact plug and the third upper wiring L3 may be disposed at the other end of one of the pair of the bit lines B/L3 and B/L4.

For example, the third contact plug C connecting the pair of bit lines B/L3 and B/L4 may be adjacent to the right ends of the pair of bit lines B/L3 and B/L4. In addition, the fourth contact plug and the third upper wiring L3 may be connected to a left end of one of the pair of bit lines B/L3 and B/L4. A head hammer pattern having a width greater than a width of the bit line may be formed at the left end of one of the pair of bit lines B/L3 and B/L4. A head hammer pattern having a width greater than the width of the bit line may be formed at a right end of other one of the pair of bit lines B/L3 and B/L4.

In example embodiments, the bit lines B/L3 and B/L4 formed on the second cell block 2BLK may have structures that are the same as structures of the third and fourth wiring lines 144c and 144d as described with reference to FIGS. 1 to 4. In some example embodiments, the bit lines B/L3 and B/L4 formed on the second cell block 2BLK may have structures that are the same as structures of the third and fourth wiring lines 145c and 145d as described with reference to FIG. 5.

In example embodiments, the third contact plug C formed on the second cell block 2BLK may be a structure that is the same as a structure of the third contact plug 170c described with reference to FIGS. 1 to 4. In example embodiments, the fourth contact plug formed on the second cell block 2BLK may have a structure that is the same as a structure of the fourth contact plug 170d described with reference to FIGS. 1 to 4. The third upper wiring formed on the second cell block 2BLK may have a structure that is the same as a structure of the third upper wiring 172d as described with reference to FIGS. 1 to 4.

Figure 28:
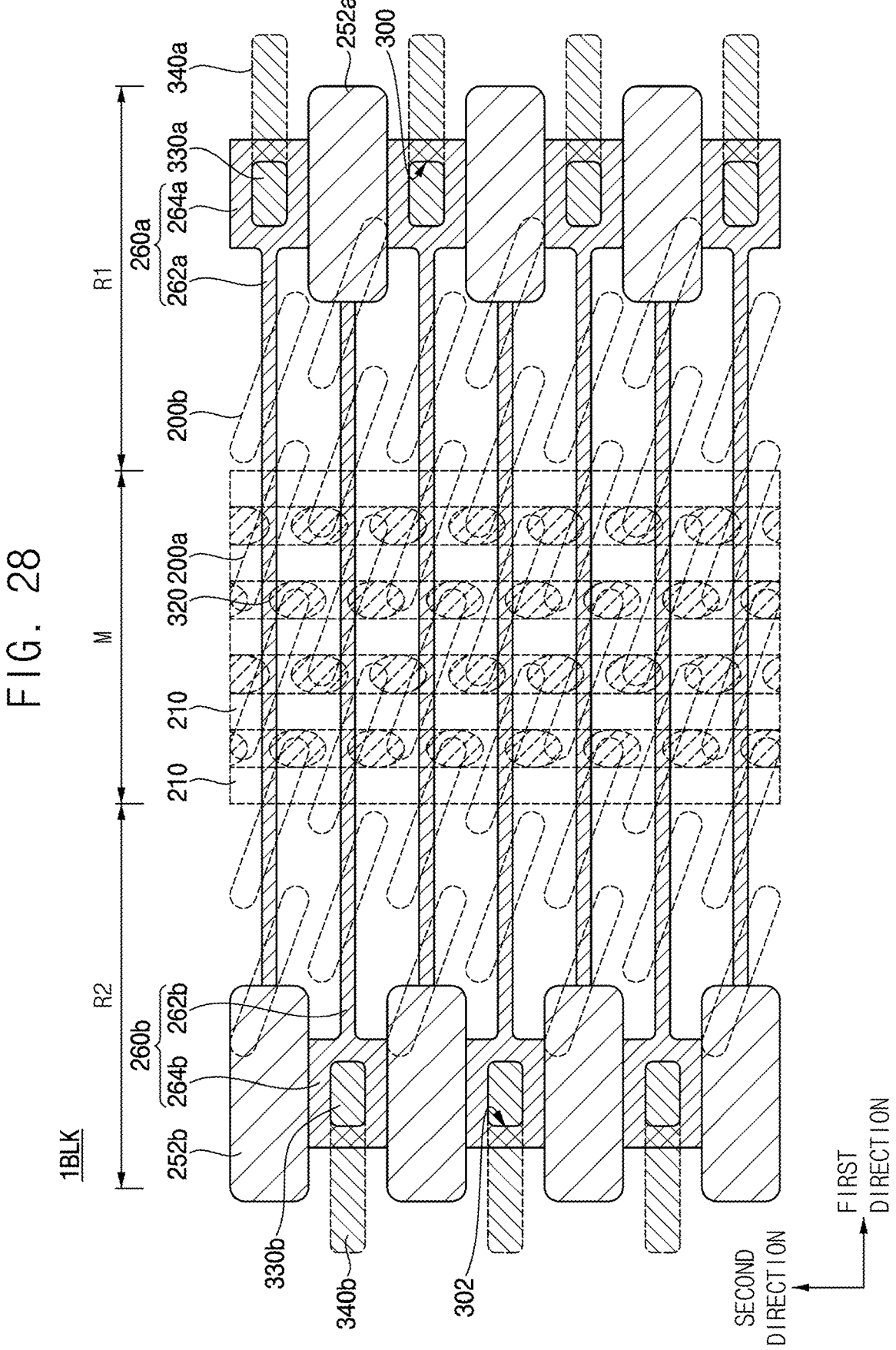
FIGS. 28 and 29 are plan views illustrating DRAM devices according to example embodiments.
Figure 29:
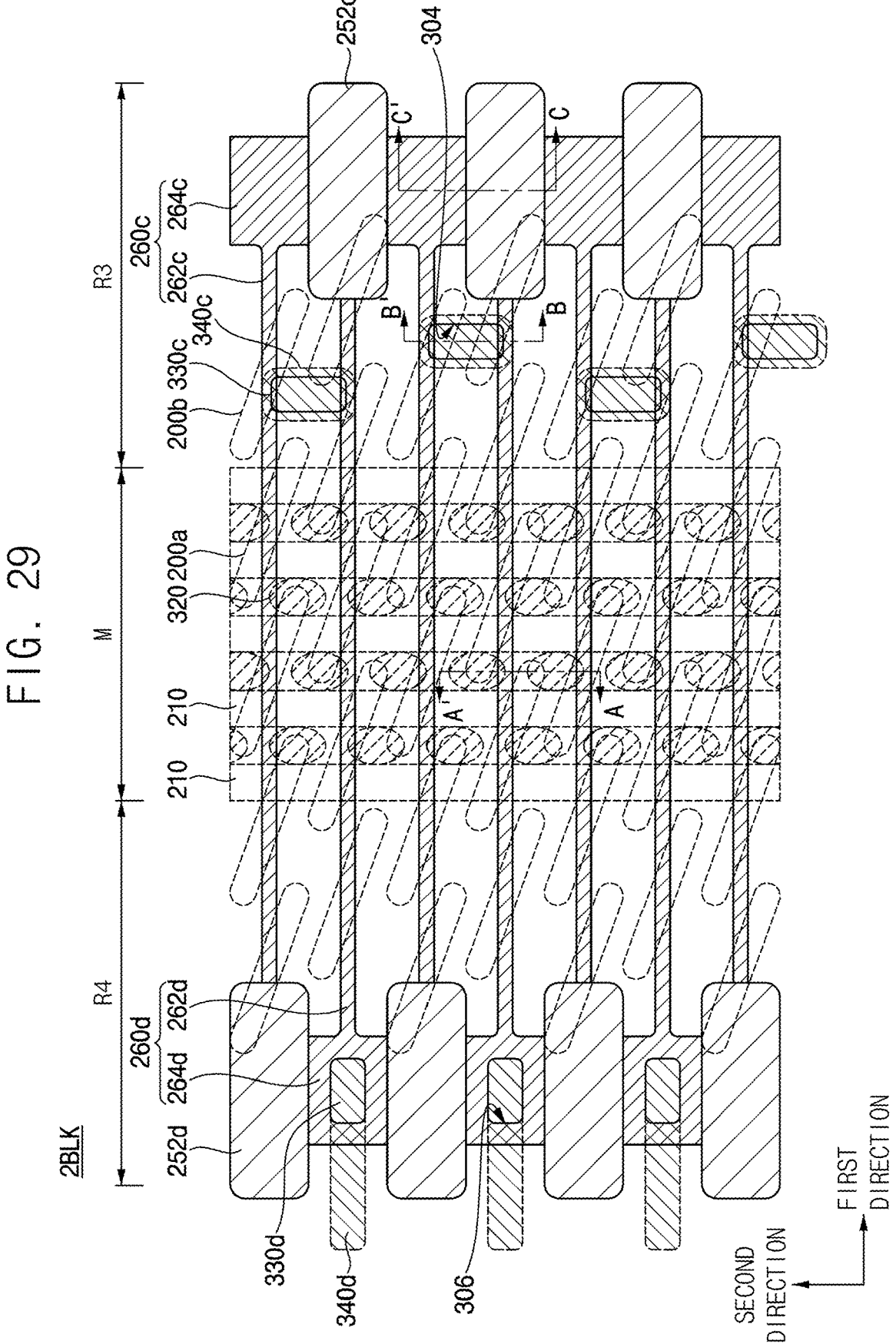
Figure 30:
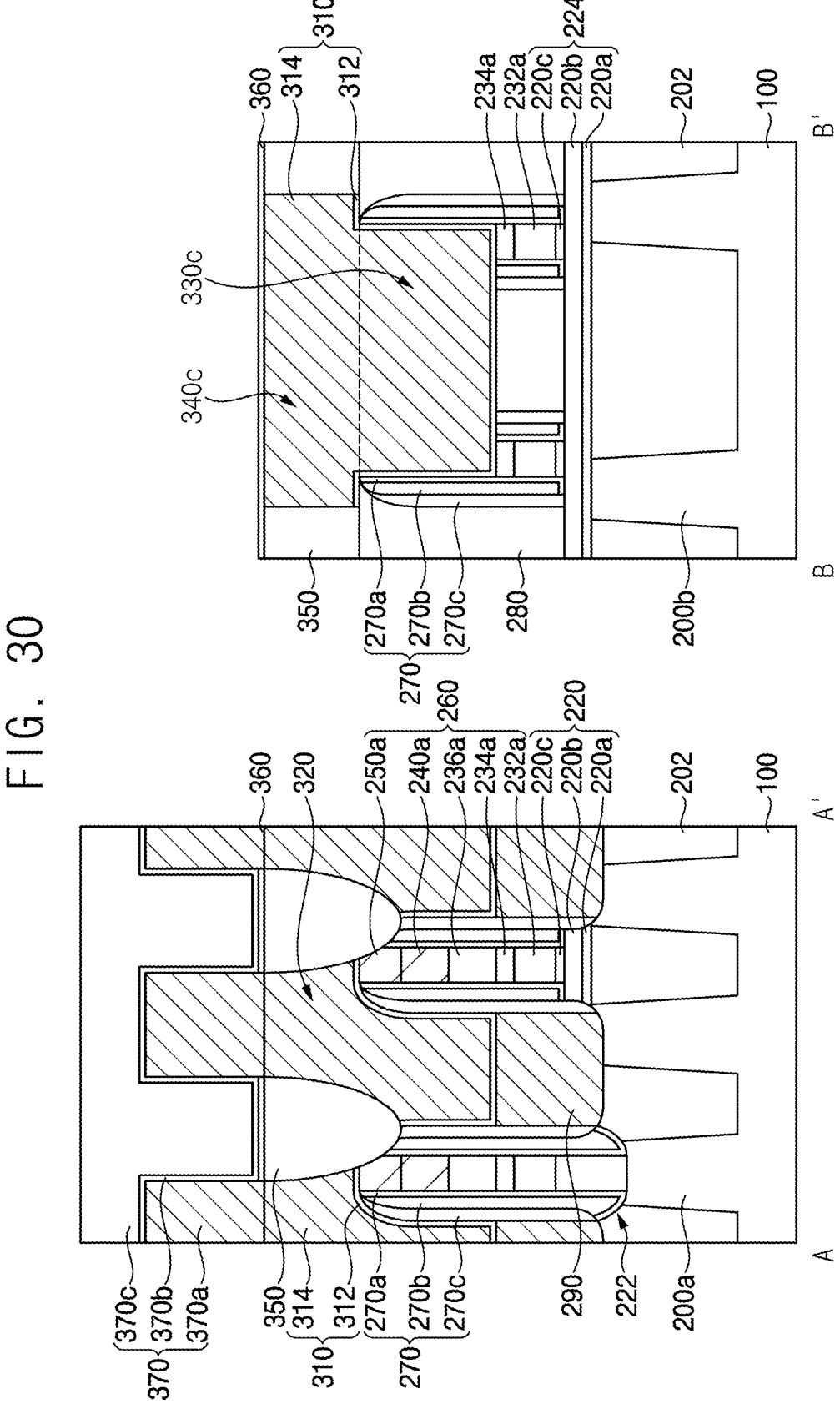
FIG. 30 is a cross-sectional view illustrating a DRAM device according to example embodiments.

FIGS. 28 and 29 are plan views illustrating DRAM devices according to example embodiments. FIG. 30 is a cross-sectional view illustrating a DRAM device according to example embodiments.

FIG. 28 shows a first cell block of the DRAM device, and FIG. 29 shows a second cell block of the DRAM device. To avoid drawing complexity, some components (e.g., capacitors) are omitted in each of plan views. FIG. 30 is a cross-sectional view taken along lines A-A' and B-B' of FIG. 29.

Referring to FIGS. 28 to 30, the substrate 100 may include the memory cell region and a core/peripheral region. The memory cell region may include the first cell block 1BLK and the second cell block 2BLK. The core/peripheral region may be formed between the cell blocks. The first cell block 1BLK may be a cell block having a general bit line structure. The second cell block 2BLK may be a cell block having a folded bit line structure in which a pair of neighboring bit line structures are connected to each other. The second cell block 2BLK may be a last cell block having no neighboring cell blocks adjacent to one side of the second cell block 2BLK.

Each of the first and second cell blocks 1BLK and 2BLK may include a main region M where main cells are formed, first and second boundary regions R1 and R2 corresponding to both edge regions of the first cell block 1BLK, and third and fourth boundary regions R3 and R4 corresponding to both edge regions of the second cell blocks 2BLK. In FIGS. 28 and 29, only a portion of the main region M is shown, but a size of the main region M may actually be greater than a size of each of the boundary regions.

In the first and second cell blocks 1BLK and 2BLK, memory cells of a DRAM device may be disposed in the main region M. A dummy active pattern 200b may be formed on the first to fourth boundary regions R1, R2, R3 and R4, and a bit line structure 260 may extend from the main region M to each of the first to fourth boundary regions R1, R2, R3 and R4.

Memory cells formed on the main region M of the first and second cell blocks 1BLK and 2BLK may be substantially the same as each other. However, a connection structure of the bit line structure 260 extending to the first and second boundary regions R1 and R2 in the first cell block 1BLK and a connection structure of the bit line structure 260 extending to the third and fourth boundary regions R3 and R4 in the second cell block 2BLK may be different from each other.

Isolation trenches may be formed on the first and second cell blocks 1BLK and 2BLK of the substrate, and isolation patterns may be formed in the isolation trenches, respectively. An upper portion of the substrate on which the isolation pattern is not formed may be defined as an active region. The active region formed in the main region M of the first and second cell blocks 1BLK and 2BLK may be an active pattern 200a. The active region formed in the first to fourth boundary regions R1, R2, R3 and R4 of the first and second cell blocks 1BLK and 2BLK may include dummy active patterns 200b.

A first gate structure 210 may be formed on the main region of the first and second cell blocks 1BLK and 2BLK of the substrate 100. The first gate structure 210 may be formed in a trench extending through upper portions of the active pattern 200a and the isolation pattern. The first gate structure 210 may extend in the second direction, and a plurality of first gate structures 210 may be spaced apart from each other in the first direction. The first gate structure 210 may include a first gate insulation layer, a first gate electrode and a first gate mask. The first gate structure 210 may serve as a word line of memory cells. First impurity regions serving as source/drains may be formed on the active pattern 200a adjacent to both sides of the first gate structure 210. The first gate structure 210 and the first impurity regions may serve as a selection transistor of the memory cell.

A first insulation layer structure 220 may be formed on the active pattern 200a, the isolation pattern and the first gate structure 210 in the main region M of the first and second cell blocks 1BLK and 2BLK. The first insulation layer structure 220 may include a plurality of stacked insulation layers. For example, the first insulation layer structure 220 may include first to third insulation layers 220a, 220b, and 220c. The first and third insulation layers 220a and 220c may include silicon oxide, and the second insulation layer 220b may include silicon nitride. A recess 222 may be included in a portion of the substrate where the first insulation layer structure 220 is not formed. An upper surface of one of the first impurity regions may be exposed by a lower surface of the recess 222.

A second insulation layer structure 224 may be formed on the dummy active pattern 200b and the isolation pattern in the first to fourth boundary regions R1, R2, R3 and R4 of the first and second cell blocks 1BLK and 2BLK. The second insulation layer structure 224 may have a stacked structure that is the same as a stacked structure of the first insulation layer structure 220. For example, the second insulation layer structure 224 may include the first to third insulation layers 220a, 220b and 220c.

A bit line structure 260 may be formed on the first and second insulation layer structures 220 and 224 and the recess 222 in the first and second cell blocks. The bit line structure 260 may extend from the main region M to each of the boundary regions R1, R2, R3 and R4 in the first direction. An end of the bit line structure 260 in the first direction may be disposed on each of the boundary regions R1, R2, R3 and R4. A plurality of bit line structures 260 may be spaced apart from each other in the second direction. The bit line structure 260 formed on the main region M may contact one of the first impurity regions.

The bit line structure 260 may include a polysilicon pattern 232a, a first barrier metal pattern 234a, a first metal pattern 236a and first and second capping patterns 240a and 250a. A spacer structure 270 may be formed on a sidewall of the bit line structure 260. The spacer structure 270 may include at least one insulation spacer. For example, the spacer structure 270 may include first to third spacers 270a, 270b and 270c.

The bit line structures 260 formed on the first cell block may have structures that are the same as the structures of the first and second wiring lines 144a and 144b described with reference to FIGS. 1 to 4. Hereinafter, the bit line structures of odd rows in the first cell block are referred to as first bit line structures 260a, and the bit line structures of even rows in the first cell block are referred to as second bit line structures 260b. The first bit line structure 260a may have a structure that is the same as the first wiring line 144a described with reference to FIGS. 1 to 4, and the second bit line structure 260b may have a structure that is the same as the structure of the second wiring line 144b described with reference to FIGS. 1 to 4.

The first bit line structure 260a may include the first line portion 262a and the first head hammer pattern 264a. The first head hammer pattern 264a and the first line portion 262a adjacent to the first head hammer pattern 264a may be disposed in the first boundary region R1.

A first separation pattern 252a may be formed between the first head hammer patterns 264a in the second direction. A bottom surface of the first separation pattern 252a may extend to an upper surface of the second insulation layer 220b.

The second bit line structure 260b may include a second line portion 262b and a second head hammer pattern 264b. The second head hammer pattern 264b and the second line portion 262b adjacent to the second head hammer pattern 264b may be disposed in the second boundary region R2.

A second separation pattern 252b may be formed between the second head hammer patterns 264b in the second direction. A bottom surface of the second separation pattern 252b may extend to an upper surface of the second insulation layer 220b.

The first and second separation patterns 252a and 252b may have structures that are the same as structures of the first and second separation patterns 134a and 134b described with reference to FIGS. 1 to 4, respectively.

The bit line structures 260 formed on the second cell block may have structures that are the same as the structures of the third and fourth wiring lines 144c and 144d described with reference to FIGS. 1 to 4. Hereinafter, the bit line structures of odd rows in the second cell block are referred to as third bit line structures 260c, and the bit line structures of even rows in the second cell block are referred to as fourth bit line structures 260d. The third bit line structure 260c may have a structure that is the same as the structure of the third wiring line 144c described with reference to FIGS. 1 to 4. The fourth bit line structure 260d may have a structure that is the same as the structure of the third wiring line 144c described with reference to FIGS. 1 to 4.

In some example embodiments, the third bit line structure 260c may have a structure that is the same as the structure of the third wiring line 145c described with reference to FIG. 5. The fourth bit line structure 260d may have a structure that is the same as the structure of the fourth wiring line 145d described with reference to FIG. 5.

The third bit line structure 260c may include a third line portion 262c and a third head hammer pattern 264c. The third head hammer pattern 264c and the third line portion 262c adjacent to the third head hammer pattern 264c may be disposed in the third boundary region R3.

A third separation pattern 252c may be formed between the third head hammer patterns 264c in the second direction.

A bottom surface of the third separation pattern 252c may extend to an upper surface of the second insulation layer 220b.

The fourth bit line structure 260d may include a fourth line portion 262d and a fourth head hammer pattern 264d. The fourth head hammer pattern 264d and the fourth line portion 262d adjacent to the fourth head hammer pattern 264d may be disposed in the fourth boundary region R4.

A fourth separation pattern 252d may be formed between the fourth head hammer patterns 264d in the second direction. A bottom surface of the fourth separation pattern 252d may extend to an upper surface of the second insulation layer 220b.

The third and fourth separation patterns 252c and 252d may have structures that are the same as the structures of the third and fourth separation patterns 134c and 134d as described with reference to FIGS. 1 to 4, respectively.

A first insulating interlayer 280 may fill a space between the bit line structures 260 on the first and second cell blocks. A lower contact plug 290 may be formed between the bit line structures 260 in the main region A of the first and second cell blocks. The lower contact plug 290 may pass through the first insulating interlayer 280 and may contact the active pattern 200a. The lower contact plug 290 may contact the active pattern 200a of a region defined by the bit line structures 260 and the first gate structures 210. An upper surface of the lower contact plug 290 may be lower than an upper surface of the bit line structure 260.

A landing pad pattern 320 may be formed on the lower contact plug 290. The landing pad pattern 320 may include a second barrier metal pattern 312a and a second metal pattern 314a. An upper surface of the landing pad pattern 320 may be higher than an upper surface of the bit line structure 260. At least a portion of the first and second capping patterns 240a and 250a of the bit line structure 260 contacting the landing pad pattern 320 may have an etched shape. The portion of the first and second capping patterns 240a and 250a of the bit line structure 260 contacting the landing pad pattern 320 may be recessed. In example embodiments, the landing pad pattern 320 may not be disposed on the first to fourth boundary regions R1, R2, R3 and R4.

A first contact plug 330a may pass through the first insulating interlayer 280 and the first and second capping patterns 116a and 136a of the first head hammer pattern 264a in the first boundary region R1 of the first cell block, such that the first contact plug 330a may contact the first conductive pattern of the first head hammer pattern 264a. A first upper wiring 340a may be formed on the first contact plug 330a and the first insulating interlayer 280. In example embodiments, the first upper wiring 340a may extend to the core/peripheral region adjacent to the first cell block.

A second contact plug 330b may pass through the first insulating interlayer 280 and the first and second capping patterns 240a and 250a of the second head hammer pattern 264b in the second boundary region R2 of the first cell block. The second contact plug 330b may contact the first conductive pattern of the second head hammer pattern 264b. A second upper wiring 340b may be formed on the second contact plug 330b and the first insulating interlayer 280. In example embodiments, the second upper wiring 340b may extend to the core/peripheral region adjacent to the first cell block.

A third contact plug 330c may pass through the first insulating interlayer 280 and the first and second capping patterns 240a and 250a included in a pair of neighboring third and fourth line portions 262c and 262d adjacent to the third head hammer pattern 264c in the third boundary region R3 of the second cell block. The third contact plug 330c may be electrically connected to the pair of neighboring third and fourth line portions 262c and 262d. A bottom surface of the third contact plug 330c may be higher than a bottom surface of the bit line structure 260.

In example embodiments, a capping conductive pattern 340c may be formed on the third contact plug 330c and the first insulating interlayer 280. An entire upper surface of the third head hammer pattern 264c may contact an insulation material.

The fourth contact plug 330d may pass through the first insulating interlayer 280 and the first and second capping patterns 116a and 136a of the fourth head hammer pattern 264d in the fourth boundary region R4 of the second cell block, so that the fourth contact plug 330d may contact the first conductive pattern of the fourth head hammer pattern 264d. A third upper wiring 340d may be formed on the fourth contact plug 330d and the first insulating interlayer 280. In example embodiments, the third upper wiring 340d may extend to the core/peripheral region adjacent to the second cell block.

A second insulation pattern 350 may be formed on the first insulating interlayer 280 and sidewalls of the capping conductive pattern 340c to fill a space between the landing pad pattern 320 and spaces between the first to third upper wirings 340a, 340b and 340d.

An etch stop layer 360 may be formed on the second insulation pattern 350.

A capacitor 370 may pass through the etch stop layer 360, and may contact the landing pad pattern 330. The capacitor may include a lower electrode 370a, a dielectric layer 370b and an upper electrode 370c sequentially stacked.

FIGS. 31 to 46 are plan views and cross-sectional views illustrating a method of manufacturing a DRAM device according to example embodiments.

FIGS. 31, 33, 36 and 40 are plan views illustrating the second cell block. FIGS. 32, 35, 37, 38, 39, 41, 42, 44 and 45 are cross-sectional views taken along lines A-A' and B-B' of the plan view. FIGS. 34 and 43 are cross-sectional views taken along line C-C' of the plan view.

Hereafter, the method may be described using only the plan view in the second cell block. Components that are not shown may be indicated by reference numerals in FIGS. 28 to 30.

Figure 31:
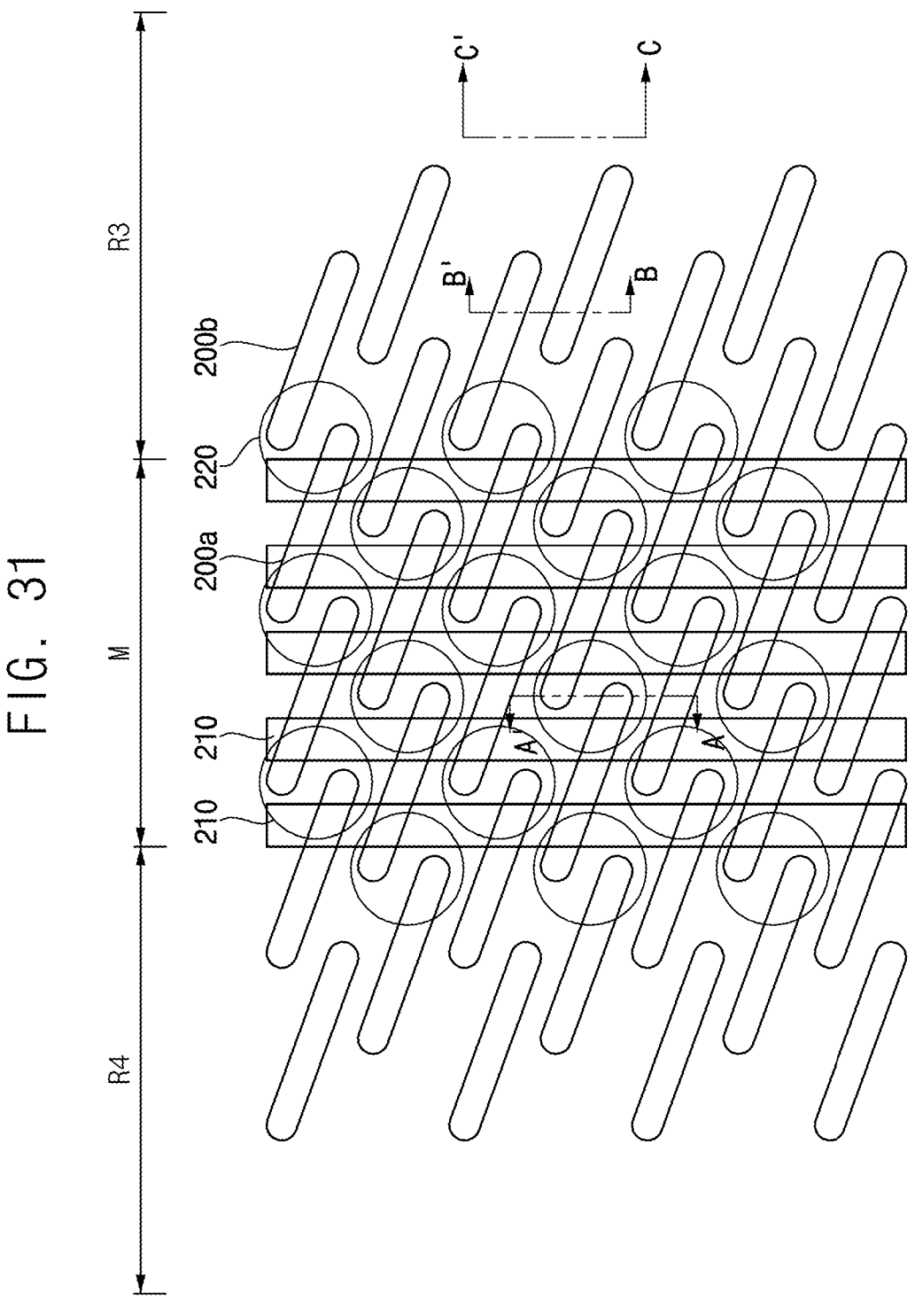
Figure 32:
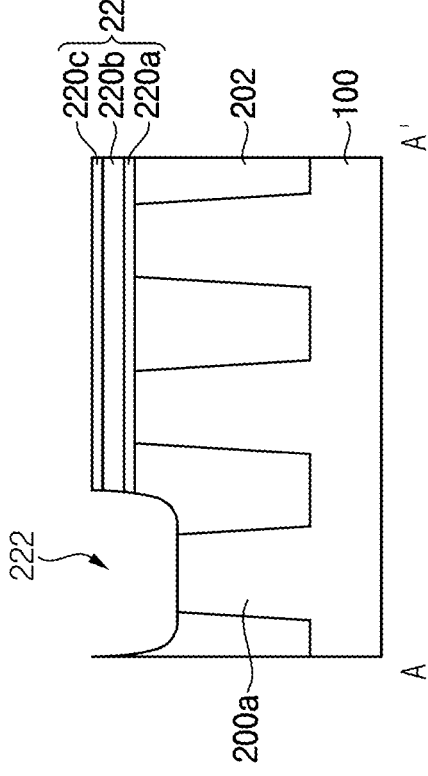

Referring to FIGS. 31 and 32, upper portions of the first and second cell blocks of the substrate may be etched to form isolation trenches. Isolation patterns 202 may be formed in the isolation trenches, respectively. Therefore, an active pattern 200a may be formed in the main region M of the first and second cell blocks. A dummy active pattern 200b may be formed in the first to fourth boundary regions R1, R2, R3, and R4 of the first and second cell blocks.

Select transistors may be formed on the main regions M of the first and second cell blocks.

In example embodiments, a portion of the substrate 100 may be etched to form a gate trench. A first gate structure 210 may be formed in the gate trench. The first gate structure 210 may include, for example, a first gate insulation layer, a first gate electrode and a first gate mask stacked. First impurity regions may be formed by doping impurities into the active patterns 200a adjacent to both sides of the first gate structure 210.

A first insulation layer structure 220 may be formed on the active pattern 200a, the isolation pattern and the first gate structure 210 in the main region M of the first and second cell blocks. A second insulation layer structure 224 may be formed on the dummy active pattern 200b and the isolation pattern in the boundary regions R1, R2, R3, and R4 of the first and second cell blocks.

A recess 222 may be formed on a portion of the substrate 100 between the first insulation layer structures 220. The second insulation layer structure 224 may cover the entire surface of the dummy active pattern 200b and the isolation pattern of the first to fourth boundary regions R1, R2, R3 and R4. The second insulation layer structure 224 and the first insulation layer structure 220 may be formed by a same deposition process. Therefore, the first and second insulation layer structures 220 and 224 may include the same material.

Figure 33:
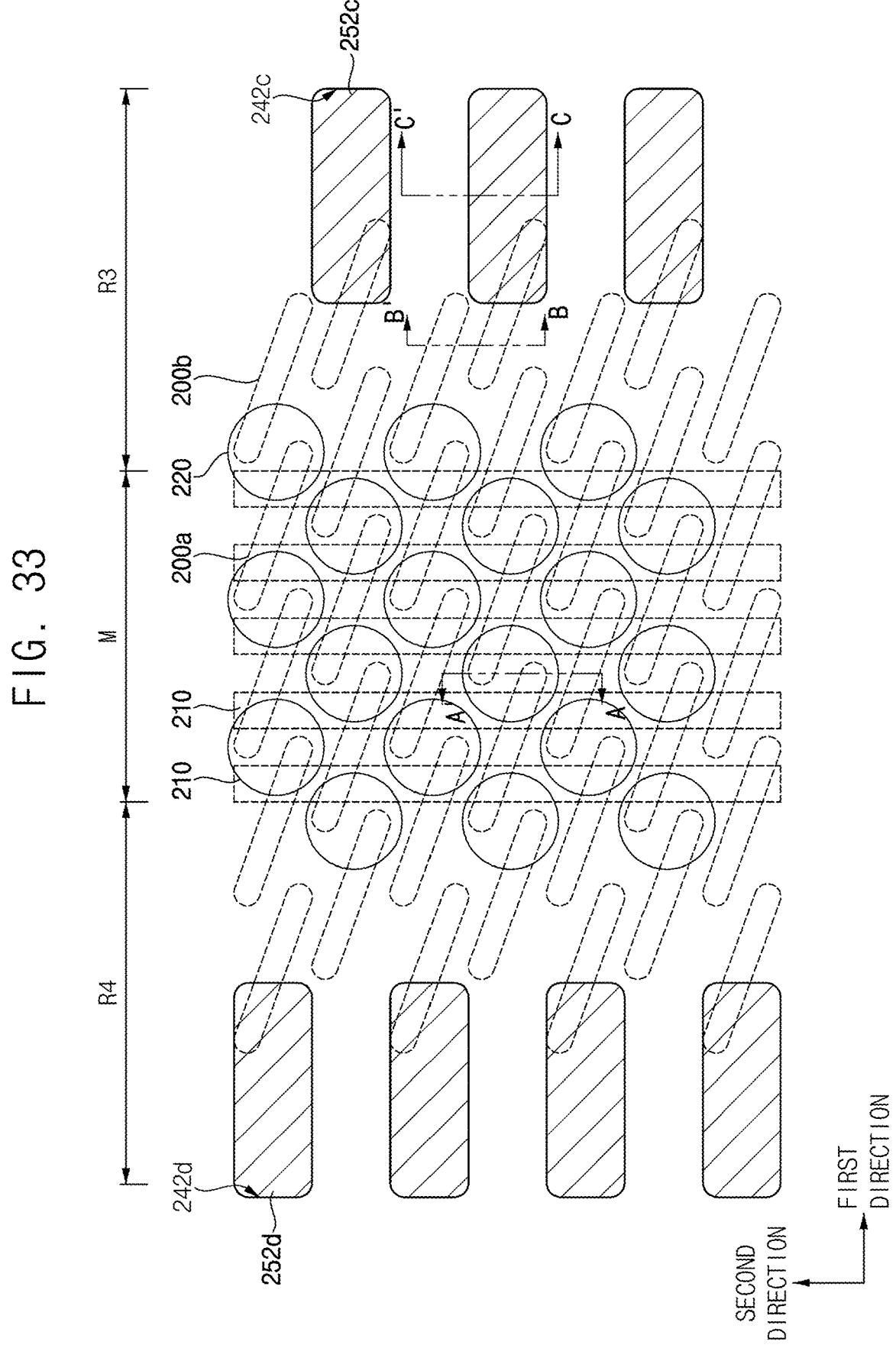
Figure 34:
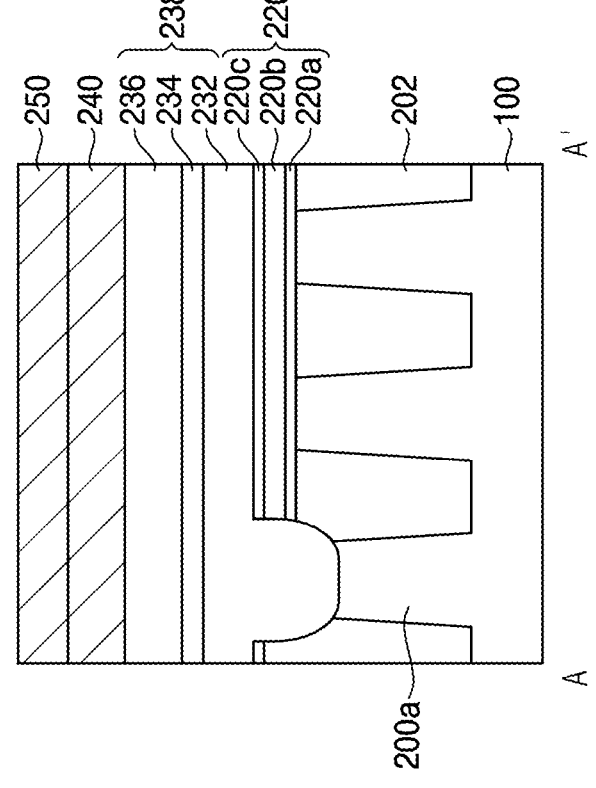
Figure 35:
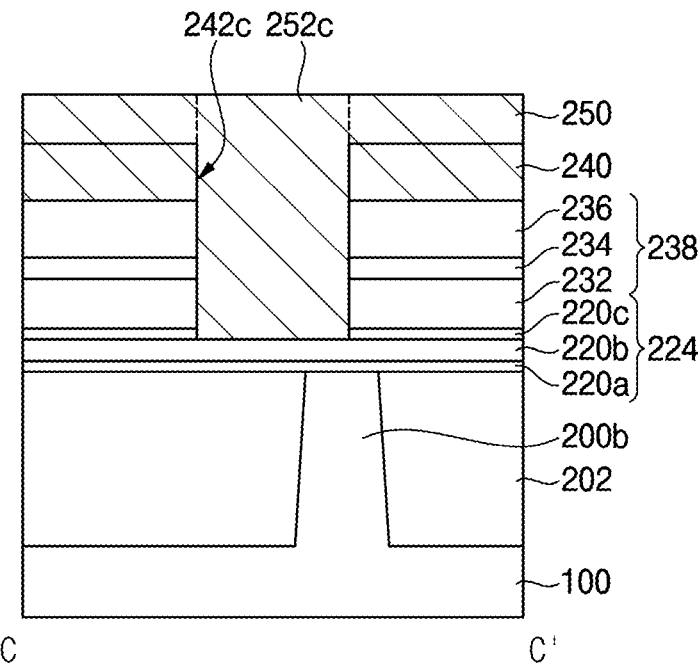

Referring to FIGS. 33 to 35, first conductive layers 238 and a first capping layer 240 may be formed on the first and second insulation layer structures 220 and 224 and on the recess 222. The first conductive layers 238 may be a conductive material included in a bit line structure subsequently formed. In example embodiments, a polysilicon layer 232, a first barrier metal layer 234 and a first metal layer 236 may be sequentially deposited on the first and second insulation layer structures 220 and 224 and the recess 222 to form the first conductive layers 238. The first capping layer 240 may include, e.g., silicon nitride.

A first etching mask may be formed on the first capping layer 240. The first capping layer 240 and the first conductive layer corresponding to the first to fourth separation patterns in the first to fourth boundary regions R1, R2, R3 and R4 may be etched using the first etching mask to form first to fourth openings 242a, 242b, 242c and 242d. Accordingly, the second insulation layer structure 220 may be exposed by bottom surfaces of the first to fourth openings 242a, 242b, 242c and 242d. In example embodiments, the third insulation layer 220c may be removed by the etching process. Thus, the second insulation layer 220b may be exposed by the bottom surfaces of the first to fourth openings 242a, 242b, 242c, and 242d.

The first to fourth openings 242a, 242b, 242c, and 242d may have the same inner width in the second direction. As a result, patterning defects may be decreased in the process of forming the first to fourth openings 242a, 242b, 242c, and 242d.

A separation layer may be formed on the first capping layer 240 to fill the first to fourth openings 242a, 242b, 242c and 242d. The separation layer may include an insulation material, e.g., silicon nitride.

In example embodiments, the separation layer and the first capping layer 240 may include the same material. In this case, the separation layer formed inside and on the first to fourth openings 242a, 242b, 242c, and 242d may be referred to as first to fourth separation patterns 252a, 252b, 252c, and 252d, respectively. The separation layer formed on the first capping layer 240 other than the first to fourth openings 242a, 242b, 242c, and 242d may be referred to as a second capping layer 250. The first and second capping layers 240 and 250 may be merged with each other, so that the first and second capping layers 240 and 250 and may serve as a single capping layer.

In some example embodiments, the separation layer may include silicon oxide. In this case, the separation layer may be planarized until the separation layer remains only inside the first to fourth openings 242a, 242b, 242c, and 242d, thereby forming the first to fourth separation patterns 252a, 252b, 252c, and 252d. Therefore, as a result of planarizing, the second capping layer may not remain.

Figure 36:
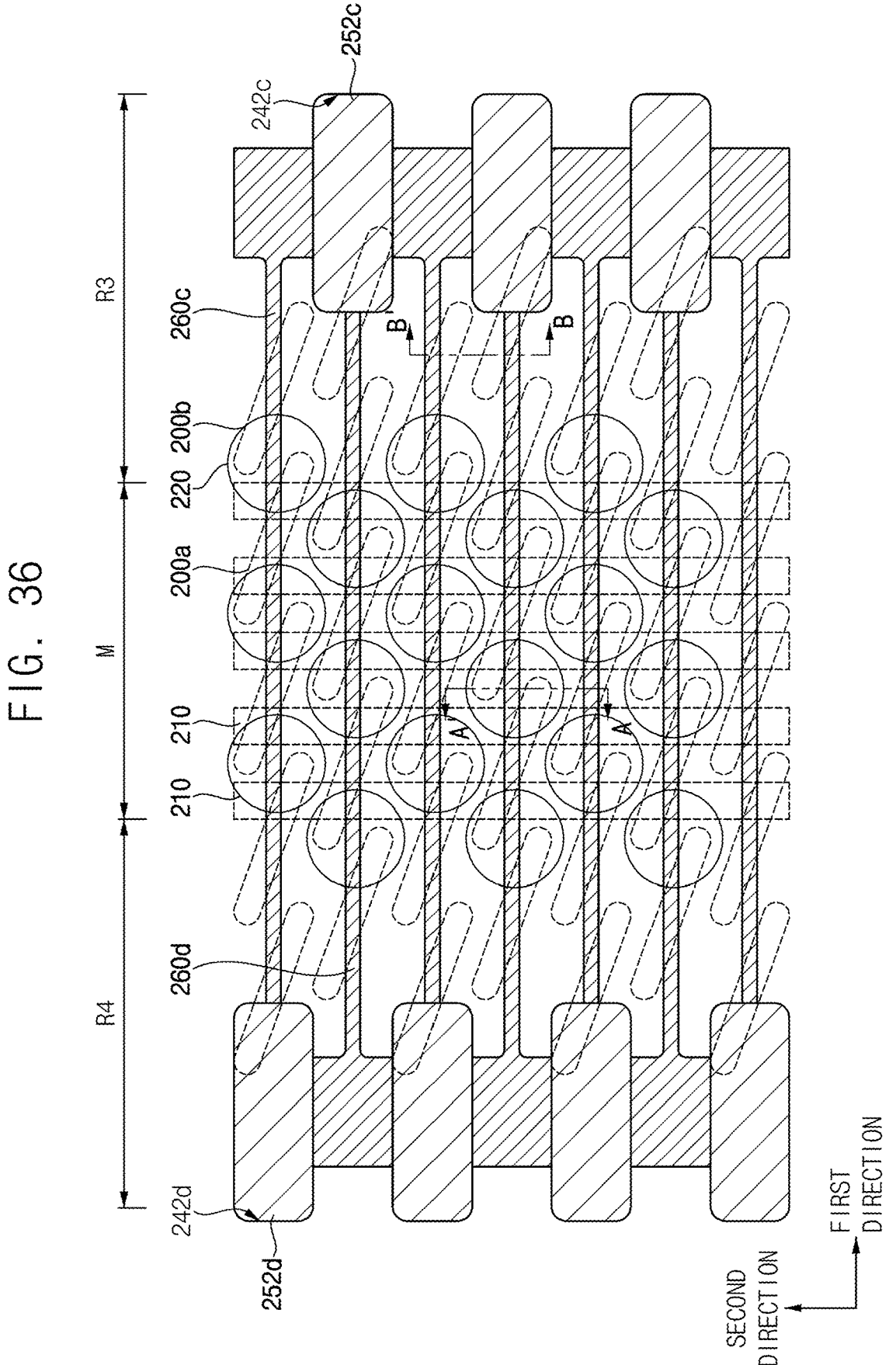
Figure 37:
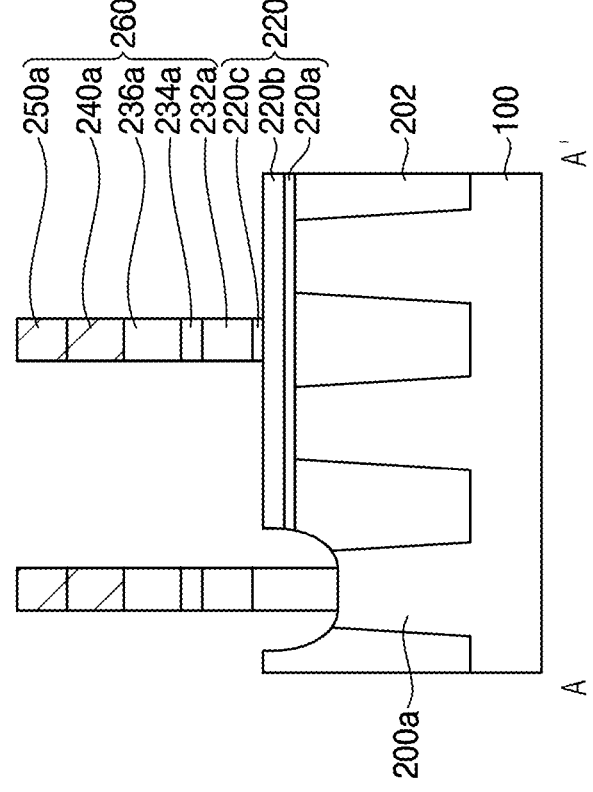

Referring to FIGS. 36 and 37, a second etching mask may be formed on the second capping layer 250 and the first to fourth separation patterns 252a, 252b, 252c and 252d. The second capping layer 250 and the first capping layer 240 may be etched using the second etching mask to form a first capping pattern 240a and a second capping pattern 250a. Subsequently, the first conductive layers 238 may be etched using the first and second capping patterns 240a and 250a as an etching mask. In the etching process, the third insulation layer may also be etched.

In example embodiments, a bit line structure 260 including a polysilicon pattern 232a, a first barrier metal pattern 234a, a first metal pattern 236a, first and second capping patterns 240a and 250a may be formed on the second insulation layer structure 224 as the result of the etching process.

The patterning process for forming the bit line structure 260 may be substantially the same as that described with reference to FIGS. 12 to 16. The bit line structure may have a structure and a shape that is the same as the bit line structures that are described with reference to FIGS. 28 and 29.

The first bit line structure 260a formed on the first cell block may include the first line portion 262a and the first head hammer pattern 264a. The second bit line structure 260b formed on the first cell block may include the second line portion 262b and the second head hammer pattern 264b.

The third bit line structure 260c formed on the second cell block may include the third line portion 262c and the third head hammer pattern 264c. The fourth bit line structure 260d formed on the second cell block may include the fourth line portion 262d and the fourth head hammer pattern 264d.

Figure 38:
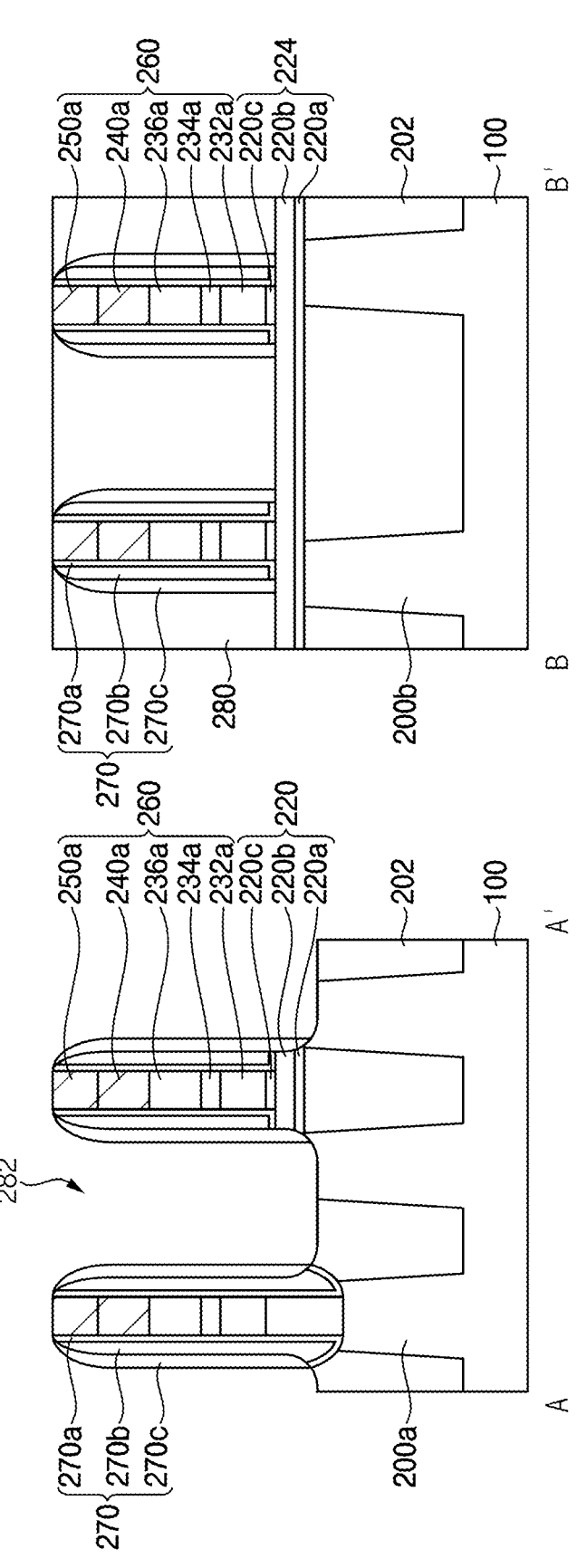

Referring to FIG. 38, a spacer structure 270 may be formed on the sidewall of the bit line structure 260. The spacer structure 270 may include at least one spacer. For example, the spacer structure 270 may include first to third spacers 270a, 270b and 270c.

A first insulating interlayer 280 may be formed to cover the bit line structure 260. The first insulating interlayer 280 may fill a space between the bit line structures 260. After filling the space between the bit line structures 260, the first insulating interlayer 280 may be planarized to expose an upper portion of the bit line structure 260.

A portion of the first insulating interlayer 280 in the main region M of the first and second cell blocks 1BLK and 2BLK may be etched to form a fifth opening. The fifth opening may expose an upper portion of the first gate structure 210 between the bit line structures 260. A fence insulation pattern may be formed to fill the fifth opening. The fence insulation pattern may include silicon nitride.

The first insulating interlayer 280 in the main region M of the first and second cell blocks 1BLK and 2BLK may be removed to form a sixth opening 282 having an isolated shape defined by the bit line structure 260 and the fence insulating pattern. The sixth opening 282 may expose one of the first impurity regions.

Figure 39:
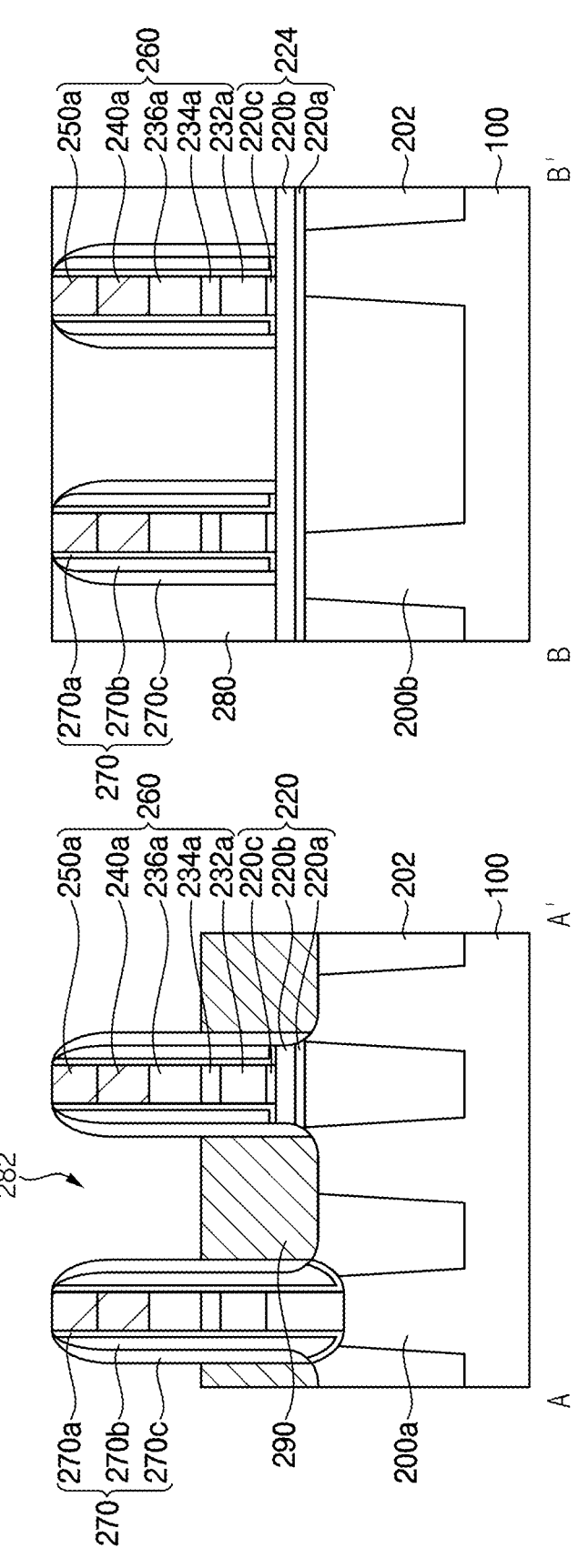

Referring to FIG. 39, a lower conductive layer may be formed on the fence insulating pattern and the first insulating interlayer 280 to fill the sixth opening 282. Thereafter, the lower conductive layer may be partially etched by an etch-back process to form a lower contact plug 290 filling a lower portion of the sixth opening.

Figure 40:
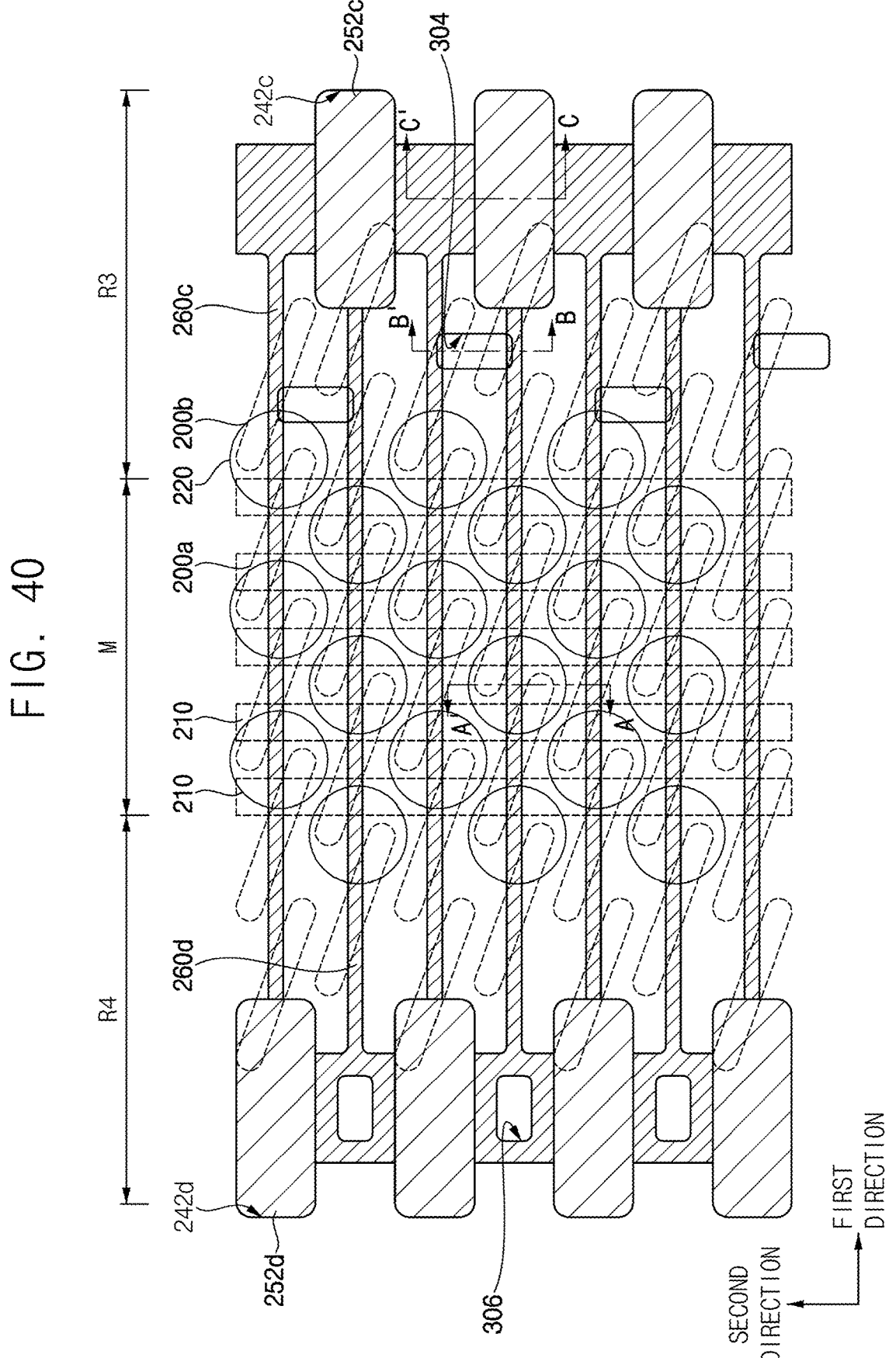
Figure 41:
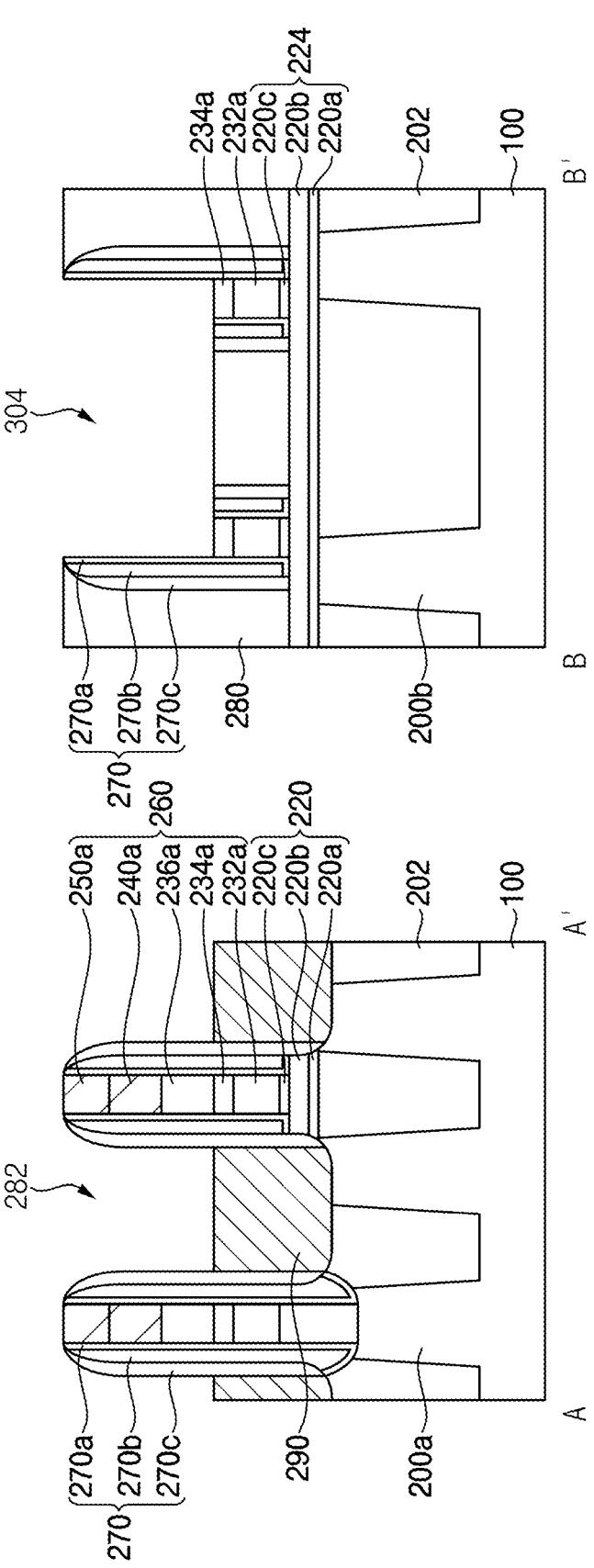

Referring to FIGS. 40 and 41, portions of the first insulating interlayer 280 in the first to fourth boundary regions R1, R2, R3, and R4 of the first and second cell blocks 1BLK and 2BLK may be etched, and then the first and second capping patterns 116a and 136a of the bit line structure 260 may be etched to form first to fourth contact holes 300, 302, 304 and 306.

The first contact hole 300 may expose the first conductive pattern of the first head hammer pattern 264*a* in the first bit line structure 260*a*. The second contact hole 302 may expose the first conductive pattern of the second head hammer pattern 264*b* in the second bit line structure 260*b*. The third contact hole 304 may expose the first conductive metal patterns included in the pair of neighboring third and fourth bit line structures 260*c* and 260*d* and the first insulating interlayer 280 between the pair of neighboring third and fourth bit line structures 260*c* and 260*d*. The fourth contact hole 306 may expose the first conductive pattern of the fourth head hammer pattern 264*d* in the fourth bit line structure 260*d*.

Figure 42:
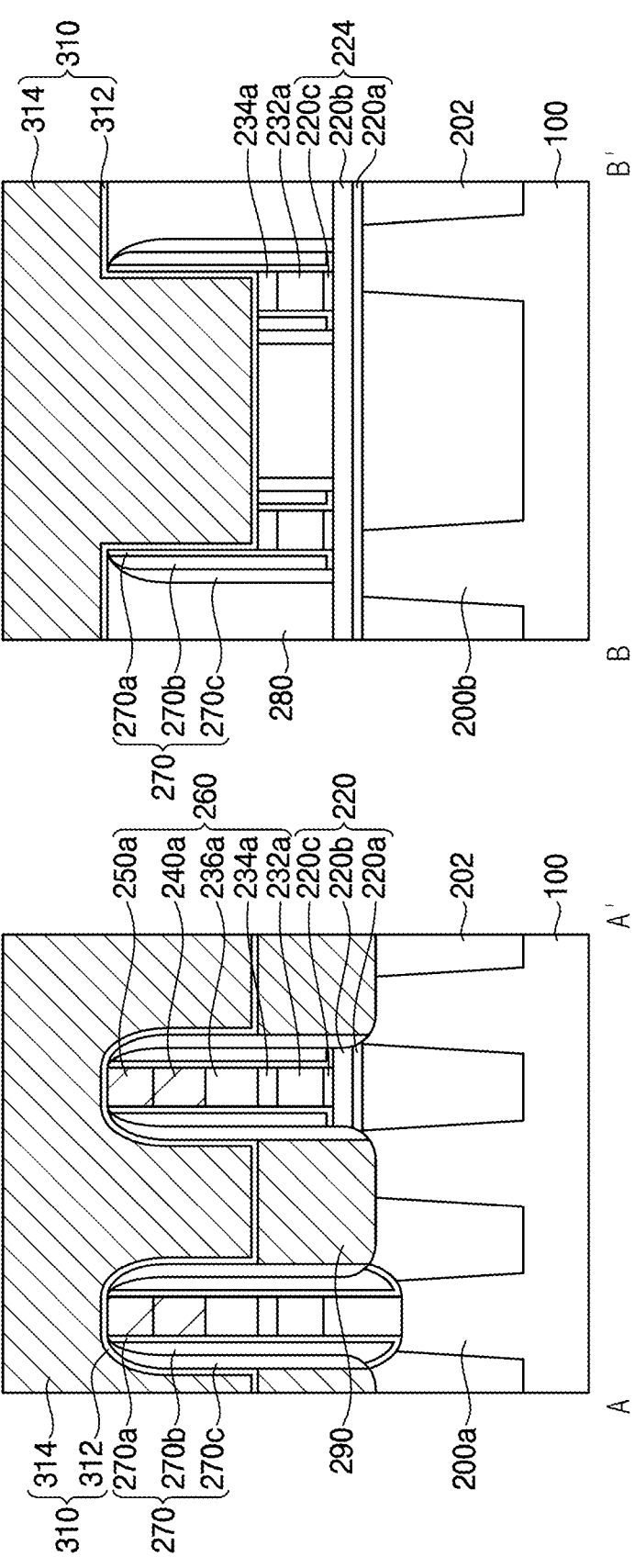
Figure 43:
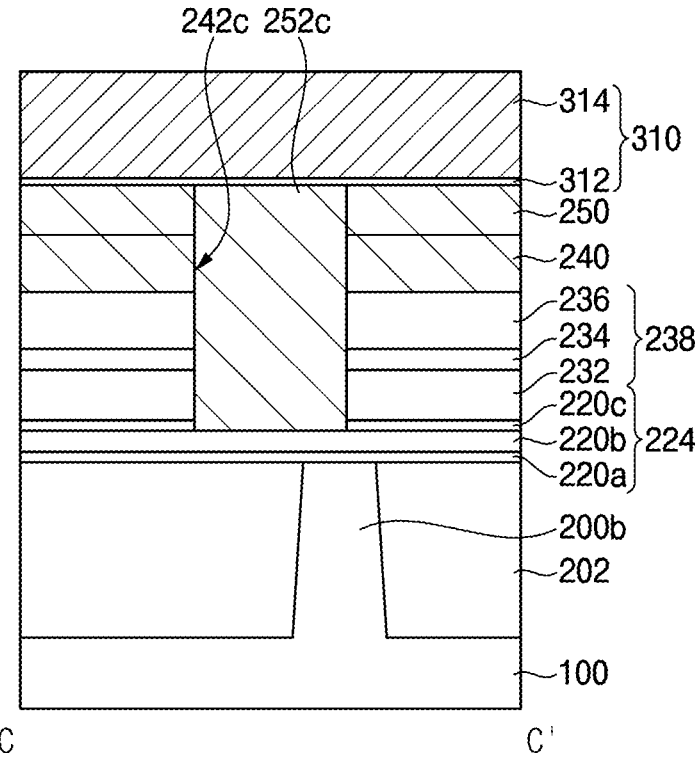
Figure 45:
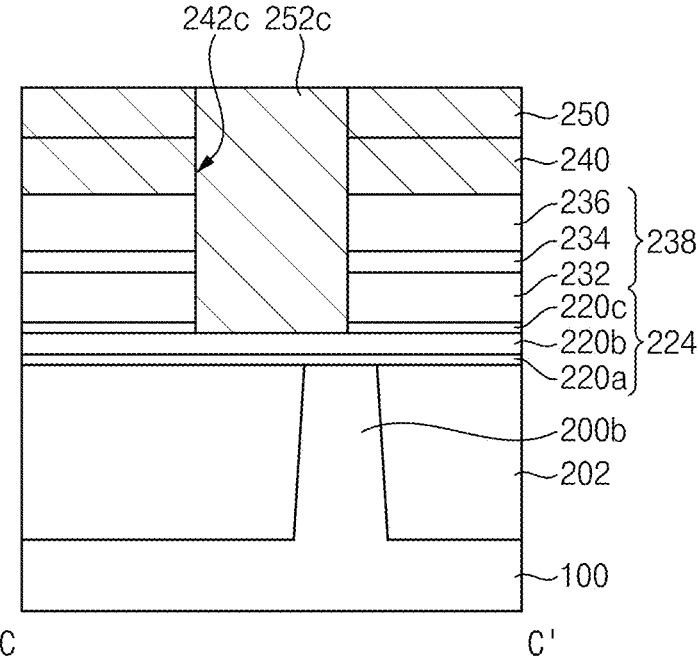

Referring to FIGS. 42 and 43, a second conductive layer 310 may be formed to fill the sixth opening 282 and the first to fourth contact holes 300, 302, 304 and 306. The second conductive layer 310 may be formed to cover the bit line structure 260 and the lower contact plug 290, the first insulating interlayer 280 and the fence insulation pattern.

In example embodiments, the second conductive layer 310 may include a second barrier metal layer 312 and a second metal layer 314.

In example embodiments, a metal silicide pattern may be further formed on the lower contact plug 290, before forming the second conductive layer 310.

Referring to FIGS. 44 and 45 and FIGS. 28 and 29, the second conductive layer 310 may be patterned to form landing pad patterns 320 in the main region M of the first and second cell blocks 1BLK, 2BLK. In addition, the second conductive layer 310 may be patterned to form first to fourth contact plugs 330*a*, 330*b*, 330*c* and 330*d*, the first to third upper wirings 340*a*, 340*b* and 340*d* and the capping conductive pattern 340*c*.

In this case, a contact plug may not be formed on the third head hammer pattern 264*c*.

Figure 46:
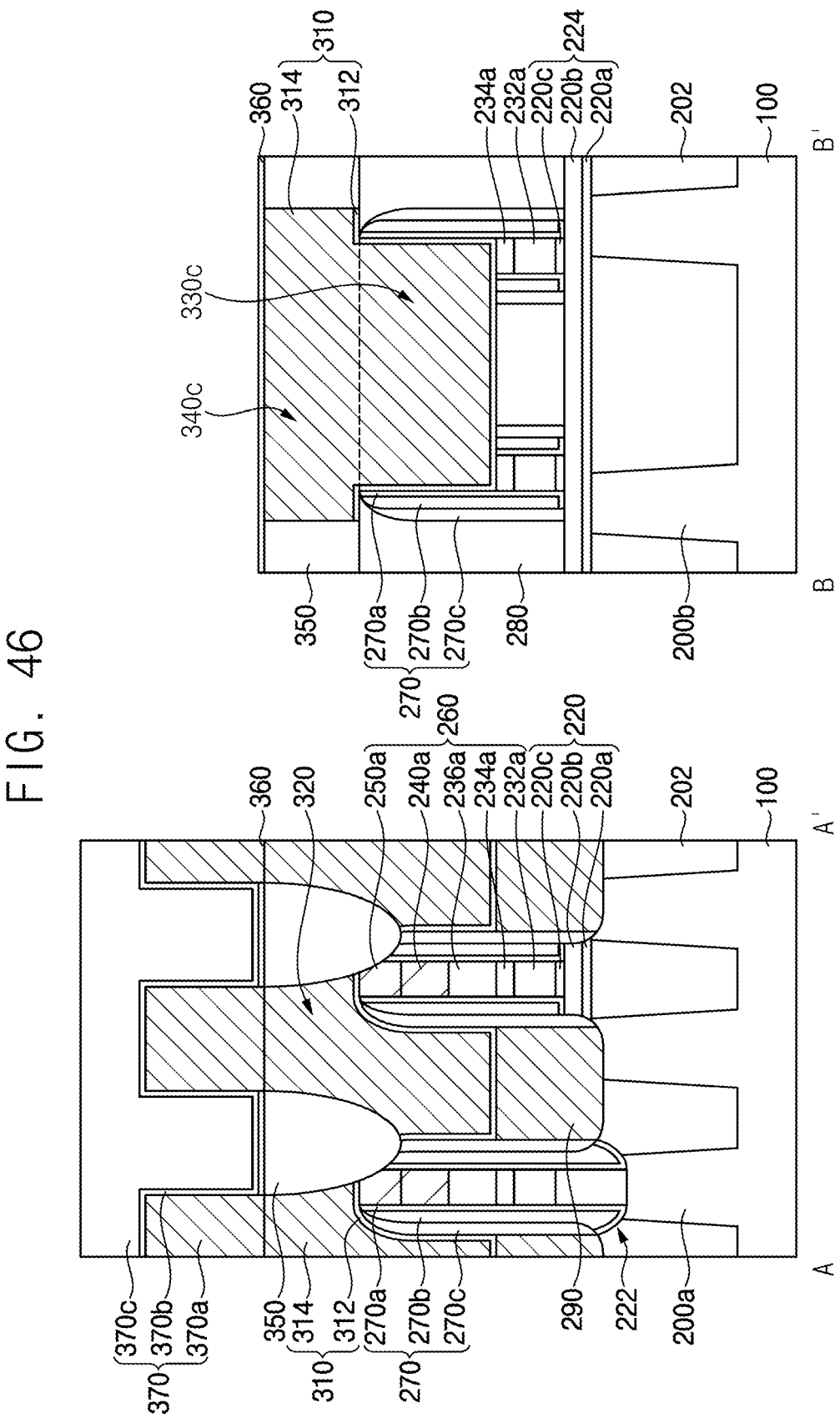

Referring to FIG. 46, a second insulation pattern 350 may be formed to filling a space between the landing pad patterns 320 and spaces between the first to third upper wirings 340*a*, 340*b* and 340*d*. The second insulation pattern 350 may be formed to cover a sidewall of the capping conductive pattern 340*c*.

An etch stop layer 360 may be formed on the landing pad patterns 320, the first to third upper wirings 172*a*, 172*b*, and 172*d*, the capping conductive pattern 172*c*, and the second insulation pattern 350. A capacitor 370 may be formed on the landing pad pattern, and may pass through the etch stop layer 360. The capacitor 370 may include a lower electrode 370*a*, a dielectric layer 370*b*, and an upper electrode 370*c* sequentially stacked.

The DRAM device may be manufactured by the above process. In the DRAM device, defects in the bit line structure and wirings connected to the bit line structure may be decreased.

By way of summation and review, neighboring the first and second wiring lines having a folded wiring structure may not be directly connected at ends thereof. The neighboring the first and second wiring lines may be electrically connected by the contact plug between the first and second wiring lines. Therefore, ends of the first and second wiring lines may be spaced apart from each other in the second direction. The ends of the first and second wiring lines may have a shape the same as a shape of ends of wiring lines formed on another cell block. Accordingly, patterning defects may be decreased in processes for forming the first and second wiring lines.

While concepts have been shown and described with reference to example embodiments thereof, it is to be understood by those of ordinary skill in the art that various changes in form and details may be made thereto without departing from the spirit and scope of the present inventive concepts as set forth by the following claims.

What is claimed is:

1. A semiconductor device, comprising:
   a first wiring line on a substrate, the first wiring line including a first line portion having a line shape extending in a first direction and a first head hammer pattern connected to a first end of the first line portion in the first direction;
   a second wiring line spaced apart from the first wiring line in a second direction perpendicular to the first direction, the second wiring line including a second line portion having a line shape parallel to the first line portion; and
   a first contact plug for electrically connecting the first line portion and the second line portion, the first contact plug being positioned at a region adjacent to the first end of the first line portion and a second end of the second line portion in the first direction,
   wherein the first contact plug has a bottom surface that is higher than a bottom surface of each of the first and second wiring lines, and an entire upper surface of the first head hammer pattern contacts an insulation material.

2. The semiconductor device as claimed in claim 1, wherein the first line portion and the second line portion have the same first width in the second direction, and the first head hammer pattern has a second width in the second direction greater than the first width.

3. The semiconductor device as claimed in claim 1, wherein the second line portion extends in the first direction, and the second end of the second line portion in the first direction is shorter than the first end of the first line portion.

4. The semiconductor device as claimed in claim 1, wherein:
   the first wiring line includes a plurality of the first wiring lines and the second wiring line includes a plurality of the second wiring lines,
   the first wiring line and the second wiring line are alternately and repeatedly arranged in the second direction, and
   the first contact plug is disposed between a pair of neighboring first and second line portions.

5. The semiconductor device as claimed in claim 4, further comprising a separation pattern between the first head hammer patterns in the second direction,
   wherein the separation pattern includes an insulation material.

6. The semiconductor device as claimed in claim 5, wherein the second end of the second line portion contacts the separation pattern.

7. The semiconductor device as claimed in claim 1, further comprising a capping conductive pattern covering an upper surface of the first contact plug.

8. The semiconductor device as claimed in claim 1, further comprising:
   a second head hammer pattern connected to a third end that is the other end of the first end of the first line portion or a fourth end that is another end of the second end of the second line portion; and
   a second contact plug contacting the second head hammer pattern.

9. A semiconductor device, comprising:
   first wiring lines on a first cell block of a substrate, each of the first wiring lines including a first line portion having a line shape extending in a first direction and a first head hammer pattern connected to a first end of the first line portion in the first direction;

second wiring lines on the first cell block of the substrate, each of the second wiring lines being disposed between the first wiring lines, the second wiring lines being spaced apart from the first wiring lines in a second direction perpendicular to the first direction, and each of the second wiring line including a second line portion having a line shape parallel to the first line portion;

a first contact plug contacting the first head hammer pattern;

third wiring lines on a second cell block of the substrate, each of the third wiring lines including a third line portion having a line shape extending in the first direction and a second head hammer pattern connected to a third end of the third line portion in the first direction;

fourth wiring lines on the second cell block of the substrate, each of the fourth wiring lines being disposed between the third wiring lines, the fourth wiring lines spaced apart from the third wiring lines in the second direction, and each of the fourth wiring line including a fourth line portion having a line shape parallel to the third line portion; and a second contact plug electrically connecting a pair of neighboring third and fourth line portions adjacent to the third end of the third line portion and a fourth end of the fourth line portion, wherein an entire upper surface of the second head hammer pattern contacts an insulation material.

10. The semiconductor device as claimed in claim 9, wherein the second contact plug has a bottom surface higher than a bottom surface of each of the third and fourth wiring lines.

11. The semiconductor device as claimed in claim 9, wherein the first to fourth line portions have the same first width in the second direction, and the first and second head hammer patterns have a second width in the second direction greater than the first width.

12. The semiconductor device as claimed in claim 9, wherein the second line portion and the fourth line portion extend in the first direction, wherein:

a second end of the second line portion in the first direction is shorter than the first end of the first line portion, and the fourth end of the fourth line portion is shorter than the third end of the third line portion.

13. The semiconductor device as claimed in claim 9, further comprising:

a first separation pattern including an insulating material disposed between the first head hammer patterns in the second direction, and a second separation pattern including an insulating material disposed between the second head hammer patterns in the second direction.

14. The semiconductor device as claimed in claim 13, wherein the first and second separation patterns have the same third width in the second direction.

15. The semiconductor device as claimed in claim 13, wherein:

a second end of the second line portion in the first direction contacts the first separation pattern, and the fourth end of the fourth line portion contacts the second separation pattern.

16. The semiconductor device as claimed in claim 9, further comprising:

a first upper wiring on the first contact plug; and a capping conductive pattern covering an upper surface of the second contact plug.

17. The semiconductor device as claimed in claim 9, further comprising:

a third head hammer pattern connected to the other end of the third end of the third line portion or another end of the fourth end of the fourth line portion; and a third contact plug contacting the third head hammer pattern.

18. The semiconductor device as claimed in claim 9, further comprising:

a fourth head hammer pattern connected to one end of the second line portion; and a fourth contact plug contacting the fourth head hammer pattern.

19. A semiconductor device, comprising:

first wiring lines on a first cell block of a substrate, each of the first wiring lines including a first line portion having a line shape extending in a first direction and a first head hammer pattern connected to a first end of the first line portion;

second wiring lines on the first cell block of the substrate, each of the second wiring lines being disposed between the first wiring lines, the second wiring lines spaced apart from the first wiring lines in a second direction perpendicular to the first direction, and each of the second wiring lines including a second line portion having a line shape parallel to the first line portion and a second head hammer pattern connected to a second end opposite to the first end of the second line portion;

a first contact plug contacting the first head hammer pattern;

a second contact plug contacting the second head hammer pattern;

third wiring lines on a second cell block of the substrate, each of the third wiring lines including a third line portion having a line shape extending in the first direction and a third head hammer pattern connected to a third end of the third line portion;

fourth wiring lines on the second cell block of the substrate, each of the fourth wiring lines being disposed between the third wiring lines, the fourth wiring lines being spaced apart from the third wiring lines in the second direction, and each of the fourth wiring line including a fourth line portion having a line shape parallel to the third line portion and a fourth head hammer pattern connected to a fourth end opposite to the third end of the fourth line portion;

a third contact plug electrically connecting a pair of neighboring third and fourth line portions adjacent to the third end of the third line portion; and a fourth contact plug contacting the fourth head hammer pattern, wherein an entire upper surface of the third head hammer pattern contacts an insulation material.

20. The semiconductor device as claimed in claim 19, wherein the third contact plug has a bottom surface higher than a bottom surface of each of the third and fourth wiring lines.

* * * * *